US009234985B2

(12) United States Patent
Grubbs et al.

(10) Patent No.: US 9,234,985 B2
(45) Date of Patent: Jan. 12, 2016

(54) BIREFRINGENT POLYMER BRUSH STRUCTURES FORMED BY SURFACE INITIATED RING-OPENING METATHESIS POLYMERIZATION

(71) Applicant: CALIFORNIA INSTITUTE OF TECHNOLOGY, Pasadena, CA (US)

(72) Inventors: Robert H. Grubbs, South Pasadena, CA (US); Raymond Weitekamp, Glendale, CA (US)

(73) Assignee: California Institute of Technology, Pasadena, CA (US)

( * ) Notice: Subject to any disclaimer, the term of this patent is extended or adjusted under 35 U.S.C. 154(b) by 134 days.

(21) Appl. No.: 14/061,070

(22) Filed: Oct. 23, 2013

(65) Prior Publication Data

US 2014/0049823 A1   Feb. 20, 2014

Related U.S. Application Data

(63) Continuation-in-part of application No. 13/955,251, filed on Jul. 31, 2013.

(60) Provisional application No. 61/678,484, filed on Aug. 1, 2012, provisional application No. 61/718,117, filed on Oct. 24, 2012, provisional application No. 61/718,515, filed on Oct. 25, 2012.

(51) Int. Cl.
*G02B 1/04*   (2006.01)
*G02B 5/30*   (2006.01)
(Continued)

(52) U.S. Cl.
CPC .. *G02B 1/04* (2013.01); *G02B 1/08* (2013.01); *G02B 1/10* (2013.01); *G02B 5/3083* (2013.01); *H01L 51/0041* (2013.01); *H01L 51/0579* (2013.01); *Y02E 10/549* (2013.01)

(58) Field of Classification Search
CPC .......... G02B 1/04; G02B 5/3083; G02B 1/08; G02B 1/10; H01L 51/0041; H01L 51/0579; Y02E 10/549; C08F 2/34; C08F 38/02
USPC ........ 359/489.01, 489.06; 526/194, 126, 233, 526/145, 285, 901; 205/420
See application file for complete search history.

(56) References Cited

U.S. PATENT DOCUMENTS

| 4,553,919 A | 11/1985 | Hide |
| 5,312,940 A | 5/1994 | Grubbs et al. |

(Continued)

FOREIGN PATENT DOCUMENTS

| WO | WO 95/01388 | 1/1995 |
| WO | WO 02/14376 | 2/2002 |

(Continued)

OTHER PUBLICATIONS

Lodge et al., "Optical Anisotropy of Tethered Chains", Macromolecules, vol. 25, No. 21, pp. 5643-5650, 1992.*

(Continued)

*Primary Examiner* — Frank Font
(74) *Attorney, Agent, or Firm* — Baker & Hostetler LLP

(57) ABSTRACT

The disclosure describes a polymer brush structure exhibiting birefringence, said polymer brush structure comprising a plurality of substantially parallel oriented polymers and characterized by a longitudinal z-direction having a first refractive index, $n_z$, and a lateral x,y-direction having a second refractive index, $n_{x,y}$, wherein the difference, $\Delta n$, between the first refractive index and the second refractive index is in a range of about 0.1 to about 0.6, as measured by ellipsometry and fit to a Cauchy analytical model.

27 Claims, 6 Drawing Sheets

(51) Int. Cl.
- *H01L 51/00* (2006.01)
- *G02B 1/08* (2006.01)
- *G02B 1/10* (2015.01)
- *H01L 51/05* (2006.01)

(56) References Cited

U.S. PATENT DOCUMENTS

| | | |
|---|---|---|
| 5,342,909 A | 8/1994 | Grubbs et al. |
| 5,750,815 A | 5/1998 | Grubbs et al. |
| 5,831,108 A | 11/1998 | Grubbs et al. |
| 5,917,071 A | 6/1999 | Grubbs et al. |
| 5,969,170 A | 10/1999 | Grubbs et al. |
| 5,977,393 A | 11/1999 | Grubbs et al. |
| 6,048,993 A | 4/2000 | Grubbs et al. |
| 6,111,121 A | 8/2000 | Grubbs et al. |
| 6,153,778 A | 11/2000 | Grubbs et al. |
| 6,211,391 B1 | 4/2001 | Grubbs et al. |
| 6,284,852 B1 | 9/2001 | Grubbs et al. |
| 6,291,616 B1 | 9/2001 | Kiessling et al. |
| 6,313,332 B1 | 11/2001 | Grubbs et al. |
| 6,426,419 B1 | 7/2002 | Grubbs et al. |
| 6,486,279 B2 | 11/2002 | Lynn et al. |
| 6,504,041 B2 | 1/2003 | Grubbs et al. |
| 6,514,666 B1 | 2/2003 | Choi et al. |
| 6,515,084 B2 | 2/2003 | Grubbs et al. |
| 6,552,139 B1 | 4/2003 | Herrmann et al. |
| 6,555,630 B1 | 4/2003 | Chen et al. |
| 6,613,910 B2 | 9/2003 | Grubbs et al. |
| 6,620,955 B1 | 9/2003 | Pederson et al. |
| 6,624,265 B2 | 9/2003 | Grubbs et al. |
| 6,635,768 B1 | 10/2003 | Herrmann et al. |
| 6,759,537 B2 | 7/2004 | Grubbs et al. |
| 6,787,620 B2 | 9/2004 | Herrmann et al. |
| 6,806,325 B2 | 10/2004 | Grubbs et al. |
| 6,818,586 B2 | 11/2004 | Grubbs et al. |
| 6,921,735 B2 | 7/2005 | Hoveyda et al. |
| 7,026,495 B1 | 4/2006 | Pederson et al. |
| 7,102,047 B2 | 9/2006 | Grubbs et al. |
| 7,288,666 B2 | 10/2007 | Grubbs et al. |
| 7,294,717 B2 | 11/2007 | Herrmann et al. |
| 7,329,758 B1 | 2/2008 | Grubbs et al. |
| 7,378,528 B2 | 5/2008 | Herrmann et al. |
| 7,652,145 B2 | 1/2010 | Herrmann et al. |
| 7,750,172 B2 | 7/2010 | Grubbs et al. |
| 8,067,488 B2 * | 11/2011 | Buchanan et al. ............. 524/35 |
| 9,096,691 B2 * | 8/2015 | Buchanan ................. C08B 3/16 1/1 |
| 2001/0039360 A1 | 11/2001 | Grubbs et al. |
| 2002/0013473 A1 | 1/2002 | Grubbs et al. |
| 2002/0022733 A1 | 2/2002 | Grubbs et al. |
| 2002/0055598 A1 | 5/2002 | Lynn et al. |
| 2002/0177710 A1 | 11/2002 | Grubbs et al. |
| 2003/0055262 A1 | 3/2003 | Grubbs et al. |
| 2003/0069374 A1 | 4/2003 | Grubbs et al. |
| 2003/0100783 A1 | 5/2003 | Grubbs et al. |
| 2003/0181609 A1 | 9/2003 | Grubbs et al. |
| 2005/0113590 A1 | 5/2005 | Grubbs et al. |
| 2006/0241317 A1 | 10/2006 | Grubbs et al. |
| 2007/0260028 A1 * | 11/2007 | Okoshi et al. ................. 526/285 |
| 2009/0012248 A1 | 1/2009 | Grubbs et al. |
| 2009/0012254 A1 | 1/2009 | Grubbs et al. |
| 2011/0124868 A1 | 5/2011 | Grubbs et al. |
| 2012/0077945 A1 | 3/2012 | Holtcamp et al. |

FOREIGN PATENT DOCUMENTS

| | | |
|---|---|---|
| WO | WO 02/079208 | 10/2002 |
| WO | WO 03/011455 | 2/2003 |
| WO | WO 2009/080797 | 7/2009 |
| WO | WO 2012/097379 | 7/2012 |

OTHER PUBLICATIONS

Diver et al., "Enyne Metathesis (Enyne Bond Reorganization)", Chemical Reviews, 2004, 104, 1317-1382.

Hanson et al., "Bonding Self-Assembled, Compact Organophosphonate Monolayers to the Native Oxide Surface of Silicon", Journal of the American Chemical Society, May 2003, 125, 16074-16080.

Horie et al., "Poly(thienylenevinylene) prepared by ring-opening metathesis polymerization: Performance as a donor in bulk heterojunction organic photovoltaic devices", Polymer, Jan. 2010, 51, 1541-1547.

Lerum et al., "Surface-Initiated Ring-Opening Metathesis Polymerization in the Vapor Phase: An Efficient Method for Grafting Cyclic Olefins with Low Strain Energies", Langmuir, 2011, 27, 5403-5409.

Lodge et al., "Optical Anisotropy of Tethered Chains", Macromolecules, 1992, 25, 5643-5650.

McDermott, "Improved Organic Thin-Film Transistors Utilizing Phosphonate Monolayer-Treated Gate Dielectrics", A Dissertation Presented to the Faculty of Princeton University, Jun. 2007, 154 pages.

Sanford et al., "New Insights into the Mechanism of Ruthenium-Catalyzed Olefin Metathesis Reactions", Journal of the American Chemical Society, 2001, 123, 749-750.

Scholl et al., "Synthesis and Activity of a New Generation of Ruthenium-Based Olefin Metathesis Catalysts Coordinated with 1,3-Dimesityl-4,5-dihydroimidazol-2-ylidene Ligands", Organic Letters, 1999, 6, 953-956.

Schuehler et al., "Polymerization of Acetylene with a Ruthenium Olefin Metathesis Catalyst", Macromolecules, Aug. 24, 2004, 37, 17, 6255-6257.

Schwab et al., "Synthesis and Applications of $RuCl_2(=CHR')(PR3)2$: The Influence of the Alkylidene Moiety on Metathesis Activity", Journal of the American Chemical Society, 1996, 118, 100-110.

Charvet, et al., "Block-Copolymer-Nanowires with Nanosized Domain Segregation and High Charge Mobilities as Stacked p/n Heterojunction Arrays for Repeatable Photocurrent Switching" J. Am. Chem. Soc., Mar. 30, 2009, 131, 18030-18031.

Gu, et al., "Using Soft Lithography to Pattern Highly Oriented Polyacetylene (HOPA) Films via Solventless Polymerization", Advanced Materials, Aug. 4, 2004, 16(15), 1356-1359.

Jozefiak, et al., "Soluble Polyacetylenes Derived From the Ring-Opening Metathesis Polymerization (ROMP) of Substituted Cyclooctatetraenes: Electrochemical Charecterization and Schottky Barrier Devices", Proc. SPI E , Photochemistry and Photoelectrochemistry of Organic and Inorganic Molecular Thin Films, Mar. 1, 1991, vol. 1436, 8-19.

Schlund, et al., "Direct Polymerization of Acetylene to Give Living Polyenes", J. Am. Chem. Soc., May 25, 1989 vol. 111(20)20, 8004-8006.

* cited by examiner ature, and reference to a particular numerical value includes at least that particular value, unless the context clearly indicates otherwise. Thus, for example, a reference to "a material" is a reference to at least one of such materials and equivalents thereof known to those skilled in the art, and so forth.

BIREFRINGENT POLYMER BRUSH STRUCTURES FORMED BY SURFACE INITIATED RING-OPENING METATHESIS POLYMERIZATION

CROSS REFERENCE TO RELATED APPLICATIONS

This Application is a continuation-in-part of U.S. application Ser. No. 13/955,251 filed Jul. 31, 2013, which claims the benefit of U.S. Application Ser. No. 61/678,484, filed Aug. 1, 2012. This Application also claims priority to U.S. Application Ser. Nos. 61/718,117, filed Oct. 24, 2012, and 61/718,515, filed Oct. 25, 2012. The contents of these applications are incorporated by reference herein in their entirety.

TECHNICAL FIELD

The present invention relates to birefringent polymer brush structured arrays, and methods of making the same.

BACKGROUND

Birefringence is the optical property of a material having a refractive index that depends on the polarization and propagation direction of light. Certain crystalline materials may have different indices of refraction associated with different crystallographic directions. The birefringence is often quantified as the maximum difference between refractive indices exhibited by the material.

Birefringent materials are used widely in optics to produce polarizing prisms and retarder plates. Such materials are also used in liquid crystal displays, light modulators, spectral filters, and medical diagnostics (e.g., cross-polarizing filters for microscopes).

The present direction is directed to new materials for use in these applications, and methods of making the same.

SUMMARY

The present inventions are directed to polymer brush structures that exhibit birefringence, each polymer brush structure comprising a plurality of substantially parallel oriented polymers and characterized by a longitudinal z-direction having a first refractive index, $n_z$, and a lateral x,y-direction having a second refractive index, $n_{x,y}$, wherein the difference, $\Delta n$, between the first refractive index and the second refractive index is in a range of about 0.1 to about 0.6, as measured by ellipsometry and fit to a Cauchy analytical model.

In certain embodiments, these structures may be prepared by metathesizing unsaturated organic compounds, operable at near ambient conditions, using a range of metathesis catalysts, including various versions of the Grubbs' catalysts, and attached to substrates by means of self-assembled monolayers.

The structures may be compositions in which the polymer is attached, or tethered, to a surface or free-standing polymer-containing compositions (for example, subsequently detached from an initially tethered structure). This disclosure further described devices incorporating such birefringent polymer brush structures including, for example, polymer electronic devices (e.g. diodes, capacitors, chemical sensors, light emitting diodes (LEDs), photodetectors, photovoltaic cells, thermoelectric detectors, or transistors), medical implants, composite materials, antireflection coatings, antifouling coatings, microfluidics, and reactor modification for chemical synthesis.

BRIEF DESCRIPTION OF THE DRAWINGS

The present application is further understood when read in conjunction with the appended drawings. For the purpose of illustrating the subject matter, there are shown in the drawings exemplary embodiments of the subject matter; however, the presently disclosed subject matter is not limited to the specific methods, devices, and systems disclosed. In addition, the drawings are not necessarily drawn to scale. In the drawings.

DETAILED DESCRIPTION OF ILLUSTRATIVE EMBODIMENTS

Figure 1A:
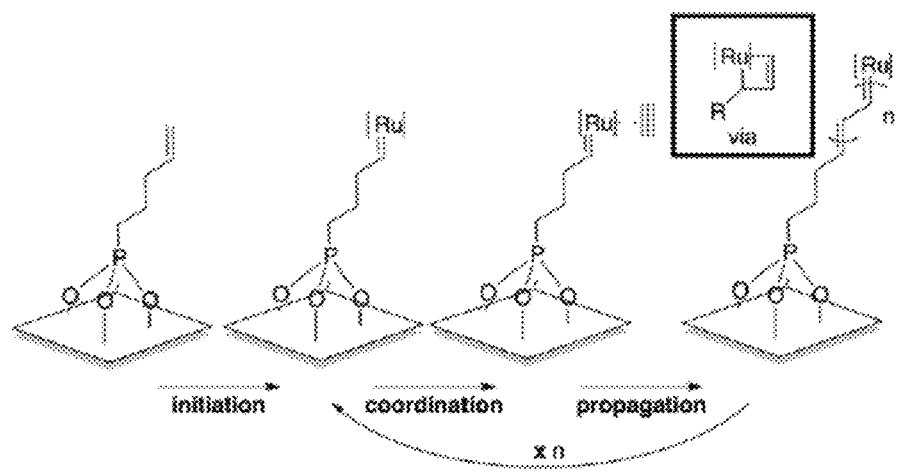
FIG. 1A and FIG. 1B provides an illustration of a possible mechanism of the metathesis reactions described herein.

The present invention may be understood more readily by reference to the following description taken in connection with the accompanying Figures and Examples, all of which form a part of this disclosure. It is to be understood that this invention is not limited to the specific products, methods, conditions or parameters described or shown herein, and that the terminology used herein is for the purpose of describing particular embodiments by way of example only and is not intended to be limiting of any claimed invention. Similarly, unless specifically otherwise stated, any description as to a possible mechanism or mode of action or reason for improvement is meant to be illustrative only, and the invention herein is not to be constrained by the correctness or incorrectness of any such suggested mechanism or mode of action or reason for improvement. Throughout this text, it is recognized that the descriptions refer to compositions and methods of making and using said compositions. That is, where the disclosure describes or claims a feature or embodiment associated with a composition or a method of making or using a composition, it is appreciated that such a description or claim is intended to extend these features or embodiment to embodiments in each of these contexts (i.e., compositions, methods of making, and methods of using).

In the present disclosure the singular forms "a," "an," and "the" include the plural reference, and reference to a particular numerical value includes at least that particular value, unless the context clearly indicates otherwise. Thus, for example, a reference to "a material" is a reference to at least one of such materials and equivalents thereof known to those skilled in the art, and so forth.

When a value is expressed as an approximation by use of the descriptor "about," it will be understood that the particular value forms another embodiment. In general, use of the term "about" indicates approximations that can vary depending on the desired properties sought to be obtained by the disclosed subject matter and is to be interpreted in the specific context in which it is used, based on its function. The person skilled in the art will be able to interpret this as a matter of routine. In some cases, the number of significant figures used for a particular value may be one non-limiting method of determining the extent of the word "about." In other cases, the gradations used in a series of values may be used to determine the intended range available to the term "about" for each value. Where present, all ranges are inclusive and combinable. That is, references to values stated in ranges include every value within that range.

It is to be appreciated that certain features of the invention which are, for clarity, described herein in the context of separate embodiments, may also be provided in combination in a single embodiment. That is, unless obviously incompatible or specifically excluded, each individual embodiment is deemed to be combinable with any other embodiment(s) and such a combination is considered to be another embodiment. Conversely, various features of the invention that are, for brevity, described in the context of a single embodiment, may also be provided separately or in any sub-combination. Finally, while an embodiment may be described as part of a series of steps or part of a more general structure, each said step may also be considered an independent embodiment in itself, combinable with others.

The transitional terms "comprising," "consisting essentially of," and "consisting" are intended to connote their generally in accepted meanings in the patent vernacular; that is, (i) "comprising," which is synonymous with "including," "containing," or "characterized by," is inclusive or open-ended and does not exclude additional, unrecited elements or method steps; (ii) "consisting of" excludes any element, step, or ingredient not specified in the claim; and (iii) "consisting essentially of" limits the scope of a claim to the specified materials or steps "and those that do not materially affect the basic and novel characteristic(s)" of the claimed invention. Embodiments described in terms of the phrase "comprising" (or its equivalents), also provide, as embodiments, those which are independently described in terms of "consisting of" and "consisting essentially" of. For those embodiments provided in terms of "consisting essentially of," the basic and novel characteristic(s) is the ability to provide polymer brush structures or the polymer brushes or derived devices that provide or rely on the birefringence as indicted herein.

When a list is presented, unless stated otherwise, it is to be understood that each individual element of that list, and every combination of that list, is a separate embodiment. For example, a list of embodiments presented as "A, B, or C" is to be interpreted as including the embodiments, "A," "B," "C," "A or B," "A or C," "B or C," or "A, B, or C."

Throughout this specification, words are to be afforded their normal meaning, as would be understood by those skilled in the relevant art. However, so as to avoid misunderstanding, the meanings of certain terms will be specifically defined or clarified.

The term "alkyl" as used herein refers to a linear, branched, or cyclic saturated hydrocarbon group typically although not necessarily containing 1 to about 24 carbon atoms, preferably 1 to about 12 carbon atoms, such as methyl, ethyl, n-propyl, isopropyl, n-butyl, isobutyl, t-butyl, octyl, decyl, and the like, as well as cycloalkyl groups such as cyclopentyl, cyclohexyl, and the like. Generally, although again not necessarily, alkyl groups herein contain 1 to about 12 carbon atoms. The term "lower alkyl" refers to an alkyl group of 1 to 6 carbon atoms, and the specific term "cycloalkyl" refers to a cyclic alkyl group, typically having 4 to 8, preferably 5 to 7, carbon atoms. The term "substituted alkyl" refers to alkyl substituted with one or more substituent groups, and the terms "heteroatom-containing alkyl" and "heteroalkyl" refer to alkyl in which at least one carbon atom is replaced with a heteroatom. If not otherwise indicated, the terms "alkyl" and "lower alkyl" include linear, branched, cyclic, unsubstituted, substituted, and/or heteroatom-containing alkyl and lower alkyl, respectively.

The term "alkylene" as used herein refers to a difunctional linear, branched, or cyclic alkyl group, where "alkyl" is as defined above.

The term "alkenyl" as used herein refers to a linear, branched, or cyclic hydrocarbon group of 2 to about 24 carbon atoms containing at least one double bond, such as ethenyl, n-propenyl, isopropenyl, n-butenyl, isobutenyl, octenyl, decenyl, tetradecenyl, hexadecenyl, eicosenyl, tetracosenyl, and the like. Preferred alkenyl groups herein contain 2 to about 12 carbon atoms. The term "lower alkenyl" refers to an alkenyl group of 2 to 6 carbon atoms, and the specific term "cycloalkenyl" refers to a cyclic alkenyl group, preferably having 5 to 8 carbon atoms. The term "substituted alkenyl" refers to alkenyl substituted with one or more substituent groups, and the terms "heteroatom-containing alkenyl" and "heteroalkenyl" refer to alkenyl in which at least one carbon atom is replaced with a heteroatom. If not otherwise indicated, the terms "alkenyl" and "lower alkenyl" include linear, branched, cyclic, unsubstituted, substituted, and/or heteroatom-containing alkenyl and lower alkenyl, respectively.

The term "alkenylene" as used herein refers to a difunctional linear, branched, or cyclic alkenyl group, where "alkenyl" is as defined above.

The term "alkynyl" as used herein refers to a linear or branched hydrocarbon group of 2 to about 24 carbon atoms containing at least one triple bond, such as ethynyl, n-propynyl, and the like. Preferred alkynyl groups herein contain 2 to about 12 carbon atoms. The term "lower alkynyl" refers to an alkynyl group of 2 to 6 carbon atoms. The term "substituted alkynyl" refers to alkynyl substituted with one or more substituent groups, and the terms "heteroatom-containing alkynyl" and "heteroalkynyl" refer to alkynyl in which at least one carbon atom is replaced with a heteroatom. If not otherwise indicated, the terms "alkynyl" and "lower alkynyl" include linear, branched, unsubstituted, substituted, and/or heteroatom-containing alkynyl and lower alkynyl, respectively.

The term "alkoxy" as used herein refers to an alkyl group bound through a single, terminal ether linkage; that is, an "alkoxy" group may be represented as —O-alkyl where alkyl is as defined above. A "lower alkoxy" group refers to an alkoxy group containing 1 to 6 carbon atoms. Analogously, "alkenyloxy" and "lower alkenyloxy" respectively refer to an alkenyl and lower alkenyl group bound through a single, terminal ether linkage, and "alkynyloxy" and "lower alkynyloxy" respectively refer to an alkynyl and lower alkynyl group bound through a single, terminal ether linkage.

The term "aryl" as used herein, and unless otherwise specified, refers to an aromatic substituent containing a single aromatic ring or multiple aromatic rings that are fused together, directly linked, or indirectly linked (such that the different aromatic rings are bound to a common group such as a methylene or ethylene moiety). Preferred aryl groups contain 5 to 24 carbon atoms, and particularly preferred aryl groups contain 5 to 14 carbon atoms. Exemplary aryl groups contain one aromatic ring or two fused or linked aromatic rings, e.g., phenyl, naphthyl, biphenyl, diphenylether, diphenylamine, benzophenone, and the like. "Substituted aryl" refers to an aryl moiety substituted with one or more substituent groups, and the terms "heteroatom-containing aryl" and "heteroaryl" refer to aryl substituents in which at least one carbon atom is replaced with a heteroatom, as will be described in further detail infra.

The term "aryloxy" as used herein refers to an aryl group bound through a single, terminal ether linkage, wherein "aryl" is as defined above. An "aryloxy" group may be represented as —O-aryl where aryl is as defined above. Preferred aryloxy groups contain 5 to 24 carbon atoms, and particularly preferred aryloxy groups contain 5 to 14 carbon atoms. Examples of aryloxy groups include, without limitation, phenoxy, o-halo-phenoxy, m-halo-phenoxy, p-halo-phenoxy, o-methoxy-phenoxy, m-methoxy-phenoxy, p-methoxy-phenoxy, 2,4-dimethoxy-phenoxy, 3,4,5-trimethoxy-phenoxy, and the like.

The term "alkaryl" refers to an aryl group with an alkyl substituent, and the term "aralkyl" refers to an alkyl group with an aryl substituent, wherein "aryl" and "alkyl" are as defined above. Preferred alkaryl and aralkyl groups contain 6 to 24 carbon atoms, and particularly preferred alkaryl and aralkyl groups contain 6 to 16 carbon atoms. Alkaryl groups include, without limitation, p-methylphenyl, 2,4-dimethylphenyl, p-cyclohexylphenyl, 2,7-dimethylnaphthyl, 7-cyclooctylnaphthyl, 3-ethyl-cyclopenta-1,4-diene, and the like. Examples of aralkyl groups include, without limitation, benzyl, 2-phenyl-ethyl, 3-phenyl-propyl, 4-phenyl-butyl, 5-phenyl-pentyl, 4-phenylcyclohexyl, 4-benzylcyclohexyl, 4-phenylcyclohexylmethyl, 4-benzylcyclohexylmethyl, and the like. The terms "alkaryloxy" and "aralkyloxy" refer to substituents of the formula —OR wherein R is alkaryl or aralkyl, respectively, as just defined. The term "acyl" refers to substituents having the formula —(CO)-alkyl, —(CO)-aryl, —(CO)-aralkyl, —(CO)-alkaryl, —(CO)-alkenyl, or —(CO)-alkynyl, and the term "acyloxy" refers to substituents having the formula —O(CO)-alkyl, —O(CO)-aryl, —O(CO)-aralkyl, —O(CO)-alkaryl, —O(CO)-alkenyl, —O(CO)-alkynyl wherein "alkyl," "aryl," "aralkyl", alkaryl, alkenyl, and alkynyl are as defined above.

The terms "cyclic" and "ring" refer to alicyclic or aromatic groups that may or may not be substituted and/or heteroatom containing, and that may be monocyclic, bicyclic, or polycyclic. The term "alicyclic" is used in the conventional sense to refer to an aliphatic cyclic moiety, as opposed to an aromatic cyclic moiety, and may be monocyclic, bicyclic, or polycyclic.

The terms "halo" and "halogen" are used in the conventional sense to refer to a chloro, bromo, fluoro, or iodo substituent.

"Hydrocarbyl" refers to univalent hydrocarbyl radicals containing 1 to about 30 carbon atoms, preferably 1 to about 24 carbon atoms, most preferably 1 to about 12 carbon atoms, including linear, branched, cyclic, saturated, and unsaturated species, such as alkyl groups, alkenyl groups, alkynyl groups, aryl groups, and the like. The term "lower hydrocarbyl" intends a hydrocarbyl group of 1 to 6 carbon atoms, preferably 1 to 4 carbon atoms, and the term "hydrocarbylene" refers to a divalent hydrocarbyl moiety containing 1 to about 30 carbon atoms, preferably 1 to about 24 carbon atoms, most preferably 1 to about 12 carbon atoms, including linear, branched, cyclic, saturated, and unsaturated species. The term "lower hydrocarbylene" refers to a hydrocarbylene group of 1 to 6 carbon atoms. "Substituted hydrocarbyl" refers to hydrocarbyl substituted with one or more substituent groups, and the terms "heteroatom-containing hydrocarbyl" and "heterohydrocarbyl" refer to hydrocarbyl in which at least one carbon atom is replaced with a heteroatom. Similarly, "substituted hydrocarbylene" refers to hydrocarbylene substituted with one or more substituent groups, and the terms "heteroatom-containing hydrocarbylene" and "heterohydrocarbylene" refer to hydrocarbylene in which at least one carbon atom is replaced with a heteroatom. Unless otherwise indicated, the term "hydrocarbyl" and "hydrocarbylene" are to be interpreted as including substituted and/or heteroatom-containing hydrocarbyl and heteratom-containing hydrocarbylene moieties, respectively.

The term "heteroatom-containing" as in a "heteroatom-containing hydrocarbyl group" refers to a hydrocarbon molecule or a hydrocarbyl molecular fragment in which one or more carbon atoms is replaced with an atom other than carbon, e.g., nitrogen, oxygen, sulfur, phosphorus, or silicon, typically nitrogen, oxygen, or sulfur. Similarly, the term "heteroalkyl" refers to an alkyl substituent that is heteroatom-containing, the term "heterocyclic" refers to a cyclic substituent that is heteroatom-containing, the terms "heteroaryl" and "heteroaromatic" respectively refer to "aryl" and "aromatic" substituents that are heteroatom-containing, and the like. It should be noted that a "heterocyclic" group or compound may or may not be aromatic, and further that "heterocycles" may be monocyclic, bicyclic, or polycyclic as described above with respect to the term "aryl." Examples of heteroalkyl groups include without limitation alkoxyaryl, alkylsulfanyl-substituted alkyl, N-alkylated amino alkyl, and the like. Examples of heteroaryl substituents include without limitation pyrrolyl, pyrrolidinyl, pyridinyl, quinolinyl, indolyl, pyrimidinyl, imidazolyl, 1,2,4-triazolyl, tetrazolyl, etc., and examples of heteroatom-containing alicyclic groups include without limitation pyrrolidino, morpholino, piperazino, piperidino, etc.

By "substituted" as in "substituted hydrocarbyl," "substituted alkyl," "substituted aryl," and the like, as alluded to in some of the aforementioned definitions, is meant that in the hydrocarbyl, alkyl, aryl, or other moiety, at least one hydrogen atom bound to a carbon (or other) atom is replaced with one or more non-hydrogen substituents. Examples of such substituents include, without limitation: functional groups referred to herein as "Fn," such as halo, hydroxyl, sulfhydryl, $C_1$-$C_{24}$ alkoxy, $C_2$-$C_{24}$ alkenyloxy, $C_2$-$C_{24}$ alkynyloxy, $C_5$-$C_{24}$ aryloxy, $C_6$-$C_{24}$ aralkyloxy, $C_6$-$C_{24}$ alkaryloxy, acyl (including $C_2$-$C_{24}$ alkylcarbonyl (—CO-alkyl) and $C_6$-$C_{24}$ arylcarbonyl (—CO-aryl)), acyloxy (—O-acyl, including $C_2$-$C_{24}$ alkylcarbonyloxy (—O—CO-alkyl) and $C_6$-$C_{24}$ arylcarbonyloxy (—O—CO-aryl)), $C_2$-$C_{24}$ alkoxycarbonyl (—(CO)—O-alkyl), $C_6$-$C_{24}$ aryloxycarbonyl (—(CO)—O-aryl), halocarbonyl (—CO)—X where X is halo), $C_2$-$C_{24}$ alkylcarbonato (—O—(CO)—O-alkyl), $C_6$-$C_{24}$ arylcarbonato (—O—(CO)—O-aryl), carboxy (—COOH), carboxylato (—COO$^-$), carbamoyl (—(CO)—NH$_2$), mono-($C_1$-$C_{24}$ alkyl)-substituted carbamoyl (—(CO)—NH($C_1$-$C_{24}$ alkyl)), di-($C_1$-$C_{24}$ alkyl)-substituted carbamoyl (—(CO)—N($C_1$-$C_{24}$ alkyl)$_2$), mono-($C_1$-$C_{24}$ haloalkyl)-substituted carbamoyl (—(CO)—NH($C_1$-$C_{24}$ haloalkyl)), di-($C_1$-$C_{24}$ haloalkyl)-substituted carbamoyl (—(CO)—N($C_1$-$C_{24}$ haloalkyl)$_2$), mono-($C_5$-$C_{24}$ aryl)-substituted carbamoyl (—(CO)—NH-aryl), di-($C_5$-$C_{24}$ aryl)-substituted carbamoyl (—(CO)—N ($C_5$-$C_{24}$ aryl)$_2$), di-N—($C_1$-$C_{24}$ alkyl), N—($C_5$-$C_{24}$ aryl)-substituted carbamoyl (—(CO)—N($C_1$-$C_{24}$ alkyl)($C_5$-$C_{24}$ aryl), thiocarbamoyl (—(CS)—NH$_2$), mono-($C_1$-$C_{24}$ alkyl)-substituted thiocarbamoyl (—(CS)—NH($C_1$-$C_{24}$ alkyl)), di-($C_1$-$C_{24}$ alkyl)-substituted thiocarbamoyl (—(CS)—N($C_1$-$C_{24}$ alkyl)$_2$), mono-($C_5$-$C_{24}$ aryl)-substituted thiocarbamoyl (—(CS)—NH-aryl), di-($C_5$-$C_{24}$ aryl)-substituted thiocarbamoyl (—(CS)—N($C_5$-$C_{24}$ aryl)$_2$), di-N—($C_1$-$C_{24}$ alkyl), N—($C_5$-$C_{24}$ aryl)-substituted thiocarbamoyl (—(CS)—N ($C_1$-$C_{24}$ alkyl)($C_5$-$C_{24}$ aryl), carbamido (—NH—(CO)—NH$_2$), cyano (—C≡N), cyanato (—O—C≡N), thiocyanato (—S—C≡N), isocyanate (—N=C=O), thioisocyanate (—N=C=S), formyl (—(CO)—H), thioformyl (—(CS)—H), amino (—NH$_2$), mono-($C_1$-$C_{24}$ alkyl)-substituted amino (—NH($C_1$-$C_{24}$ alkyl), di-($C_1$-$C_{24}$ alkyl)-substituted amino (—N($C_1$-$C_{24}$ alkyl)$_2$), mono-($C_5$-$C_{24}$ aryl)-substituted amino (—NH($C_5$-$C_{24}$ aryl), di-($C_5$-$C_{24}$ aryl)-substituted amino (—N($C_5$-$C_{24}$ aryl)$_2$), $C_2$-$C_{24}$ alkylamido (—NH—(CO)-alkyl), $C_6$-$C_{24}$ arylamido (—NH—(CO)-aryl), imino (—CR=NH where R includes without limitation hydrogen, $C_1$-$C_{24}$ alkyl, $C_5$-$C_{24}$ aryl, $C_6$-$C_{24}$ alkaryl, $C_6$-$C_{24}$ aralkyl, etc.), $C_2$-$C_{20}$ alkylimino (—CR=N(alkyl), where R includes without limitation hydrogen, $C_1$-$C_{24}$ alkyl, $C_5$-$C_{24}$ aryl, $C_6$-$C_{24}$ alkaryl, $C_6$-$C_{24}$ aralkyl, etc.), arylimino (—CR=N (aryl), where R includes without limitation hydrogen, $C_1$-$C_{20}$ alkyl, $C_5$-$C_{24}$ aryl, $C_6$-$C_{24}$ alkaryl, $C_6$-$C_{24}$ aralkyl, etc.), nitro (—NO$_2$), nitroso (—NO), sulfo (—SO$_2$—OH), sulfonato (—SO$_2$—O$^-$), $C_1$-$C_{24}$ alkylsulfanyl (—S-alkyl; also termed "alkylthio"), $C_5$-$C_{24}$ arylsulfanyl (—S-aryl; also termed "arylthio"), $C_1$-$C_{24}$ alkylsulfinyl (—(SO)-alkyl), $C_5$-$C_{24}$ arylsulfinyl (—(SO)-aryl), $C_1$-$C_{24}$ alkylsulfonyl (—SO$_2$-alkyl), $C_1$-$C_{24}$ monoalkylaminosulfonyl (—SO$_2$—N(H)alkyl), $C_1$-$C_{24}$ dialkylaminosulfonyl (—SO$_2$—N(alkyl)$_2$), $C_5$-$C_{24}$ arylsulfonyl (—SO$_2$-aryl), boryl (—BH$_2$), borono (—B(OH)$_2$), boronato (—B(OR)$_2$ where R includes without limitation alkyl or other hydrocarbyl), phosphono (—P(O)(OH)$_2$), phosphonato (—P(O)(O)$_2$), phosphinato (—P(O)(O$^-$)), phospho (—PO$_2$), and phosphino (—PH$_2$); and the hydrocarbyl moieties $C_1$-$C_{24}$ alkyl (preferably $C_1$-$C_{12}$ alkyl, more preferably $C_1$-$C_6$ alkyl), $C_2$-$C_{24}$ alkenyl (preferably $C_2$-$C_{12}$ alkenyl, more preferably $C_2$-$C_6$ alkenyl), $C_2$-$C_{24}$ alkynyl (preferably $C_2$-$C_{12}$ alkynyl, more preferably $C_2$-$C_6$ alkynyl), $C_5$-$C_{24}$ aryl (preferably $C_5$-$C_{14}$ aryl), $C_6$-$C_{24}$ alkaryl (preferably $C_6$-$C_{16}$ alkaryl), and $C_6$-$C_{24}$ aralkyl (preferably $C_6$-$C_{16}$ aralkyl).

By "functionalized" as in "functionalized hydrocarbyl," "functionalized alkyl," "functionalized olefin," "functionalized cyclic olefin," and the like, is meant that in the hydrocarbyl, alkyl, olefin, cyclic olefin, or other moiety, at least one hydrogen atom bound to a carbon (or other) atom is replaced with one or more functional groups such as those described hereinabove. The term "functional group" is meant to include any functional species that is suitable for the uses described herein. In particular, as used herein, a functional group would necessarily possess the ability to react with or bond to corresponding functional groups on a substrate surface.

In addition, the aforementioned functional groups may, if a particular group permits, be further substituted with one or more additional functional groups or with one or more hydrocarbyl moieties such as those specifically mentioned above. Analogously, the abovementioned hydrocarbyl moieties may be further substituted with one or more functional groups or additional hydrocarbyl moieties as noted above.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

The present disclosure describes embodiments directed to polymer brush structures exhibiting birefringence, each polymer brush structure comprising a plurality of substantially parallel oriented polymers and characterized by a longitudinal z-direction having a first refractive index, $n_z$, and a lateral x,y-direction having a second refractive index, $n_{x,y}$, wherein the difference, Δn, between the first refractive index and the second refractive index is in a range of about 0.1 to about 0.6, as measured by ellipsometry and fit to a Cauchy analytical model. In certain other independent embodiments, the difference, Δn, between the first refractive index and the second refractive index is in a range having a lower value of about 0.1, about 0.15, about 0.2, about 0.25, or about 0.3 and having an upper value of about 1, about 0.8, about 0.7, about 0.65, about 0.6, about 0.55, about 0.5, about 0.45, or about 0.4, in each cases as measured by ellipsometry and again fit to a Cauchy analytical model. The methods for measuring $n_z$ and $n_{x,y}$ and calculating the Δn are described in the Examples.

As used herein, the terms "polymer brush" or "polymer brush structure" are defined as comprising an oriented, substantially parallel array of individual polymer strands, optionally tethered to a substrate surface. Within this construct, as used above, the terms "longitudinal" and "lateral" are defined in terms of the substantially parallel orientation of the plurality of polymers. That is, the longitudinal direction is that direction substantially parallel to the length of the polymer chains and the lateral direction is that direction perpendicular to the longitudinal direction.

In describing polymers which are tethered or attached to a substrate surface at one end, it is useful to describe an individual polymer as having proximal and distal ends, in which the proximal end(s) is/are those ends closest or tethered to the surface, and the distal end(s) is/are those ends of the polymers which stand away from the substrate surface (for those polymers not actually attached to a substrate surface, one may consider the following discussion in terms of the polymer having one end arbitrarily defined as the proximal end attached to a hypothetical surface). Depending on the length and stiffness of the particular polymer, among other parameters, the relative orientation of the proximal and distal ends may be the same or different than the hypothetical projection from the real or hypothetical surface. Longer, less stiff polymers will tend to "bend" or "fold over" more than shorter, stiffer polymers.

The degree of alignment in an oriented polymeric material can be measured by its anisotropic optical properties. Birefringence is anisotropy in the real part of the dielectric function of the material. Because the polarizability of a polymer chain depends on its orientation with respect to the electromagnetic field, the anisotropy of the dielectric function of a polymer material is a direct measure of the degree of alignment of the polymer chains. Highly birefringent samples thus possess highly aligned polymer chains. The vapor phase SI-ROMP from phosphonate monolayers affords materials with very high optical anisotropy, as high as many liquid crystalline materials. The present invention describes such structures having birefringent character not previously reported. Without being bound by the correctness of any particular theory of operation or method of making, this remarkable anisotropy may be attributed to the unique combination of this vapor-phase living polymerization initiated from a very well-defined monolayer. This combination enables the synthesis of bulk organic solids with anisotropy only rivaled by liquid crystalline materials.

In some embodiments, the polymer brush structures comprise a plurality of polymers having alkylene, alkenylene, or both alkylene and alkenylene linkages. The plurality of the polymers within the polymer brush structures may comprise homopolymers or random or block copolymers. While a wider range of polymer options are described below, all of which are considered within the scope of the present invention, certain preferred polymers include those comprising polyacetylene, polynorbornene, or a combination thereof, or those polymers or copolymers derived from the ring-opening metathesis polymerization of cyclohexene, cyclooctene, cyclopentene, cyclooctadiene, dicyclopentadiene, ethylidene norbornene, or mixtures thereof.

As further described below, some of these polymers within the brush structures may further comprise electron donor or electron acceptor substituent, thereby rendering the polymers, polymer brush structures, or both semiconductive. The polymer brush structure may also be capable of responding to or being modified by the presence of an external stimulus, such as a change in the thermal or electromagnetic environment of the brush structure, either by the nature of the polymers within the structures themselves or by the presence of additives within the brush structure. For example, polymer brush structures comprising polyacetylene or other unsaturated, doped, or substituted polymer moieties may be capable of responding to and actually respond to applied electromagnetic radiation so as to change the birefringent character or properties of the polymer brush structure.

The present disclosure also describes embodiments directed to the formation of polymer brush structures by the preparation and use of self-assembled monolayers, and their use as templates for metathesis reactions. The disclosure also provides embodiments related to methods of metathesizing olefinic or acetylenic precursors in the presence or absence of liquids using transition metal-based metathesis catalysts and the products deriving from such methods, and devices made from such products. Various combinations of these embodiments may be considered separately, or in combination with one another.

Additional embodiments of the present invention include methods of metathesizing unsaturated organic compounds, and so forming polymer brush structures, each method comprising contacting at least one feedstock vapor or gas comprising at least one olefinic or acetylenic precursor with a solid transition metal-based metathesis catalyst to form a polymer product, wherein the transition metal-based metathesis catalyst is in a solid form (i.e., undissolved in a solvent or liquid precursor) and the contacting is done in the absence of a liquid (including solvent or precursor). In other embodiments, the contacting may be done in the presence of solvent. But in preferred embodiments, the olefinic or acetylenic precursor is presented to the solid transition metal-based metathesis catalyst as a vapor or gas. As used herein, the terms "gas" and "vapor" are distinguished, in that the term "gas" is used to describe a condition where the partial pressure of the precursor organic compound is less than the saturated vapor pressure for that material at the conditions applied during the polymerization reaction, whereas the term "vapor" refers to a condition where the precursor compound is at or above the saturated vapor pressure at the conditions applied for the metathesis. Separate additional independent embodiments provide that the term gas refers to a condition wherein the partial pressure of precursor compound is in a range having a lower value of about 0.001%, about 0.01%, about 0.1%, about 1%, 5%, about 10%, about 25%, or about 50% and an upper value of about 99%, about 95%, about 90%, about 80%, about 75%, about 50%, about 25%, about 10%, about 5%, about 2%, or about 1% of the saturated vapor pressure for that material at the conditions applied during the polymerization reaction. Exemplary, non-limiting, ranges include from about 0.1% to about 1%, from about 1% to about 5%, from 1% to about 10%, from about 5% to about 10%, and from about 5% to about 25%, of the saturated vapor pressure for that material at the conditions applied during the polymerization reaction. Accordingly, reactions involving subliming solids, or other reaction conditions wherein the volatilized precursor compound are in equilibrium with its corresponding solid or liquid phase are considered to involve vapor phase, and not gas phase, conditions. The term "gas" is also intended to include those materials at conditions above their critical points—i.e., supercritical conditions. The direct vapor/solid phase and direct gas/solid phase polymerization reactions are considered to be independent variants of the general invention. While both are considered within the scope of the present disclosure, direct gas/solid phase polymerization reactions are preferred. To the knowledge of the inventors, at least the direct gas/solid phase polymerization reactions described herein are unprecedented using metathesis catalysts.

While less preferred, the reactions disclosed herein may be carried out in the presence of a solvent, including organic, protic, or aqueous solvents, such as aromatic hydrocarbons, chlorinated hydrocarbons, ethers, aliphatic hydrocarbons, alcohols, water, or mixtures thereof. Example solvents include benzene, toluene, p-xylene, methylene chloride, 1,2-dichloroethane, dichlorobenzene, chlorobenzene, tetrahydrofuran, diethylether, pentane, methanol, ethanol, water, or mixtures thereof. While any solvent that is inert towards cross-metathesis may be employed, in those embodiments where solvents are employed, preferred solvents are those which are poor solvents for both the polymers and the distal polymer ends comprising the metathesis catalysts.

Also, and as will become apparent during the following discussion, and while not intending to be bound by the correctness of the theory described herein, the technology may be envisioned in terms that the growing polymer material is comprised of an individual polymer chain or an array of polymer chains with a living layer of catalyst at the surface (or at the "distal ends" of the "growing" polymer chains). While not requiring that the growing polymer(s) is/are attached to any surface, one advantage of such a phenomenon, is that it enables imprinting of a surface pattern/texture/etc. (either physisorbed or chemically tethered) onto the material being grown. It also enables the living catalyst layer at the surface to be used for further functionality (e.g., in making blocks for block copolymers, recycling the catalyst, and in transforming the catalyst to make functionalized or further active termini). This is very much distinguished from a solution-phase reaction, or even a vapor phase reaction, where solvation leads to a greater degree of reorganization/diffusion of the living catalyst species—and thus randomization (loss of surface "memory") of the polymer material being grown.

Returning again to some embodiments of the invention, and as described above, each method for preparing the polymer brush structures comprises contacting at least one feedstock vapor or gas comprising at least one olefinic or acetylenic precursor with a solid transition metal-based metathesis catalyst to form a polymer product, wherein the transition metal-based metathesis catalyst is in a solid form and the contacting is done under direct vapor/solid phase and direct gas/solid phase polymerization reaction conditions. In certain embodiments, the product polymers associated with the polymer brush structures are formed by a mechanism comprising an enyne reaction, a diyne reaction, a ring opening metathesis polymerization (ROMP) reaction, or a combination or each type of reaction, though it should be appreciated that the teachings described herein may be applied to and incorporate other types of metathesis reactions (e.g., cross metathesis reactions). In preferred embodiments, the method provides that the product polymer results from at least partial polymerization of an acetylene (especially acetylene itself) by an enyne (or diyne) mechanism. That is, the methods provide for direct gas/solid phase polymerization reactions incorporating acetylenic precursors into either random or block copolymers, along with other non-acetylenic precursors. For example, certain independent embodiments provide that at least one of the feedstocks may independently comprise at least one olefinic precursor, or at least one acetylenic precursor, or a mixture of one or more olefinic and acetylenic precursors. Other embodiments provide that the product polymer may derive from application of a singly applied feedstock or a plurality of feedstocks applied sequentially. That is, the polymerization can be paused by reducing the amount of available feedstock precursors, eliminating free feedstock precursors, or transferring the polymerization to a new environment. The polymerization can be resumed by reintroducing the same or different feedstock precursors to the previously formed polymer chains. Similarly, the polymerization can be stopped by exposing the polymer chains to a chain transfer agent. Chain transfer agents transfer the catalyst from a growing polymer chain to the chain transfer agent. Since the polymerization occurs at the terminal, distal end of the polymer chain(s), the use of a chain transfer agent results in all or a portion of the chain transfer agent being bonded to the end to the polymer chains. This enables one to functionalize the terminal, distal ends of the growing polymer strands and, where present as a plurality of polymer strands, the surface of the polymeric material. Illustrative functionalized chain transfer agents include those represented by a general formula X—CH=CH—Y, where X and Y may be the same or different. These chain transfer agents may include, but are not limited to, symmetrical internal olefins or vinyl ethers. These chain transfer agents may also be optionally substituted, such as substituted with an amino, carbene, carboxylate, catecholate, a dithiocarbamate, dithioic acid, hydroxy, hydroxyamic acid, isocyanato, nitrite, phosphate, phosphonate, a silane or silicate, or thiol groups, or any combination thereof.

The skilled artisan would appreciate the various types of polymer classes that such options present. For example, application of a single feedstock would results in a homopolymer derived from the monomers of that precursor; e.g., where only acetylene is used, the product polymer would be polyacetylene. In another example, application of a single feedstock comprising a mixture of at least one olefinic precursor, or at least one acetylenic precursor, or a mixture of one or more olefinic and acetylenic precursors would result in either a random copolymer, a partial block copolymer, or a pure block copolymer, the exact nature of which depending on the relative concentrations and reactivities of the respective monomer precursors. In yet another application, sequential applications of individual feedstocks comprising, for example, an olefinic precursor, an acetylenic precursor, and a different acetylenic precursor would result in a deliberately engineered block copolymer. In those cases where multiple steps are involved, it is not necessary that every application employs the inventive steps described herein to be considered within the scope of the present invention, so long as one application does. These examples are not intended to be limiting, but representative of possible options, and again the specific design of the product polymers would be within the skill and control of the person of ordinary skill in the art, using the teachings presented here.

As described herein, in certain embodiments, the methods provide polyacetylene or polynorbornene polymers or blocks within block co-polymers. Depending on the choice of reaction conditions, for example temperature, pressure, and choice of catalyst (see, e.g., below), in some of these embodiments, the polyacetylene may form in a substantially cis-conformation (i.e., as a cis-polyacetylene polymer or block) and in other embodiments in a substantially trans-conformation (i.e., as trans-polyacetylene polymer or block). Similar experimental modifications may be employed to provide that the incorporated olefins adopt similar cis- or trans-conformations. Polynorbornene polymers or copolymers are attractive, in part, because of the speed with which norbornene metathesizes under the conditions described herein, allowing for rapid development of thick structures.

The methods may use precursors that contain electron donor substituents, electron acceptor substituents, or both, such that the precursor, when polymerized, is capable of forming a semiconducting polymer or polymer block that acts as an electron donor, acceptor, or both. Note that the ability to prepare block copolymers comprising separate donor/acceptor blocks offers the possibility of forming p-n junctions to use as diodes and the like. Suitable precursors are those which provide polymers that are electron acceptors or donors or semiconducting organometallic polymers that are electron acceptors or electron donors or emitters. As described herein, these methods can be modified to provide polymers or polymer blocks that are doped to behave as a p-type semiconductors or an n-type semiconductor. Especially suitable precursors are those which are capable of providing polyacetylenes, polypyrroles, polyanilines, poly(thienylenevinylene)s, polythiophenes, and poly(phenylenevinylene)s, any of which can be substituted or unsubstituted and branched or unbranched. As describes elsewhere herein, a particularly useful example of precursor is acetylene, capable of providing polyacetylenes.

The methods can be used to provide polymer products of virtually any length, individual embodiments described some such lengths as being within a range having a lower value of about 5 nm, about 10 nm, about 50 nm, about 100 nm, about 500 nm, or about 1000 nm and an upper value of about 10,000 nm, about 5000 nm, about 1000 nm, about 500 nm, about 100 nm, or about 50 nm. Illustrative, non-limiting ranges, then, can include those from about 10 nm to about 10,000 nm, about 10 nm to 1000 nm, or about 50 nm to about 500 nm.

Stated differently, the methods can be used to provide polymer products (including polymers or polymer blocks) which are not intrinsically limited by the number of repeating units. However, so as to specify some limits, certain embodiments provide that the methods independently provide polymers or polymer blocks having at least about 5, 50, or 500 repeating units, less than 500,000, 50,000, or 5000 repeating units, or any combination thereof.

One of the many advantages of the present invention is that the rate at which the different polymer chains grow is more consistent than seen in traditional chain polymerization reactions. The similarity in growth rate for each individual polymer strand results in chains of very similar lengths. In separate embodiments, at least about 50%, 60%, 70%, 80%, or at least about 90% of the formed product polymer chains have lengths within 50 nm, 25 nm or 10 nm of their average length.

The methods may further comprise steps which comprise co-depositing, or sequentially stepwise depositing nanoparticles or other materials, during or following a metathesis reaction. Unless otherwise specified, nanoparticles include those particles or fibrils having a least one dimension in a range of from about 1 nm to about 1000 nm. Additional independent embodiments provide that such particles may have such particle dimensions in a range having a lower value of about 1 nm, about 2 nm, about 5 nm, about 10 nm, or about 50 nm and an upper value of about 1000 nm, about 800 nm, about 600 nm, about 400 nm, about 200 nm, or about 100 nm, with exemplary ranges including those from about 2 nm to about 100 nm, from 2 nm, or from bout to about 50 nm, or a range of from about 5 nm to about 10 nm. In the context of the present invention, nanoparticles may be organic or inorganic and may include, but are not limited to, nanotubes, magnetic nanoparticles and quantum dots.

Since, as suggested above, the polymerization can be paused at nearly any point in the reaction and then resumed, a layer of nanoparticles can optionally be formed on the partially formed active polymer chains while the polymerization is paused. When the polymerization is resumed, the active polymer chains can extend through interstices in the nanoparticles. The ability to pause the polymerization at nearly any point in the polymerization allows one or more layers of the nanoparticles to be positioned anywhere along the length of the active polymer chains. For instance, a layer of the nanoparticles can be positioned such that the p-n junctions are positioned in the interstices of the nanoparticles. Additionally, the nanoparticles can be selected to scatter incident light. When the nanoparticles are positioned to scatter this light near the p-n junctions, the amount of light absorbed near the p-n junctions can be increased in order to further enhance the efficiency of the device. In addition to scattering light or as an alternative to scattering light, the nanoparticles can increase optical density near the nanoparticles as a result of the nanoparticles behaving as an antenna. When the nanoparticles are positioned to enhance light density near the p-n junctions, the amount of light absorbed near the p-n junctions can be increased in order to further enhance the efficiency of the device.

The methods may further comprise steps which comprise co-depositing, or sequentially stepwise depositing other materials during or following a metathesis reaction. Such "other materials" may include species which may act as a dopant in the final form product. Iodine is one such exemplary molecule, having sufficient volatility to be useful in this capacity. Similarly, metals or other conductors may be deposited onto the polymer products.

As described above, among the embodiments of the present invention are those methods in which the metathesis reactions are described in terms direct vapor/solid phase and direct gas/solid phase polymerization, preferably the latter. One advantage of the inventive methods is that the metatheses can be conducted under miler conditions under relatively milder conditions, relative the corresponding solvent-based or uncatalyzed reactions. That said, various embodiments include those where the metathesis reaction is carried out under conditions where the at least one olefinic or acetylenic precursor has a partial pressure in a range of from about 0.1 psia to about 300 psia, at a temperature in a range of from about −10° C. to about 300° C., or both. The methods may still be operable outside of these ranges, though one would expect that these conditions would be at the expense of any useful kinetics. In other independent embodiments, the methods may be practiced at precursor partial pressures bounded by ranges in which the lower value is about 0.1, about 0.5, about 1, about 2, about 3, about 4, about 5, about 6, about 7, about 8, about 9, about 10, about 15, about 20, about 25, about 30, about 40, about 50, about 60, about 70, about 80, about 90, or about 100 psia and the upper value of the range is about 10, about 20, about 30, about 40, about 50, about 60, about 80, about 100, about 120, about 140, about 160, about 180, or about 200 psia. Likewise, the methods may be practiced at temperatures bounded by ranges in which the lower value is about −10° C., about 0° C., about 20° C., about 40° C., about 60° C., about 80° C., or about 100° C., and the upper end of the range is about 300° C., about 275° C., about 250° C., about 225° C., about 200° C., about 180° C., about 160° C., about 140° C., about 120° C., about 110° C., or about 100° C. As the skilled artisan will appreciate, the choice of operating conditions, particularly temperature, will depend on a number of factors, including the nature of the organic precursors and the transition metal catalysts, through the skilled artisan would be able to define these without undue experimentation.

Acetylenic Precursors

The methods herein are described in terms of at least one feedstock comprising at least one olefinic or acetylenic precursor. In principle, these feedstocks may comprise precursors comprising cyclic or alicyclic cis- or trans-alkenes or compounds containing an alkyne linkage. Since methods employing direct gas/solid phase polymerization reactions are preferred, those precursors that are sufficiently volatile under the reactions conditions described below as to be present in the gas phase (as contrasted to the vapor phase) are also preferred. Also as suggested elsewhere herein, given the preference for products accessible by enyne or diyne reaction mechanisms, optionally substituted acetylenes (alkynyl compounds) are particularly suitable, and in some cases necessary, precursors for these methods. Lower alkynyl (acetylenic) compounds are particularly suitable. As used herein, the term "alkynyl" (or "acetylenic") or "alkyne" refers to a linear or branched hydrocarbon group or compound of 2 to about 24 carbon atoms containing at least one triple bond, such as ethynyl, n-propynyl, and the like. Preferred alkynyl groups herein contain 2 to about 12 carbon atoms, preferably containing a terminal alkyne bond. The term "lower alkynyl" refers to an alkynyl group of 2 to 6 carbon atoms. The term "substituted alkynyl" refers to alkynyl substituted with one or more substituent groups. As used herein, the terms "optional" or "optionally" mean that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

Acetylene (ethyne) itself is a particularly attractive precursor for the various embodiments described herein, but other lower alkynes may also be employed, depending on the desired final polymer products. Similarly, aryl substituted alkynes may also be suitable. As will be described further below, anchored or tethered polyacetylenes are attractive products from the inventive methods.

Olefinic Precursors

Olefinic precursors may be used in tandem with the acetylenes, either employed as part of the feedstock mixtures, or in sequential processing of the product polymers. Suitable options for such precursors are those ring systems, particularly strained ring systems, which are useful for ROMP reactions. One such class of compounds in this regard is substituted or unsubstituted cyclooctatetraenes, including cyclooctatetraene itself. However, a polymer or polymer block derived from this material would be a polyacetylene, and this moiety is preferably derived in this invention from acetylene itself. Because cyclooctatetraene is made from acetylene, use of this latter precursor by an enyne reaction offers a more direct, efficient and economical synthesis. The ability to operate at the solid/gas interface for the surface confined polymerization of polyacetylene enables direct control over the pressure and temperature of the system.

When considering alternative olefinic precursors in the present methods, more preferred precursors may be those which, which when incorporated into polyacetylene polymers or copolymers, modify the electrical or physical character of the resulting polymer. One general class of such precursors is substituted annulenes and annulynes, for example [18]annulene-1,4;7,10;13,16-trisulfide. When co-polymerized with acetylene, this precursor can form a block co-polymer as shown here:

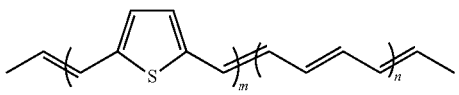

Substituted analogs of these trisulfides, as described below can also be used to provide corresponding substituted poly(thienylvinylene)-containing polymers or copolymers. For example, the 2,3,8,9,14,15-hexaoctyl derivative of [18]annulene-1,4;7,10;13,16-trisulfide is described in Horie, et al., "Poly(thienylvinylene) prepared by ring-opening metathesis polymerization: Performance as a donor in bulk heterojunction organic photovoltaic devices," *Polymer* 51 (2010) 1541-1547, which is incorporated by reference herein for all purposes

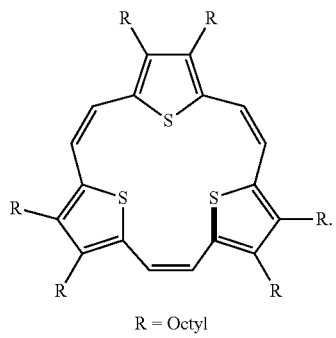

R = Octyl

As described above, suitable options for such olefinic or acetylenic precursors include ring systems, particularly strained ring systems, which are useful for ROMP reactions. Such cyclic olefins may be optionally substituted, optionally heteroatom-containing, mono-unsaturated, di-unsaturated, or poly-unsaturated $C_5$ to $C_{24}$ hydrocarbons that may be mono-, di-, or poly-cyclic. The cyclic olefin may generally be any strained or unstrained cyclic olefin, provided the cyclic olefin is able to participate in a ROMP reaction either individually or as part of a ROMP cyclic olefin composition. While certain unstrained cyclic olefins such as cyclohexene are generally understood to not undergo ROMP reactions by themselves, under appropriate circumstances, such unstrained cyclic olefins may nonetheless be ROMP active. For example, when present as a co-monomer in a ROMP composition, unstrained cyclic olefins may be ROMP active. Accordingly, as used herein and as would be appreciated by the skilled artisan, the term "unstrained cyclic olefin" is intended to refer to those unstrained cyclic olefins that may undergo a ROMP reaction under any conditions, or in any ROMP composition, provided the unstrained cyclic olefin is ROMP active.

In general, the cyclic olefin may be represented by the structure of formula (A)

(A)

wherein J, $R^{A1}$, and $R^{A2}$ are as follows:

$R^{A1}$ and $R^{A2}$ is selected independently from the group consisting of hydrogen, hydrocarbyl (e.g., $C_1$-$C_{20}$ alkyl, $C_5$-$C_{20}$ aryl, $C_5$-$C_{30}$ aralkyl, or $C_5$-$C_{30}$ alkaryl), substituted hydrocarbyl (e.g., substituted $C_1$-$C_{20}$ alkyl, $C_5$-$C_{20}$ aryl, $C_5$-$C_{30}$ aralkyl, or $C_5$-$C_{30}$ alkaryl), heteroatom-containing hydrocarbyl (e.g., $C_1$-$C_{20}$ heteroalkyl, $C_5$-$C_{20}$ heteroaryl, heteroatom-containing $C_5$-$C_{30}$ aralkyl, or heteroatom-containing $C_5$-$C_{30}$ alkaryl), and substituted heteroatom-containing hydrocarbyl (e.g., substituted $C_1$-$C_{20}$ heteroalkyl, $C_5$-$C_{20}$ heteroaryl, heteroatom-containing $C_5$-$C_{30}$ aralkyl, or heteroatom-containing $C_5$-$C_{30}$ alkaryl) and, if substituted hydrocarbyl or substituted heteroatom-containing hydrocarbyl, wherein the substituents may be functional groups ("Fn") such as phosphonato, phosphoryl, phosphanyl, phosphino, sulfonato, $C_1$-$C_{20}$ alkylsulfanyl, $C_5$-$C_{20}$ arylsulfanyl, $C_1$-$C_{20}$ alkylsulfonyl, $C_5$-$C_{20}$ arylsulfonyl, $C_1$-$C_{20}$ alkylsulfinyl, $C_5$-$C_{20}$ arylsulfinyl, sulfonamido, amino, amido, imino, nitro, nitroso, hydroxyl, $C_1$-$C_{20}$ alkoxy, $C_5$-$C_{20}$ aryloxy, $C_2$-$C_{20}$ alkoxycarbonyl, $C_5$-$C_{20}$ aryloxycarbonyl, carboxyl, carboxylato, mercapto, formyl, $C_1$-$C_{20}$ thioester, cyano, cyanato, thiocyanato, isocyanate, thioisocyanate, carbamoyl, epoxy, styrenyl, silyl, silyloxy, silanyl, siloxazanyl, boronato, boryl, or halogen, or a metal-containing or metalloid-containing group (wherein the metal may be, for example, Sn or Ge). $R^{A1}$ and $R^{A2}$ may itself be one of the aforementioned groups, such that the Fn moiety is directly bound to the olefinic carbon atom indicated in the structure. In the latter case, however, the functional group will generally not be directly bound to the olefinic carbon through a heteroatom containing one or more lone pairs of electrons, e.g., an oxygen, sulfur, nitrogen, or phosphorus atom, or through an electron-rich metal or metalloid such as Ge, Sn, As, Sb, Se, Te, etc. With such functional groups, there will normally be an intervening linkage $Z^*$, such that either or both of $R^{A1}$ and $R^{A2}$ then has the structure —$(Z^*)_n$-Fn wherein n is 1, Fn is the functional group, and $Z^*$ is a hydrocarbylene linking group such as an alkylene, substituted alkylene, heteroalkylene, substituted heteroalkene, arylene, substituted arylene, heteroarylene, or substituted heteroarylene linkage.

J is a saturated or unsaturated hydrocarbylene, substituted hydrocarbylene, heteroatom-containing hydrocarbylene, or substituted heteroatom-containing hydrocarbylene linkage, wherein when J is substituted hydrocarbylene or substituted heteroatom-containing hydrocarbylene, the substituents may include one or more —$(Z^*)_n$-Fn groups, wherein n is zero or 1, and Fn and $Z^*$ are as defined previously. Additionally, two or more substituents attached to ring carbon (or other) atoms within J may be linked to form a bicyclic or polycyclic olefin. J will generally contain in the range of approximately 5 to 14 ring atoms, typically 5 to 8 ring atoms, for a monocyclic olefin, and, for bicyclic and polycyclic olefins, each ring will generally contain 4 to 8, typically 5 to 7, ring atoms.

Mono-unsaturated cyclic olefins encompassed by structure (A) may be represented by the structure (B)

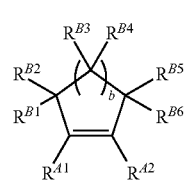

(B)

wherein b is an integer generally although not necessarily in the range of 1 to 10, typically 1 to 5, $R^{A1}$ and $R^{A2}$ are as defined above for structure (A), and $R^{B1}$, $R^{B2}$, $R^{B3}$, $R^{B4}$, $R^{B5}$, and $R^{B6}$ are independently selected from the group consisting of hydrogen, hydrocarbyl, substituted hydrocarbyl, heteroatom-containing hydrocarbyl, substituted heteroatom-containing hydrocarbyl and —$(Z^*)_n$-Fn where n, $Z^*$ and Fn are as defined previously, and wherein if any of the $R^{B1}$ through $R^{B6}$ moieties is substituted hydrocarbyl or substituted heteroatom-containing hydrocarbyl, the substituents may include one or more —$(Z^*)_n$-Fn groups. Accordingly, $R^{B1}$, $R^{B2}$, $R^{B3}$, $R^{B4}$, $R^{B5}$, and $R^{B6}$ may be, for example, hydrogen, hydroxyl, $C_1$-$C_{20}$ alkyl, $C_5$-$C_{20}$ aryl, $C_1$-$C_{20}$ alkoxy, $C_5$-$C_{20}$ aryloxy, $C_2$-$C_{20}$ alkoxycarbonyl, $C_5$-$C_{20}$ aryloxycarbonyl, amino, amido, nitro, etc.

Furthermore, any of the $R^{B1}$, $R^{B2}$, $R^{B3}$, $R^{B4}$, $R^{B5}$, and $R^{B6}$ moieties can be linked to any of the other $R^{B1}$, $R^{B2}$, $R^{B3}$, $R^{B4}$, $R^{B5}$, and $R^{B6}$ moieties to provide a substituted or unsubstituted alicyclic group containing 4 to 30 ring carbon atoms or a substituted or unsubstituted aryl group containing 6 to 18 ring carbon atoms or combinations thereof and the linkage may include heteroatoms or functional groups, e.g. the linkage may include without limitation an ether, ester, thioether, amino, alkylamino, imino, or anhydride moiety. The alicyclic group can be monocyclic, bicyclic, or polycyclic. When unsaturated the cyclic group can contain monounsaturation or multiunsaturation, with monounsaturated cyclic groups being preferred. When substituted, the rings contain mono-substitution or multisubstitution wherein the substituents are independently selected from hydrogen, hydrocarbyl, substituted hydrocarbyl, heteroatom-containing hydrocarbyl, substituted heteroatom-containing hydrocarbyl, —$(Z^*)_n$-Fn where n is zero or 1, $Z^*$ and Fn are as defined previously, and functional groups (Fn) provided above.

Examples of monounsaturated, monocyclic olefins encompassed by structure (B) include, without limitation, cyclopentene, cyclohexene, cycloheptene, cyclooctene, cyclononene, cyclodecene, cycloundecene, cyclododecene, tricyclodecene, tetracyclodecene, octacyclodecene, and cycloeicosene, and substituted versions thereof such as 1-methylcyclopentene, 1-ethylcyclopentene, 1-isopropylcyclohexene, 1-chloropentene, 1-fluorocyclopentene, 4-methylcyclopentene, 4-methoxy-cyclopentene, 4-ethoxy-cyclopentene, cyclopent-3-ene-thiol, cyclopent-3-ene, 4-methylsulfanyl-cyclopentene, 3-methylcyclohexene, 1-methylcyclooctene, 1,5-dimethylcyclooctene, etc.

Monocyclic diene reactants encompassed by structure (A) may be generally represented by the structure (C)

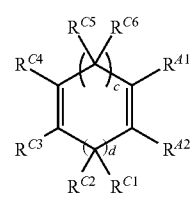

(C)

wherein c and d are independently integers in the range of 1 to about 8, typically 2 to 4, preferably 2 (such that the reactant is a cyclooctadiene), $R^{A1}$ and $R^{A2}$ are as defined above for structure (A), and $R^{C1}$, $R^{C2}$, $R^{C3}$, $R^{C4}$, $R^{C5}$, and $R^{C6}$ are defined as for $R^{B1}$ through $R^{B6}$. In this case, it is preferred that $R^{C3}$ and $R^{C4}$ be non-hydrogen substituents, in which case the second olefinic moiety is tetrasubstituted. Examples of monocyclic diene reactants include, without limitation, 1,3-cyclopentadiene, 1,3-cyclohexadiene, 1,4-cyclohexadiene, 5-ethyl-1,3-cyclohexadiene, 1,3-cycloheptadiene, cyclohexadiene, 1,5-cyclooctadiene, 1,3-cyclooctadiene, and substituted analogs thereof. Triene reactants are analogous to the diene structure (C), and will generally contain at least one methylene linkage between any two olefinic segments. Bicyclic and polycyclic olefins encompassed by structure (A) may be generally represented by the structure (D)

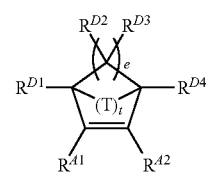

(D)

wherein $R^{A1}$ and $R^{A2}$ are as defined above for structure (A), $R^{D1}$, $R^{D2}$, $R^{D3}$, and $R^{D4}$ are as defined for $R^{B1}$ through $R^{B6}$, e is an integer in the range of 1 to 8 (typically 2 to 4) f is generally 1 or 2; T is lower alkylene or alkenylene (generally substituted or unsubstituted methyl or ethyl), $CHR^{G1}$, $C(R^{G1})_2$, O, S, N—$R^{G1}$, P—$R^{G1}$, O═P—$R^{G1}$, $Si(R^{G1})_2$, B—$R^{G1}$, or As—$R^{G1}$ where $R^{G1}$ is alkyl, alkenyl, cycloalkyl, cycloalkenyl, aryl, alkaryl, aralkyl, or alkoxy. Furthermore, any of the $R^{D1}$, $R^{D2}$, $R^{D3}$, and $R^{D4}$ moieties can be linked to any of the other $R^{D1}$, $R^{D2}$, $R^{D3}$, and $R^{D4}$ moieties to provide a substituted or unsubstituted alicyclic group containing 4 to 30 ring carbon atoms or a substituted or unsubstituted aryl group containing 6 to 18 ring carbon atoms or combinations thereof and the linkage may include heteroatoms or functional groups, e.g. the linkage may include without limitation an ether, ester, thioether, amino, alkylamino, imino, or anhydride moiety. The cyclic group can be monocyclic, bicyclic, or polycyclic. When unsaturated the cyclic group can contain mono-unsaturation or multi-unsaturation, with mono-unsaturated cyclic groups being preferred. When substituted, the rings contain mono-substitution or multisubstitution wherein the substituents are independently selected from hydrogen, hydrocarbyl, substituted hydrocarbyl, heteroatom-containing hydrocarbyl, substituted heteroatom-containing hydrocarbyl, —$(Z^*)_n$-Fn where n is zero or 1, $Z^*$ and Fn are as defined previously, and functional groups (Fn) provided above.

Cyclic olefins encompassed by structure (D) are in the norbornene family. As used herein, norbornene means any compound that includes at least one norbornene or substituted norbornene moiety, including without limitation norbornene, substituted norbornene(s), norbornadiene, substituted norbornadiene(s), polycyclic norbornenes, and substituted polycyclic norbornene(s). Norbornenes within this group may be generally represented by the structure (E)

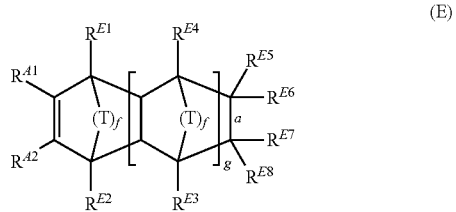

(E)

wherein $R^{A1}$ and $R^{A2}$ are as defined above for structure (A), T is as defined above for structure (D), $R^{E1}$, $R^{E2}$, $R^{E3}$, $R^{E4}$, $R^{E5}$, $R^{E6}$, $R^{E7}$, and $R^{E8}$ are as defined for $R^{B1}$ through $R^{B6}$, and "a" represents a single bond or a double bond, f is generally 1 or 2, "g" is an integer from 0 to 5, and when "a" is a double bond one of $R^{E5}$, $R^{E6}$ and one of $R^{E7}$, $R^{E8}$ is not present. Furthermore, any of the $R^{E5}$, $R^{E6}$, $R^{E7}$, and $R^{E8}$ moieties can be linked to any of the other $R^{E5}$, $R^{E6}$, $R^{E7}$, and $R^{E8}$ moieties to provide a substituted or unsubstituted alicyclic group containing 4 to 30 ring carbon atoms or a substituted or unsubstituted aryl group containing 6 to 18 ring carbon atoms or combinations thereof and the linkage may include heteroatoms or functional groups, e.g. the linkage may include without limitation an ether, ester, thioether, amino, alkylamino, imino, or anhydride moiety. The cyclic group can be monocyclic, bicyclic, or polycyclic. When unsaturated the cyclic group can contain monounsaturation or multiunsaturation, with monounsaturated cyclic groups being preferred. When substituted, the rings contain monosubstitution or multisubstitution wherein the substituents are independently selected from hydrogen, hydrocarbyl, substituted hydrocarbyl, heteroatom-containing hydrocarbyl, substituted heteroatom-containing hydrocarbyl, —$(Z^*)_n$-Fn where n is zero or 1, $Z^*$ and Fn are as defined previously, and functional groups (Fn) provided above.

More preferred cyclic olefins possessing at least one norbornene moiety have the structure (F):

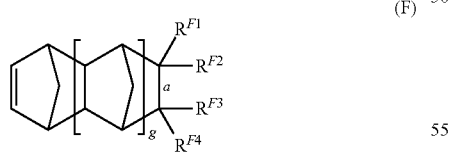

(F)

wherein, $R^{F1}$, $R^{F2}$, $R^{F3}$, and $R^{F4}$, are as defined for $R^{B1}$ through $R^{B6}$, and "a" represents a single bond or a double bond, "g" is an integer from 0 to 5, and when "a" is a double bond one of $R^{F1}$, $R^{F2}$ and one of $R^{F3}$, $R^{F4}$ is not present.

Furthermore, any of the $R^{F1}$, $R^{F2}$, $R^{F3}$, and $R^{F4}$ moieties can be linked to any of the other $R^{F1}$, $R^{F2}$, $R^{F3}$, and $R^{F4}$ moieties to provide a substituted or unsubstituted alicyclic group containing 4 to 30 ring carbon atoms or a substituted or unsubstituted aryl group containing 6 to 18 ring carbon atoms or combinations thereof and the linkage may include heteroatoms or functional groups, e.g. the linkage may include without limitation an ether, ester, thioether, amino, alkylamino, imino, or anhydride moiety. The alicyclic group can be monocyclic, bicyclic, or polycyclic. When unsaturated the cyclic group can contain monounsaturation or multiunsaturation, with monounsaturated cyclic groups being preferred. When substituted, the rings contain monosubstitution or multisubstitution wherein the substituents are independently selected from hydrogen, hydrocarbyl, substituted hydrocarbyl, heteroatom-containing hydrocarbyl, substituted heteroatom-containing hydrocarbyl, —$(Z^*)_n$-Fn where n is zero or 1, $Z^*$ and Fn are as defined previously, and functional groups (Fn) provided above.

One route for the preparation of hydrocarbyl substituted and functionally substituted norbornenes employs the Diels-Alder cycloaddition reaction in which cyclopentadiene or substituted cyclopentadiene is reacted with a suitable dienophile at elevated temperatures to form the substituted norbornene adduct generally shown by the following reaction Scheme 4:

SCHEME 4

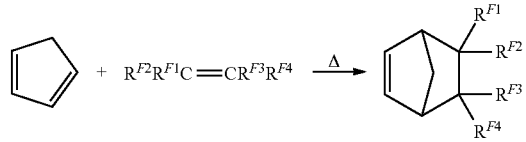

wherein $R^{F1}$ to $R^{F4}$ are as previously defined for structure (F).

Other norbornene adducts can be prepared by the thermal pyrolysis of dicyclopentadiene in the presence of a suitable dienophile. The reaction proceeds by the initial pyrolysis of dicyclopentadiene to cyclopentadiene followed by the Diels-Alder cycloaddition of cyclopentadiene and the dienophile to give the adduct shown below in Scheme 5:

SCHEME 5

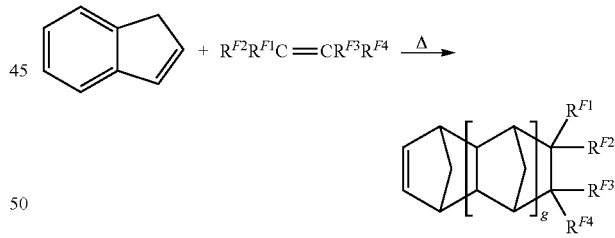

wherein "g" is an integer from 0 to 5, and $R^{F1}$ to $R^{F4}$ are as previously defined for structure (F).

Norbornadiene and higher Diels-Alder adducts thereof similarly can be prepared by the thermal reaction of cyclopentadiene and dicyclopentadiene in the presence of an acetylenic reactant as shown below in Scheme 6:

SCHEME 6

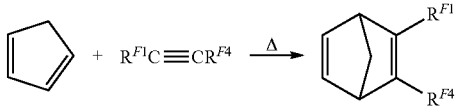

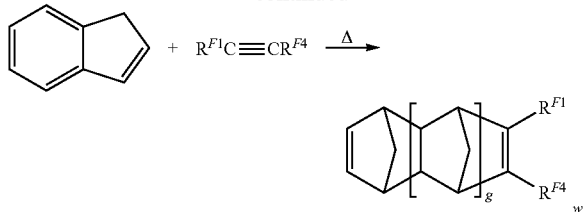

herein "g" is an integer from 0 to 5, $R^{F1}$ and $R^{F4}$ are as previously defined for structure (F) Examples of bicyclic and polycyclic olefins thus include, without limitation, dicyclopentadiene (DCPD); trimer and other higher order oligomers of cyclopentadiene including without limitation tricyclopentadiene (cyclopentadiene trimer), cyclopentadiene tetramer, and cyclopentadiene pentamer; ethylidenenorbornene; dicyclohexadiene; norbornene; 5-methyl-2-norbornene; 5-ethyl-2-norbornene; 5-isobutyl-2-norbornene; 5,6-dimethyl-2-norbornene; 5-phenylnorbornene; 5-benzylnorbornene; 5-acetylnorbornene; 5-methoxycarbonylnorbornene; 5-ethyoxycarbonyl-1-norbornene; 5-methyl-5-methoxy-carbonyl-norbornene; 5-cyanonorbornene; 5,5,6-trimethyl-2-norbornene; cyclo-hexenylnorbornene; endo, exo-5,6-dimethoxynorbornene; endo, endo-5,6-dimethoxynorbornene; endo, exo-5,6-dimethoxycarbonylnorbornene; endo,endo-5,6-dimethoxycarbonylnorbornene; 2,3-dimethoxynorbornene; norbornadiene; tricycloundecene; tetracyclododecene; 8-methyltetracyclododecene; 8-ethyltetracyclododecene; 8-methoxycarbonyltetracyclododecene; 8-methyl-8-tetracyclododecene; 8-cyanotetracyclododecene; pentacyclopentadecene; pentacyclohexadecene; and the like, and their structural isomers, stereoisomers, and mixtures thereof. Additional examples of bicyclic and polycyclic olefins include, without limitation, $C_2$-$C_{12}$ hydrocarbyl substituted norbornenes such as 5-butyl-2-norbornene, 5-hexyl-2-norbornene, 5-octyl-2-norbornene, 5-decyl-2-norbornene, 5-dodecyl-2-norbornene, 5-vinyl-2-norbornene, 5-ethylidene-2-norbornene, 5-isopropenyl-2-norbornene, 5-propenyl-2-norbornene, and 5-butenyl-2-norbornene, and the like.

Preferred cyclic olefins include $C_5$ to $C_{24}$ unsaturated hydrocarbons. Also preferred are $C_5$ to $C_{24}$ cyclic hydrocarbons that contain one or more (typically 2 to 12) heteroatoms such as O, N, S, or P. For example, crown ether cyclic olefins may include numerous O heteroatoms throughout the cycle, and these are within the scope of the invention. In addition, preferred cyclic olefins are $C_5$ to $C_{24}$ hydrocarbons that contain one or more (typically 2 or 3) olefins. For example, the cyclic olefin may be mono-, di-, or tri-unsaturated. Examples of cyclic olefins include without limitation cyclooctene, cyclododecene, and (c,t,t)-1,5,9-cyclododecatriene.

The cyclic olefins may also comprise multiple (typically 2 or 3) rings. For example, the cyclic olefin may be mono-, di-, or tri-cyclic. When the cyclic olefin comprises more than one ring, the rings may or may not be fused. Preferred examples of cyclic olefins that comprise multiple rings include norbornene, dicyclopentadiene, tricyclopentadiene, and 5-ethylidene-2-norbornene.

The cyclic olefin may also be substituted, for example, a $C_5$ to $C_{24}$ cyclic hydrocarbon wherein one or more (typically 2, 3, 4, or 5) of the hydrogens are replaced with non-hydrogen substituents. Suitable non-hydrogen substituents may be chosen from the substituents described hereinabove. For example, functionalized cyclic olefins, i.e., $C_5$ to $C_{24}$ cyclic hydrocarbons wherein one or more (typically 2, 3, 4, or 5) of the hydrogens are replaced with functional groups, are within the scope of the invention. Suitable functional groups may be chosen from the functional groups described hereinabove. For example, a cyclic olefin functionalized with an alcohol group may be used to prepare a telechelic polymer comprising pendent alcohol groups. Functional groups on the cyclic olefin may be protected in cases where the functional group interferes with the metathesis catalyst, and any of the protecting groups commonly used in the art may be employed. Acceptable protecting groups may be found, for example, in Greene et al., Protective Groups in Organic Synthesis, 3rd Ed. (New York: Wiley, 1999). Examples of functionalized cyclic olefins include without limitation 2-hydroxymethyl-5-norbornene, 2-[(2-hydroxyethyl)carboxylate]-5-norbornene, cydecanol, 5-n-hexyl-2-norbornene, 5-n-butyl-2-norbornene.

Cyclic olefins incorporating any combination of the above-mentioned features (i.e., heteroatoms, substituents, multiple olefins, multiple rings) are suitable for the methods disclosed herein. Additionally, cyclic olefins incorporating any combination of the abovementioned features (i.e., heteroatoms, substituents, multiple olefins, multiple rings) are suitable for the invention disclosed herein.

The cyclic olefins useful in the methods disclosed herein may be strained or unstrained. It will be appreciated that the amount of ring strain varies for each cyclic olefin compound, and depends upon a number of factors including the size of the ring, the presence and identity of substituents, and the presence of multiple rings. Ring strain is one factor in determining the reactivity of a molecule towards ring-opening olefin metathesis reactions. Highly strained cyclic olefins, such as certain bicyclic compounds, readily undergo ring opening reactions with olefin metathesis catalysts. Less strained cyclic olefins, such as certain unsubstituted hydrocarbon monocyclic olefins, are generally less reactive. In some cases, ring opening reactions of relatively unstrained (and therefore relatively unreactive) cyclic olefins may become possible when performed in the presence of the olefinic compounds disclosed herein. Additionally, cyclic olefins useful in the invention disclosed herein may be strained or unstrained.

A plurality of cyclic olefins may be used with the present invention to prepare metathesis polymers. For example, two cyclic olefins selected from the cyclic olefins described hereinabove may be employed in order to form metathesis products that incorporate both cyclic olefins. Where two or more cyclic olefins are used, one example of a second cyclic olefin is a cyclic alkenol, i.e., a $C_5$-$C_{24}$ cyclic hydrocarbon wherein at least one of the hydrogen substituents is replaced with an alcohol or protected alcohol moiety to yield a functionalized cyclic olefin.

The use of a plurality of cyclic olefins, and in particular when at least one of the cyclic olefins is functionalized, allows for further control over the positioning of functional groups within the products. For example, the density of cross-linking points can be controlled in polymers and macromonomers prepared using the methods disclosed herein. Control over the quantity and density of substituents and functional groups also allows for control over the physical properties (e.g., melting point, tensile strength, glass transition temperature, etc.) of the products. Control over these and other properties is possible for reactions using only a single cyclic olefin, but it will be appreciated that the use of a plurality of cyclic olefins further enhances the range of possible metathesis products and polymers formed.

More preferred cyclic olefins include dicyclopentadiene; tricyclopentadiene; dicyclohexadiene; norbornene; 5-methyl-2-norbornene; 5-ethyl-2-norbornene; 5-isobutyl-2-norbornene; 5,6-dimethyl-2-norbornene; 5-phenylnorbornene; 5-benzylnorbornene; 5-acetylnorbornene; 5-methoxycarbonylnorbornene; 5-ethoxycarbonyl-1-norbornene; 5-methyl-5-methoxy-carbonylnorbornene; 5-cyanonorbornene; 5,5,6-trimethyl-2-norbornene; cyclo-hexenylnorbornene; endo, exo-5,6-dimethoxynorbornene; endo, endo-5,6-dimethoxynorbornene; endo, exo-5-6-dimethoxycarbonylnorbornene; endo, endo-5,6-dimethoxycarbonylnorbornene; 2,3-dimethoxynorbornene; norbornadiene; tricycloundecene; tetracyclododecene; 8-methyltetracyclododecene; 8-ethyltetracyclododecene; 8-methoxycarbonyltetracyclododecene; 8-methyl-8-tetracyclo-dodecene; 8-cyanotetracyclododecene; pentacyclopentadecene; pentacyclohexadecene; higher order oligomers of cyclopentadiene such as cyclopentadiene tetramer, cyclopentadiene pentamer, and the like; and $C_2$-$C_{12}$ hydrocarbyl substituted norbornenes such as 5-butyl-2-norbornene; 5-hexyl-2-norbornene; 5-octyl-2-norbornene; 5-decyl-2-norbornene; 5-dodecyl-2-norbornene; 5-vinyl-2-norbornene; 5-ethylidene-2-norbornene; 5-isopropenyl-2-norbornene; 5-propenyl-2-norbornene; and 5-butenyl-2-norbornene, and the like. Even more preferred cyclic olefins include dicyclopentadiene, tricyclopentadiene, and higher order oligomers of cyclopentadiene, such as cyclopentadiene tetramer, cyclopentadiene pentamer, and the like, tetracyclododecene, norbornene, and $C_2$-$C_{12}$ hydrocarbyl substituted norbornenes, such as 5-butyl-2-norbornene, 5-hexyl-2-norbornene, 5-octyl-2-norbornene, 5-decyl-2-norbornene, 5-dodecyl-2-norbornene, 5-vinyl-2-norbornene, 5-ethylidene-2-norbornene, 5-isopropenyl-2-norbornene, 5-propenyl-2-norbornene, 5-butenyl-2-norbornene, and the like.

Tethered Polymer Arrays—Additional Comments on Polymer Brushes

To this point, the methods have been described in terms of growing product polymer(s), without regard for orientation or attachment of the resulting polymers. While various embodiments do provide that the methods may be used to form loose, unattached, or "free-standing" polymers, the methods also may be used to grow polymers which are tethered or attached to a substrate surface, either through single points or attachment at one end, or through multiple "engagement points" along the length of the polymer; i.e., where the polymer is bound to a substrate surface. In either case, the resulting polymers may be attached to the substrate surface by covalent bonding, hydrogen bonding, ionic bonding, physisorption, pi-pi interaction, Van der Waals forces, or a combination thereof.

Attachment to the substrate will generally, although not necessarily, be covalent, and the covalent linkage may be direct or indirect. Indirect covalent linkages are typically, though not necessarily, through a functional group on a substrate surface. Ionic attachments are also suitable, including combinations of one or more anionic groups coupled with substrates containing cationic groups, or combinations of one or more cationic groups coupled with substrates containing anionic groups.

In certain embodiments, it is also possible to use a substrate that has been treated to include functional groups, inert moieties, and/or excess ligands. Any of the functional groups described therein are suitable for incorporation on the substrate, and may be generally accomplished through techniques known in the art. Inert moieties may also be incorporated on the substrate to generally reduce the available attachment sites on the substrate, e.g., in order to control the placement, or amount, of a complex linked to the substrates.

In certain embodiments, these tethers may be, and are preferably, through self-assembled monolayer molecules. As used herein, a self-assembled monolayer molecule is to refer to a molecule that has one or more chemical groups which attach to a surface strongly, wherein a portion of the molecule may bind to one or more neighboring self-assembled monolayer molecules in a monolayer film, or self-assembled monolayer (SAM). Within the SAM, individually small, but cumulative large, forces drive the SAM molecules into a self-assembly process, forming a molecular coating with precise and reproducible physical properties. In essence, each SAM molecule is bound to the surface, and/or to the film of neighboring molecules. The utility of SAMs is evident from their name: the monolayer is spontaneously formed by virtue of the chemical structure of its constituent molecules.

A monolayer film in the context of the present invention, is defined herein to refer to a layer that is the thickness of one SAM molecule that is attached to a surface.

The chemical group which attaches to a surface strongly can be any chemical group known to those of ordinary skill in the art which is able to attach to a surface. The attachment can be covalent (such as SAMS based on ionic or polar chemical functional groups such as, but not limited to, phosphonates, phosphates, carboxylates, or their corresponding acids). The surface can be composed of any agent or combination of agents, so long as the SAM molecule is able to attach to the surface. Exemplary chemical groups for attachment to a surface include the following: a thiol, a disulfide, a dithioic acid, a dithiocarbamate, a silane, a chlorosilane, a dichlorosilane, a trichlorosilane, an alkoxysilane, a dialkoxysilane, a trialkoxysilane, a methyldichlorosilane, a dimethyl chlorosilane, other silane derivatives, a hydroxyamic acid, a phosphate, a phosphonate, a phosphonic acid, a carboxylic acid, a hydroxamic acid, an alcohol, an amine, a sulfate, a sulfonate, and a sulfinate. One of ordinary skill in the art would be familiar with these and other chemical groups that are able to form an attachment to the surface.

In the context of the present invention, the SAM molecule includes one or more additional chemical groups, particularly an alkene (e.g. olefin) that is able to attach to a catalyst, particularly a Group 8 olefin metathesis catalyst as defined herein, where the attachment between the alkene (e.g. olefin) and the Group 8 olefin metathesis catalyst is formed through an olefin metathesis reaction, particularly an olefin cross-metathesis reaction.

The remainder of the SAM molecule can be of any structure, so long as the SAM molecule is able to attach to a surface, and such that the remaining structure of the SAM molecule can promote an association between one or more other SAM molecules. For example, the SAM molecule may be comprised of any number of carbon atoms and any functional groups.

Exemplary self-assembled monolayer (SAM) molecules include, but are not limited to, molecules that include three parts—a middle portion a first end portion and a second end portion (each end portion covalently attend to each end of the middle portion). The middle portion, for example, may be comprised of a carbon chain backbone structure of from one to thirty-nine or more carbon atoms.

The SAM molecule may include either a branched or unbranched hydrocarbon chain, and may include any combination of single bonds in the carbon chain backbone. Further, the hydrocarbon chain may comprise a cyclic hydrocarbon group (e.g. pentanyl, hexanyl). The carbon chain backbone may be substituted or unsubstituted, wherein any one or more substituents may comprise one or more atoms (e.g. C, H, O, N, P, S, halogen) with such substituents being known to those of skill in the art. Any substitution that does not substantially alter the ability of the SAM molecule to form a SAM is contemplated. Non-limiting examples of such substituents include hydrogen, halogen, oxo (e.g. hydroxyl, alkoxy, ester), cycloalkyl, carbonyl, acyl (including for example, formyl, acetyl, propionyl, and the like), aryl, cyano, azido, amido, aminocarbonyl, amino, —NH-alkyl, —N(alkyl)$_2$, —NH-cycloalkyl, —N(cycloalkyl)$_2$, —NH-aryl, —N(aryl)$_2$, trialkylsilyloxy, acylamino, bis-acylamino, sulfo (e.g. thioether, thioester, sulfonamide, sulfonyl, silyloxy, or any combination of one or more of these groups.

Exemplary first end portion groups include those selected from amine, alcohol, carboxylic acid, phosphate, phosphonate, thiol, dithioic acid, carbamodithioic acid, phosphonic acid, carboxamide, N-hydroxycarboxamide, isocyanate, silane, methyldichlorosilane, trichlorosilane, chlorodimethylsilane, triethoxysilane, trimethoxysilane, bromide, chloride, and iodide. Exemplary second end portion groups include any carbon-carbon double bond or alkene (e.g. terminal olefin, internal olefin, cyclic olefin, etc.). When tethered to a surface, the inventive polymer brushes are so tethered through use of phosphonate or phosphonic acid linkages.

By virtue of their ability to provide pure monolayers on a range of surfaces, a preferred SAM molecule is an olefin phosphonate or phosphonic acid SAM molecule of the general formula (G):

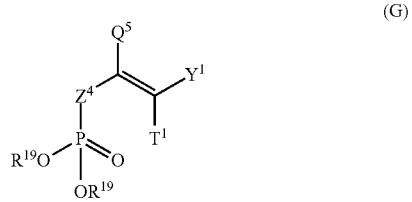
(G)

wherein P is phosphorus, O is oxygen, C is carbon; $R^{19}$ is hydrogen, substituted or unsubstituted alkyl, substituted or unsubstituted aryl; $Z^4$ is substituted or unsubstituted alkyl, substituted or unsubstituted heteroalkyl, substituted or unsubstituted alkylene, substituted or unsubstituted alkoxy, substituted or unsubstituted aryl, substituted or unsubstituted cycloalkyl; $Q^5$, $Y^1$, and $T^1$ are independently selected from hydrogen, substituted or unsubstituted alkyl, substituted or unsubstituted heteroalkyl, substituted or unsubstituted alkylene, substituted or unsubstituted alkoxy, substituted or unsubstituted aryl, substituted or unsubstituted cycloalkyl; and Q5 and T1 may be linked to form a cyclic group.

Olefin terminated SAM molecules of the present invention may be utilized alone or in combination with other SAM molecules. For example, combinations of olefin terminated phosphonate or phosphonic acid SAM molecules of the present invention combined with other SAM molecules, such as alkyl phosphonic acids, may be utilized to prepare mixed self-assembled monolayers. An example of a mixed self-assembled monolayer is shown below in Scheme 3.

SCHEME 3

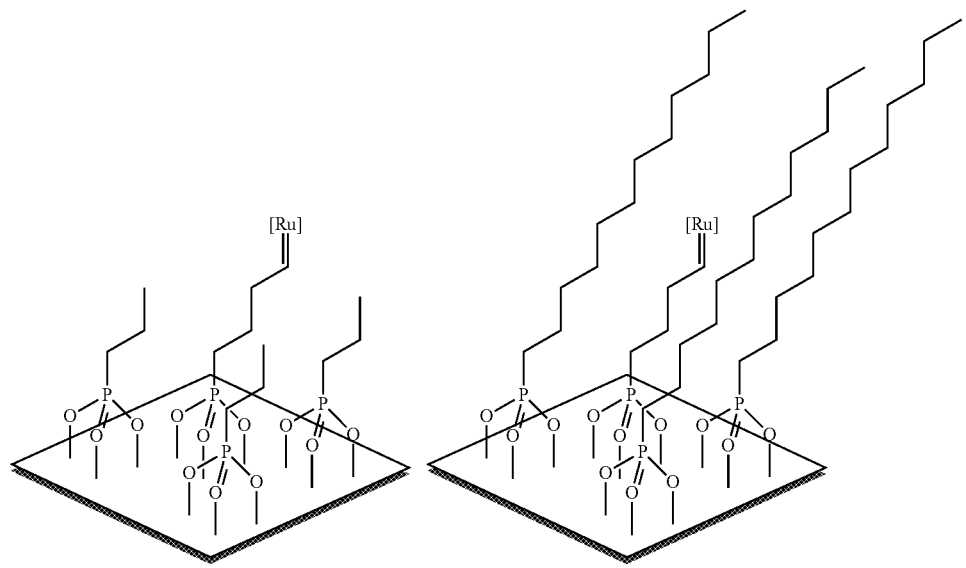

These points of attachments may be via linkages comprising functional groups such as amino, carbene, carboxylate, catecholate, a dissulfide, a dithiocarbamate, dithioic acid, hydroxy, hydroxamic acid, hydroxyamic acid, isocyanato, nitrite, phosphate, phosphonate, phosphonic acid, an optionally halogenated, alkylated, or alkoxylated silane or silicate, sulfate, sulfinate, sulfonate, or thiol groups. One of ordinary skill in the art would be familiar with these and other chemical groups that are able to form an attachment to the surface.

As described above, in describing such polymers which are tethered or attached to a substrate surface at one end, it is useful to describe an individual polymer as having proximal and distal ends, in which the proximal end(s) is/are those ends closest or tethered to the surface, and the distal end(s) is/are those ends of the polymers which stand away from the substrate surface. While not intending to be bound by the correctness or incorrectness of any particular theory, it may be useful to view the growth of such a polymer, tethered at its proximal end to the substrate surface, as resulting from a metathesis reaction in which the metathesis catalyst remains bonded to and reacts with gaseous or vapor precursor at the "living," distal end of the polymer, for example by a carbene linkage. As the methods proceed, the polymer product grows, either individually or as a plurality of individual polymer strands via the associated metathesis reactions, so as to extend away from the surface.

Such a tethered structure may be formed, for example, by pre-reacting a second, end-functionalized olefinic or acetylenic precursor with a surface, under conditions sufficient to attach the end-functionalized olefinic or acetylenic precursor to the surface. The term "second, end-functionalized" is intended to connote that this precursor may be the same or different from the feedstock precursor used in the metathesis reaction(s), in terms of the nature of the unsaturated moiety, and that it contains a functional group (as described above) useful for bonding to the substrate. Once in place, for example as a monolayer on the substrate, the second, end-functionalized precursor is modified to incorporate the catalyst complex. This may be accomplished by reacting the second, end-functionalized precursor, now tethered, with a suitable metathesis catalyst, with or without solvent, to form the necessary initiator for the subsequent metathesis reaction(s). Note that if solvent is used during the generation of this initiator, it may remain, be replaced, or be removed—by vacuum, heat, or both—prior to operating the inventive methods. Once the metathesis catalyst is tethered to the surface, via the second, end-functionalized precursor, the feedstock is introduced to initiate the polymerization of a linear chain with the catalyst at the terminus. The growing polymer chain terminates at a double bonded between a carbon and a metal center of the catalyst. Accordingly, the catalyst remains at the terminal, distal end of the growing polymer chain and the growth occurs by adding additional feedstock precursors to the terminal, distal end of the polymer chain.

Figure 1B:
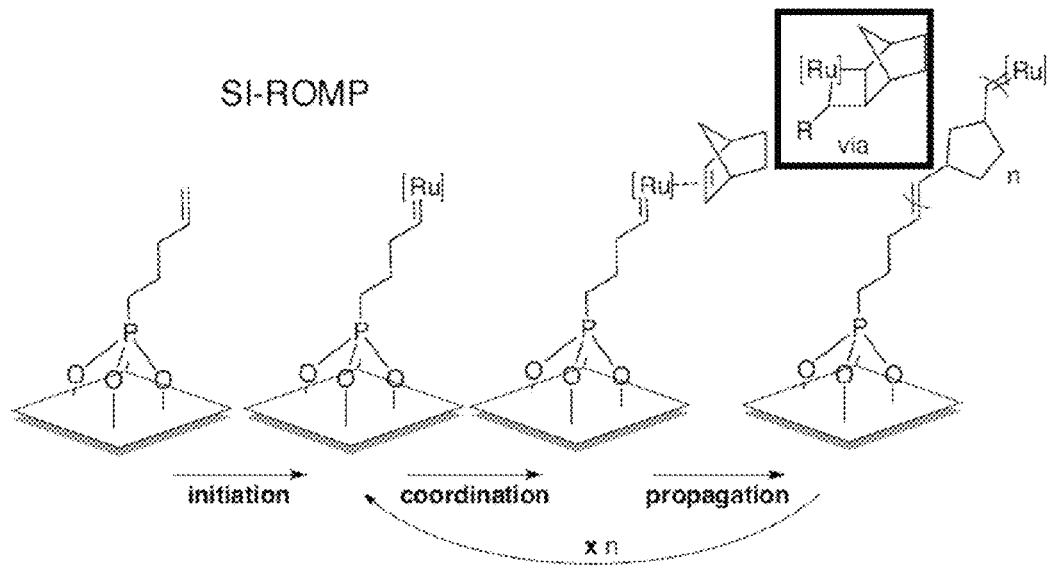

These concepts are illustrated in FIG. 1.

Another way of generating this initiator self-assembled monolayer (SAM) is to use a metathesis catalyst, which already contains the functional group necessary for attachment to the surface. In such embodiments, the catalyst may be deposited from a solution. In those embodiments where the conditions associated with the direct vapor/solid phase or direct gas/solid phase polymerization is employed, the solvent may be removed. In other embodiments, the solvent may remain or be replaced before addition of the unsaturated organic feedstock.

The terms "surface," "substrate" and "substrate material" as used herein, are intended to generally mean any material from which the tethered polymers grow, or where the SAMs or catalytic initiators are contacted with, applied to, or bonded to. These terms may be viewed in terms of planar or substantially planar (e.g., curved or undulating) surfaces, but also include particulate (e.g., spherical or oblate) or elongated surfaces (e.g., cylindrically shaped tubes or fibers), having at least one dimension in the nanometer range (e.g., in a range from about 1 nm to about 1000 nm), micron range (e.g., in a range from about 1 micron to about 1000 micron), or larger (e.g., in a range from about 1 cm and above), or a combination thereof. Such surfaces may also be a superficial, topmost, outer, or external aspect of an object, for example a device. Substrates may be of synthetic, semi-synthetic, or naturally occurring materials, which may be organic or inorganic, e.g., polymeric, ceramic, or metallic. Without limitation, such materials include metals, metal oxides, polymers, glass, ceramics, filaments, fibers, rovings, mats, weaves, fabrics, knitted material, cloth or other known structures, glass fibers and fabrics, carbon fibers and fabrics, aramid fibers and fabrics, polyolefin or other polymer fibers or fabrics, any material possessing a surface containing hydroxyl functional groups, silicas, silicates, aluminas, aluminum oxides, silica-aluminas, aluminosilicates, zeolites, titanias, titanium dioxide, magnetite, magnesium oxides, boron oxides, clays, zirconias, zirconium dioxide, carbon, titanium oxides, silicon oxides, iron oxides, indium tin oxide (ITO), gallium arsenide oxides, copper oxides, zirconium oxides, zinc oxides, yttrium oxides, cellulose, cellulosic polymers amylose, amylosic polymers, or a combination thereof. Other suitable substrate materials include metallic density modulators, microparticulate density modulators, such as microspheres, and macroparticulate density modulators, such as glass or ceramic beads.

In those embodiments where the polymer product is "grown" from a surface, or the polymer brush is described as tethered to a surface, the surface may comprise a synthetic, semi-synthetic, or naturally occurring materials, which may be organic or inorganic, e.g., polymeric, ceramic, or metallic. Without limitation, such materials include metals, metal oxides, polymers, glass, ceramics, filaments, fibers, rovings, mats, weaves, fabrics, knitted material, cloth or other known structures, glass fibers and fabrics, carbon fibers and fabrics, aramid fibers and fabrics, polyolefin or other polymer fibers or fabrics, any material possessing a surface containing hydroxyl functional groups, silicas, silicates, aluminas, aluminum oxides, silica-aluminas, aluminosilicates, zeolites, titanias, titanium dioxide, magnetite, magnesium oxides, boron oxides, clays, zirconias, zirconium dioxide, carbon, titanium oxides, silicon oxides, iron oxides, indium tin oxide (ITO), fluorine tin oxide (FTO), gallium arsenide oxides, copper oxides, zirconium oxides, zinc oxides, yttrium oxides, cellulose, cellulosic polymers amylose, amylosic polymers, or a combination thereof. Preferred exemplary, non-limiting surfaces include those comprising Au, Ag, Cu, Pd, Pt, GaAs, oxides of Al, Cu, Fe, Si, Ti, Y, Zn, Zr, or mixed oxides such as silicate glasses, indium-tin-oxide (ITO), or fluorine tin oxide (FTO).

It should be apparent that the combination of substrates and potential polymer compositions described herein can yield any combination of conducting/semiconducting surface and conducting/semiconducting polymer. Where appropriate, it is preferred that the tethering moiety is either non-insulative or can allow electron hopping. It should also be apparent that the initiator moieties may be patterned on the relevant surface, for example, by use of photomasking technology, by selective deposition of the catalyst, or both.

One of the many attractive features of the methods described herein is the ability of these methods to provide patterned arrays of oriented polymer strands or arrays. The active or final polymer chains may be aligned with one another or, depending on the length of the polymer strands, may form disarrayed mats. When aligned, for example in polymer brush structures, each active polymer extends away from the surface. In certain embodiments, the individual polymer strands may be described as substantially parallel to one another. Assuming the polymer chains are substantially linear, this measure of alignment can be described in terms imaginary end-to-end vector which can be envisioned to extend between the proximal and distal ends of the individual polymer chains. Alignment is achieved when these lines are parallel or substantially parallel to one another. For instance, each line can have an angle relative to the surface ($\theta_x$), and the average of the individual lines can be used to define an average angle between each line and the first surface ($\theta_{,avg}$). The alignment of the polymers can be described, using these terms, by the portion of the individual polymers (e.g., more than 50%, 75%, or even 90%) whose angle relative to the surface ($\theta_x$) that is within some measure (e.g., +/−40°, 20°, 10°, or 5°) of the angle ($\theta_{,avg}$). Additionally or alternately, the angle ($\theta_{,avg}$) itself can be used to describe the orientation of the polymer array with respect to the surface. The term "substantially parallel" refers to a condition where the angles of the individual polymer strands are collectively ±20° of angle, $\theta_{,avg}$. In other embodiments, the polymer arrays are normal to the surface of the substrate, where normal is defined as when $\theta_{,avg}$ is within ±20° of 90°. The methods described in this disclosure are especially useful because the 2-dimensional confinement of the catalysts enables the alignment of polymers to these levels. This is especially attractive for those polymers having properties useful for optical or electronic devices, when tethered to one or more electrode surfaces.

In certain exemplary embodiments, the polymers of the polymer brush are tethered to a surface and the polymers extend substantially perpendicular from that surface—that is, the polymers are substantially aligned with (e.g., with 10° of) a hypothetical perpendicular projection from that surface. In other embodiments, the individual polymers are substantially aligned within 10°, 20°, 30°, 40°, or 50° of that hypothetical perpendicular projection.

Methods of making these polymer brush structures, including those described herein, allow flexibility in the structures of these polymer brushes. In certain embodiments, for example, the polymer brush structures have thicknesses (in the longitudinal z-direction) in a range of from about 20 nm to about 50 microns, preferably in a range of from about 100 nm to about 5 microns. In other independent embodiments, the thickness is in a range bounded at the lower end by a value of about 20 nm, about 50 nm, about 100 nm, or about 200 nm, and bounded at the upper end of the range by a value of about 50 microns, about 10 microns, about 5 microns, about 1 micron, about 500 nm, or about 200 nm. It is possible to provide polymer brushes having thicknesses outside these ranges, but it is difficult to measure birefringence reliability using ellipsometry on structures having thicknesses much below 20 nm.

These polymer brush structure may also be characterized by the lateral density of the polymers (i.e., in the x-y direction relative to the longitudinal z-direction). The use of self-assembled monolayers allows the first anchoring groups to be densely packed on the optionally patterned surface. Growing the polymer chains on densely packed first anchoring groups keeps the polymer chains densely packed. Similarly, growing the polymer chains on loosely packed first anchoring groups provides that the polymer chains loosely packed. In certain embodiments, this lateral polymer density is in a range of from about 0.001 nanomole/cm$^2$ to about 1.5 nanomole/cm$^2$, preferably in a range of from about 0.01 nanomole/cm$^2$ to about 1 nanomole/cm$^2$ or from about 0.1 or about 0.5 nanomole/cm$^2$ to about 1 nanomole/cm$^2$. These lateral densities may be measured, for example, by Quartz Crystal Micrography, QCM, for those polymer brushes tethered to a quartz substrate. The skilled artisan would understand how to accomplish these measurements.

Additionally, the consistency in the rate at which each chain grows effectively causes the polymer chains to be formed one layer at a time. The combination of the dense packing and forming the polymer chains in layers causes the pattern in which the first anchoring groups 16 are arranged on the surface to be retained through the polymer chains as discussed above.

Performing direct gas/solid phase polymerization reactions may provide even further alignment of the polymer chains. For instance, the rate of diffusion of the catalyst in is significantly lower at a vapor/solid interface (even where localized condensation of the feedstock precursor result in a localized liquid/solid interface) than in solution. Diffusion is even lower at a direct gas/solid phase interface (where such localized condensation of the feedstock precursor is much less likely, if not impossible). This reduced rate of diffusion reduces the opportunity for the polymer chains to change directions during growth. As a result, performing the ring-opening metathesis polymerizations using a direct gas/solid phase interface can further enhance of the alignment of the polymer chains.

Transition Metal-Based Metathesis Catalysts

Transition metal-based metathesis catalysts suitable for use in alkene or alkyne metathesis chemistry include those alkylidene or alkylidyne complexes (or precursors which may generated organometallic alkylidene or alkylidyne complexes) comprising Mo, Pd, Ru, Ta, Ti, or W. Non-limiting examples include systems based on structures such as:

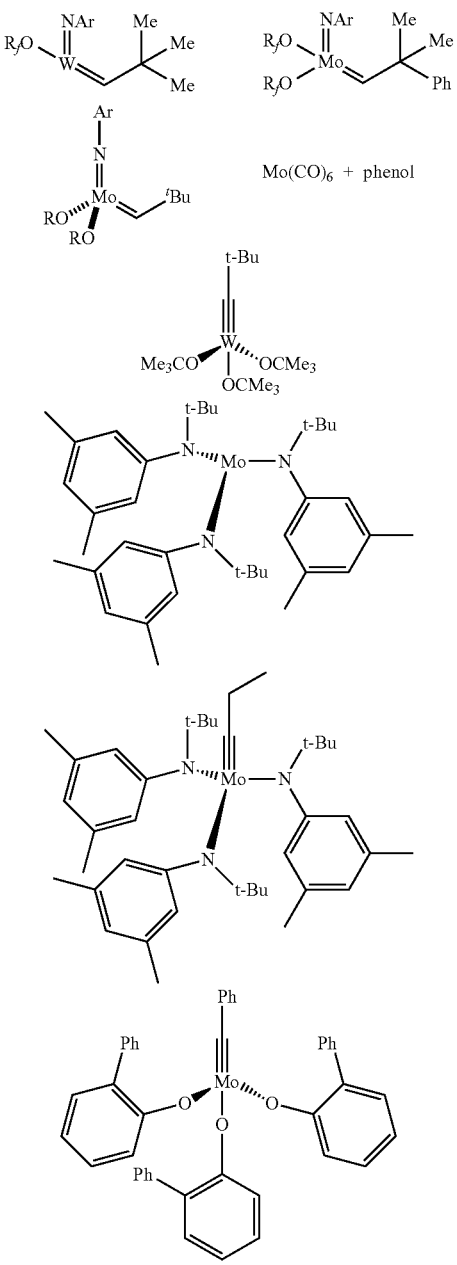

While such catalyst systems are known in solvent based metatheses contexts, to the inventors' knowledge, none of these have been applied to direct vapor solid phase or direct gas/solid phase reactions, nor are they known to be useful in this context. Yet these, and derivatives thereof, may be suitable for use in the reactions described herein.

Organometallic complexes based on Group 8 metals, especially osmium and ruthenium, especially those of ruthenium containing N-heterocyclic carbene ligands, are especially useful in the embodiments described herein. In particular, the various generations of complexes known as Grubbs' catalyst, are preferred. These catalysts have been described, inter alia, in U.S. Pat. Nos. 5,312,940; 5,342,909; 5,750,815; 5,831,108; 5,917,071; 5,969,170; 5,977,393; 6,048,993; 6,111,121; 6,153,778; 6,211,391; 6,284,852; 6,313,332; 6,426,419; 6,486,279; 6,504,041; 6,515,084; 6,624,265; 6,759,537; 6,806,325; 6,818,586; 7,102,047; 7,288,666; 7,329,758; and 7,750,172 and U.S. Patent Application Publ. Nos. 2001/0039360; 2002/0013473; 2002/0022733; 2002/0055598; 2002/0177710; 2003/0069374; 2003/0181609; 2005/0113590; 2006/0241317; 2009/0012248; 2009/0012254; and 2011/0124868, each of which is incorporated by reference for its teaching of catalyst and catalyst precursor structure. The term "Grubbs-type catalyst" is intended to embrace one or more of the structures described below (including First and Second Generation Grubbs-Type catalysts and Grubbs-Hoveyda catalysts), and the term "Grubbs-type ruthenium catalysts" likewise connotes those Grubbs-type catalyst structures where M is Ru.

In certain embodiments of the present invention, the transition metal-based metathesis catalyst complex is preferably a Group 8 transition metal complex having the structure of formula (I)

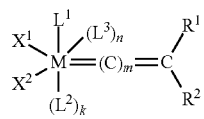

in which:
M is a Group 8 transition metal;
$L^1$, $L^2$, and $L^3$ are neutral electron donor ligands;
n is 0 or 1, such that $L^3$ may or may not be present;
m is 0, 1, or 2;
k is 0 or 1;
$X^1$ and $X^2$ are anionic ligands; and
$R^1$ and $R^2$ are independently selected from hydrogen, hydrocarbyl, substituted hydrocarbyl, heteroatom-containing hydrocarbyl, substituted heteroatom-containing hydrocarbyl, and functional groups,
wherein any two or more of $X^1$, $X^2$, $L^1$, $L^2$, $L^3$, $R^1$, and $R^2$ can be taken together to form one or more cyclic groups.

Additionally, in formula (I), one or both of $R^1$ and $R^2$ may have the structure $-(W)_n-U^+V^-$, in which W is selected from hydrocarbylene, substituted hydrocarbylene, heteroatom-containing hydrocarbylene, or substituted heteroatom-containing hydrocarbylene; U is a positively charged Group 15 or Group 16 element substituted with hydrogen, hydrocarbyl, substituted hydrocarbyl, heteroatom-containing hydrocarbyl, or substituted heteroatom-containing hydrocarbyl; V is a negatively charged counterion; and n is zero or 1. Furthermore, $R^1$ and $R^2$ may be taken together to form an indenylidene moiety.

Preferred catalysts contain Ru or Os as the Group 8 transition metal, with Ru particularly preferred.

Numerous embodiments of the catalysts useful in the reactions disclosed herein are described in more detail infra. For the sake of convenience, the catalysts are described in groups, but it should be emphasized that these groups are not meant to be limiting in any way. That is, any of the catalysts useful in the invention may fit the description of more than one of the groups described herein.

A first group of catalysts, then, are commonly referred to as First Generation Grubbs-type catalysts, and have the structure of formula (I). For the first group of catalysts, M is a Group 8 transition metal, m is 0, 1, or 2, and n, $X^1$, $X^2$, $L^1$, $L^2$, $L^3$, $R^1$, and $R^2$ are described as follows. For the first group of catalysts, n is 0, and $L^1$ and $L^2$ are independently selected from phosphine, sulfonated phosphine, phosphite, phosphinite, phosphonite, arsine, stilbine, ether, (including cyclic ethers), amine, amide, imine, sulfoxide, carboxyl, nitrosyl, pyridine, substituted pyridine, imidazole, substituted imidazole, pyrazine, substituted pyrazine and thioether. Exemplary ligands are trisubstituted phosphines. Preferred trisubstituted phosphines are of the formula $PR^{H1}R^{H2}R^{H3}$, x where $R^{H1}$, $R^{H2}$, and $R^{H3}$ are each independently substituted or unsubstituted aryl or $C_1$-$C_{10}$ alkyl, particularly primary alkyl, secondary alkyl, or cycloalkyl. In the most preferred, $L^1$ and $L^2$ are independently selected from the group consisting of trimethylphosphine ($PMe_3$), triethylphosphine ($PEt_3$), tri-n-butylphosphine ($PBu_3$), tri(ortho-tolyl)phosphine (P-o-tolyl$_3$), tri-tert-butylphosphine (P-tert-Bu$_3$), tricyclopentylphosphine (PCyclopentyl$_3$), tricyclohexylphosphine ($PCy_3$), triisopropylphosphine (P-i-Pr$_3$), trioctylphosphine ($POct_3$), triisobutylphosphine, (P-i-Bu$_3$), triphenylphosphine ($PPh_3$), tri(pentafluorophenyl)phosphine ($P(C_6F_5)_3$), methyldiphenylphosphine ($PMePh_2$), dimethylphenylphosphine ($PMe_2Ph$), and diethylphenylphosphine ($PEt_2Ph$). Alternatively, $L^1$ and $L^2$ may be independently selected from phosphabicycloalkane (e.g. monosubstituted 9-phosphabicyclo-[3.3.1]-nonane, or monosubstituted 9-phosphabicyclo [4.2.1]nonane] such as cyclohexylphoban, isopropylphoban, ethylphoban, methylphoban, butylphoban, pentylphoban and the like).

$X^1$ and $X^2$ are anionic ligands, and may be the same or different, or are linked together to form a cyclic group, typically although not necessarily a five- to eight-membered ring. In preferred embodiments, $X^1$ and $X^2$ are each independently hydrogen, halide, or one of the following groups: $C_1$-$C_{20}$ alkyl, $C_5$-$C_{24}$ aryl, $C_1$-$C_{20}$ alkoxy, $C_5$-$C_{24}$ aryloxy, $C_2$-$C_{20}$ alkoxycarbonyl, $C_6$-$C_{24}$ aryloxycarbonyl, $C_2$-$C_{24}$ acyl, $C_2$-$C_{24}$ acyloxy, $C_1$-$C_{20}$ alkylsulfonato, $C_5$-$C_{24}$ arylsulfonato, $C_1$-$C_{20}$ alkylsulfanyl, $C_5$-$C_{24}$ arylsulfanyl, $C_1$-$C_{20}$ alkylsulfinyl, $NO_3$, $-N=C=O$, $-N=C=S$, or $C_5$-$C_{24}$ arylsulfinyl. Optionally, $X^1$ and $X^2$ may be substituted with one or more moieties selected from $C_1$-$C_{12}$ alkyl, $C_1$-$C_{12}$ alkoxy, $C_5$-$C_{24}$ aryl, and halide, which may, in turn, with the exception of halide, be further substituted with one or more groups selected from halide, $C_1$-$C_6$ alkyl, $C_1$-$C_6$ alkoxy, and phenyl. In more preferred embodiments, $X^1$ and $X^2$ are halide, benzoate, $C_2$-$C_6$ acyl, $C_2$-$C_6$ alkoxycarbonyl, $C_1$-$C_6$ alkyl, phenoxy, $C_1$-$C_6$ alkoxy, $C_1$-$C_6$ alkylsulfanyl, aryl, or $C_1$-$C_6$ alkylsulfonyl. In even more preferred embodiments, $X^1$ and $X^2$ are each halide, $CF_3CO_2$, $CH_3CO_2$, $CFH_2CO_2$, $(CH_3)_3CO$, $(CF_3)_2(CH_3)CO$, $(CF_3)(CH_3)_2CO$, PhO, MeO, EtO, tosylate, mesylate, or trifluoromethane-sulfonate. In the most preferred embodiments, $X^1$ and $X^2$ are each chloride.

$R^1$ and $R^2$ are independently selected from hydrogen, hydrocarbyl (e.g., $C_1$-$C_{20}$ alkyl, $C_2$-$C_{20}$ alkenyl, $C_2$-$C_{20}$ alkynyl, $C_5$-$C_{24}$ aryl, $C_6$-$C_{24}$ alkaryl, $C_6$-$C_{24}$ aralkyl, etc.), substituted hydrocarbyl (e.g., substituted $C_1$-$C_{20}$ alkyl, $C_2$-$C_{20}$ alkenyl, $C_2$-$C_{20}$ alkynyl, $C_5$-$C_{24}$ aryl, $C_6$-$C_{24}$ alkaryl, $C_6$-$C_{24}$ aralkyl, etc.), heteroatom-containing hydrocarbyl (e.g., heteroatom-containing $C_1$-$C_{20}$ alkyl, $C_2$-$C_{20}$ alkenyl, $C_2$-$C_{20}$ alkynyl, $C_5$-$C_{24}$ aryl, $C_6$-$C_{24}$ alkaryl, $C_6$-$C_{24}$ aralkyl, etc.), and substituted heteroatom-containing hydrocarbyl (e.g., substituted heteroatom-containing $C_1$-$C_{20}$ alkyl, $C_2$-$C_{20}$ alkenyl, $C_2$-$C_{20}$ alkynyl, $C_5$-$C_{24}$ aryl, $C_6$-$C_{24}$ alkaryl, $C_6$-$C_{24}$ aralkyl, etc.), and functional groups. $R^1$ and $R^2$ may also be linked to form a cyclic group, which may be aliphatic or aromatic, and may contain substituents, heteroatoms, or both. Generally, such a cyclic group will contain 4 to 12, preferably 5, 6, 7, or 8 ring atoms.

In preferred catalysts, $R^1$ is hydrogen and $R^2$ is selected from $C_1$-$C_{20}$ alkyl, $C_2$-$C_{20}$ alkenyl, and $C_5$-$C_{24}$ aryl, more preferably $C_1$-$C_6$ alkyl, $C_2$-$C_6$ alkenyl, and $C_5$-$C_{14}$ aryl. Still more preferably, $R^2$ is phenyl, vinyl, methyl, isopropyl, or t-butyl, optionally substituted with one or more moieties selected from $C_1$-$C_6$ alkyl, $C_1$-$C_6$ alkoxy, phenyl, and a functional group Fn as defined earlier herein. Most preferably, $R^2$ is phenyl or vinyl substituted with one or more moieties selected from methyl, ethyl, chloro, bromo, iodo, fluoro, nitro, dimethylamino, methyl, methoxy, and phenyl. Optimally, $R^2$ is phenyl or —CH=C(CH$_3$)$_2$.

Any two or more (typically two, three, or four) of $X^1$, $X^2$, $L^1$, $L^2$, $L^3$, $R^1$, and $R^2$ can be taken together to form a cyclic group, including bidentate or multidentate ligands, as disclosed, for example, in U.S. Pat. No. 5,312,940, the disclosure of which is incorporated herein by reference. When any of $X^1$, $X^2$, $L^1$, $L^2$, $L^3$, $R^1$, and $R^2$ are linked to form cyclic groups, those cyclic groups may contain 4 to 12, preferably 4, 5, 6, 7 or 8 atoms, or may comprise two or three of such rings, which may be either fused or linked. The cyclic groups may be aliphatic or aromatic, and may be heteroatom-containing or substituted. The cyclic group may, in some cases, form a bidentate ligand or a tridentate ligand. Examples of bidentate ligands include, but are not limited to, bisphosphines, dialkoxides, alkyldiketonates, and aryldiketonates.

A second group of catalysts, commonly referred to as Second Generation Grubbs-type catalysts, have the structure of formula (I), wherein $L^1$ is a carbene ligand having the structure of formula (II)

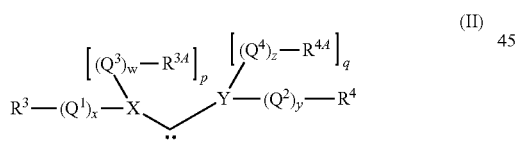
(II)

such that the complex may have the structure of formula (III)

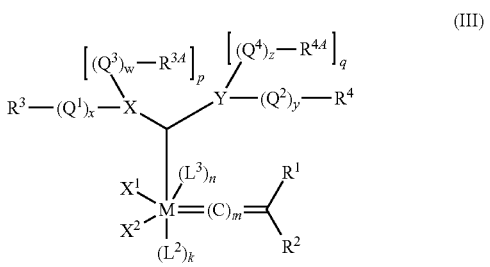
(III)

wherein M, m, n, $X^1$, $X^2$, $L^2$, $L^3$, $R^1$, and $R^2$ are as defined for the first group of catalysts, and the remaining substituents are as follows;

X and Y are heteroatoms typically selected from N, O, S, and P. Since O and S are divalent, p is necessarily zero when X is O or S, q is necessarily zero when Y is O or S, and k is zero or 1. However, when X is N or P, then p is 1, and when Y is N or P, then q is 1. In a preferred embodiment, both X and Y are N;

$Q^1$, $Q^2$, $Q^3$, and $Q^4$ are linkers, e.g., hydrocarbylene (including substituted hydrocarbylene, heteroatom-containing hydrocarbylene, and substituted heteroatom-containing hydrocarbylene, such as substituted, heteroatom-containing alkylene, or both) or —(CO)—, and w, x, y, and z are independently zero or 1, meaning that each linker is optional. Preferably, w, x, y, and z are all zero. Further, two or more substituents on adjacent atoms within $Q^1$, $Q^2$, $Q^3$, and $Q^4$ may be linked to form an additional cyclic group; and $R^3$, $R^{3A}$, $R^4$, and $R^{4A}$ are independently selected from hydrogen, hydrocarbyl, substituted hydrocarbyl, heteroatom-containing hydrocarbyl, and substituted heteroatom-containing hydrocarbyl. In addition, X and Y may be independently selected from carbon and one of the heteroatoms mentioned above. Also, $L^2$ and $L^3$ may be taken together to form a single bindentate electron-donating heterocyclic ligand. Furthermore, $R^1$ and $R^2$ may be taken together to form an indenylidene moiety. Moreover, $X^1$, $X^2$, $L^2$, $L^3$, X and Y may be further coordinated to boron or to a carboxylate.

In addition, any two or more of $X^1$, $X^2$, $L^1$, $L^2$, $L^3$, $R^1$, $R^2$, $R^3$, $R^{3A}$, $R^4$, $R^{4A}$, $Q^1$, $Q^2$, $Q^3$, and $Q^4$ can be taken together to form a cyclic group. Any two or more of $X^1$, $X^2$, $L^1$, $L^2$, $L^3$, $R^1$, $R^2$, $R^3$, $R^{3A}$, $R^4$, and $R^{4A}$ can also be taken to be -A-Fn, wherein "A" is a divalent hydrocarbon moiety selected from alkylene and arylalkylene, wherein the alkyl portion of the alkylene and arylalkylene groups can be linear or branched, saturated or unsaturated, cyclic or acyclic, and substituted or unsubstituted, wherein the aryl portion of the of arylalkylene can be substituted or unsubstituted, and wherein hetero atoms and functional groups may be present in either the aryl or the alkyl portions of the alkylene and arylalkylene groups, and Fn is a functional group, or together to form a cyclic group.

Preferably, $R^{3A}$ and $R^{4A}$ are linked to form a cyclic group so that the carbene ligand has the structure of formula (IV)

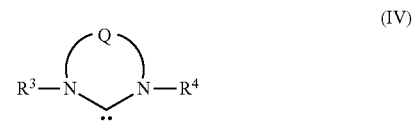
(IV)

wherein $R^3$ and $R^4$ are as defined for the second group of catalysts above, with preferably at least one of $R^3$ and $R^4$, and more preferably both $R^3$ and $R^4$, being alicyclic or aromatic of one to about five rings, and optionally containing one or more heteroatoms, or substituents, or both. Q is a linker, typically a hydrocarbylene linker, including substituted hydrocarbylene, heteroatom-containing hydrocarbylene, and substituted heteroatom-containing hydrocarbylene linkers, wherein two or more substituents on adjacent atoms within Q may also be linked to form an additional cyclic structure, which may be similarly substituted to provide a fused polycyclic structure of two to about five cyclic groups. Q is often, although not necessarily, a two-atom linkage or a three-atom linkage.

Examples of N-heterocyclic carbene (NHC) ligands and acyclic diaminocarbene ligands suitable as $L^1$ thus include, but are not limited to, the following where DIPP or DiPP is diisopropylphenyl and Mes is 2,4,6-trimethylphenyl:

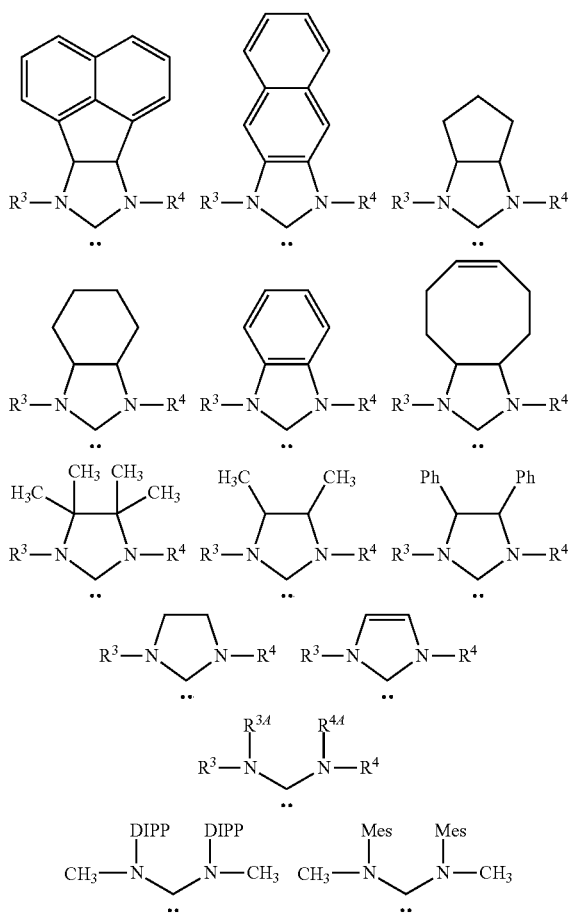

Additional examples of N-heterocyclic carbene (NHC) ligands and acyclic diaminocarbene ligands suitable as $L^1$ thus include, but are not limited to the following:

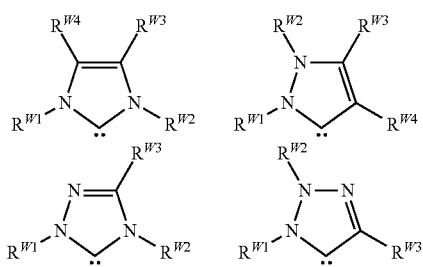

wherein $R^{W1}$, $R^{W2}$, $R^{W3}$, $R^{W4}$ are independently hydrogen, unsubstituted hydrocarbyl, substituted hydrocarbyl, or heteroatom containing hydrocarbyl, and where one or both of $R^{W3}$ and $R^{W4}$ may be in independently selected from halogen, nitro, amido, carboxyl, alkoxy, aryloxy, sulfonyl, carbonyl, thio, or nitroso groups.

Additional examples of N-heterocyclic carbene (NHC) ligands suitable as $L^1$ are further described in U.S. Pat. Nos. 7,378,528; 7,652,145; 7,294,717; 6,787,620; 6,635,768; and 6,552,139 the contents of each are incorporated herein by reference.

When M is ruthenium, then, the preferred complexes have the structure of formula (V)

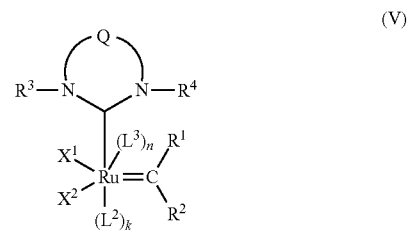

(V)

In a more preferred embodiment, Q is a two-atom linkage having the structure $-CR^{11}R^{12}-CR^{13}R^{14}-$ or $-CR^{11}=CR^{13}-$, preferably $-CR^{11}R^{12}-CR^{13}R^{14}-$, wherein $R^{11}$, $R^{12}$, $R^{13}$, and $R^{14}$ are independently selected from hydrogen, hydrocarbyl, substituted hydrocarbyl, heteroatom-containing hydrocarbyl, substituted heteroatom-containing hydrocarbyl, and functional groups. Examples of functional groups here include without limitation carboxyl, $C_1$-$C_{20}$ alkoxy, $C_5$-$C_{24}$ aryloxy, $C_2$-$C_{20}$ alkoxycarbonyl, $C_5$-$C_{24}$ alkoxycarbonyl, $C_2$-$C_{24}$ acyloxy, $C_1$-$C_{20}$ alkylthio, $C_5$-$C_{24}$ arylthio, $C_1$-$C_{20}$ alkylsulfonyl, and $C_1$-$C_{20}$ alkylsulfinyl, optionally substituted with one or more moieties selected from $C_1$-$C_{12}$ alkyl, $C_1$-$C_{12}$ alkoxy, $C_5$-$C_{14}$ aryl, hydroxyl, sulfhydryl, formyl, and halide. $R^{11}$, $R^{12}$, $R^{13}$, and $R^{14}$ are preferably independently selected from hydrogen, $C_1$-$C_{12}$ alkyl, substituted $C_1$-$C_{12}$ alkyl, $C_1$-$C_{12}$ heteroalkyl, substituted $C_1$-$C_{12}$ heteroalkyl, phenyl, and substituted phenyl. Alternatively, any two of $R^{11}$, $R^{12}$, $R^{13}$, and $R^{14}$ may be linked together to form a substituted or unsubstituted, saturated or unsaturated ring structure, e.g., a $C_4$-$C_{12}$ alicyclic group or a $C_5$ or $C_6$ aryl group, which may itself be substituted, e.g., with linked or fused alicyclic or aromatic groups, or with other substituents. In one further aspect, any one or more of $R^{11}$, $R^{12}$, $R^{13}$, and $R^{14}$ comprises one or more of the linkers. Additionally, $R^3$ and $R^4$ may be unsubstituted phenyl or phenyl substituted with one or more substituents selected from $C_1$-$C_{20}$ alkyl, substituted $C_1$-$C_{20}$ alkyl, $C_1$-$C_{20}$ heteroalkyl, substituted $C_1$-$C_{20}$ heteroalkyl, $C_5$-$C_{24}$ aryl, substituted $C_5$-$C_{24}$ aryl, $C_5$-$C_{24}$ heteroaryl, $C_6$-$C_{24}$ aralkyl, $C_6$-$C_{24}$ alkaryl, or halide. Furthermore, $X^1$ and $X^2$ may be halogen.

When $R^3$ and $R^4$ are aromatic, they are typically although not necessarily composed of one or two aromatic rings, which may or may not be substituted, e.g., $R^3$ and $R^4$ may be phenyl, substituted phenyl, biphenyl, substituted biphenyl, or the like. In one preferred embodiment, $R^3$ and $R^4$ are the same and are each unsubstituted phenyl or phenyl substituted with up to three substituents selected from $C_1$-$C_{20}$ alkyl, substituted $C_1$-$C_{20}$ alkyl, $C_1$-$C_{20}$ heteroalkyl, substituted $C_1$-$C_{20}$ heteroalkyl, $C_5$-$C_{24}$ aryl, substituted $C_5$-$C_{24}$ aryl, $C_5$-$C_{24}$ heteroaryl, $C_6$-$C_{24}$ aralkyl, $C_6$-$C_{24}$ alkaryl, or halide. Preferably, any substituents present are hydrogen, $C_1$-$C_{12}$ alkyl, $C_1$-$C_{12}$ alkoxy, $C_5$-$C_{14}$ aryl, substituted $C_5$-$C_{14}$ aryl, or halide. As an example, $R^3$ and $R^4$ are mesityl (i.e. Mes as defined herein).

In a third group of catalysts having the structure of formula (I), M, m, n, $X^1$, $X^2$, $R^1$, and $R^2$ are as defined for the first group of catalysts, $L^1$ is a strongly coordinating neutral electron donor ligand such as any of those described for the first and second group of catalysts, and $L^2$ and $L^3$ are weakly coordinating neutral electron donor ligands in the form of optionally substituted heterocyclic groups. Again, n is zero or 1, such that $L^3$ may or may not be present. Generally, in the third group of catalysts, $L^2$ and $L^3$ are optionally substituted five- or six-membered monocyclic groups containing 1 to 4, preferably 1 to 3, most preferably 1 to 2 heteroatoms, or are optionally substituted bicyclic or polycyclic structures composed of 2 to 5 such five- or six-membered monocyclic groups. If the heterocyclic group is substituted, it should not be substituted on a coordinating heteroatom, and any one cyclic moiety within a heterocyclic group will generally not be substituted with more than 3 substituents.

For the third group of catalysts, examples of $L^2$ and $L^3$ include, without limitation, heterocycles containing nitrogen, sulfur, oxygen, or a mixture thereof.

Examples of nitrogen-containing heterocycles appropriate for $L^2$ and $L^3$ include pyridine, bipyridine, pyridazine, pyrimidine, bipyridamine, pyrazine, 1,3,5-triazine, 1,2,4-triazine, 1,2,3-triazine, pyrrole, 2H-pyrrole, 3H-pyrrole, pyrazole, 2H-imidazole, 1,2,3-triazole, 1,2,4-triazole, indole, 3H-indole, 1H-isoindole, cyclopenta(b)pyridine, indazole, quinoline, bisquinoline, isoquinoline, bisisoquinoline, cinnoline, quinazoline, naphthyridine, piperidine, piperazine, pyrrolidine, pyrazolidine, quinuclidine, imidazolidine, picolylimine, purine, benzimidazole, bisimidazole, phenazine, acridine, and carbazole. Additionally, the nitrogen-containing heterocycles may be optionally substituted on a noncoordinating heteroatom with a non-hydrogen substituent.

Examples of sulfur-containing heterocycles appropriate for $L^2$ and $L^3$ include thiophene, 1,2-dithiole, 1,3-dithiole, thiepin, benzo(b)thiophene, benzo(c)thiophene, thionaphthene, dibenzothiophene, 2H-thiopyran, 4H-thiopyran, and thioanthrene.

Examples of oxygen-containing heterocycles appropriate for $L^2$ and $L^3$ include 2H-pyran, 4H-pyran, 2-pyrone, 4-pyrone, 1,2-dioxin, 1,3-dioxin, oxepin, furan, 2H-1-benzopyran, coumarin, coumarone, chromene, chroman-4-one, isochromen-1-one, isochromen-3-one, xanthene, tetrahydrofuran, 1,4-dioxan, and dibenzofuran. Examples of mixed heterocycles appropriate for $L^2$ and $L^3$ include isoxazole, oxazole, thiazole, isothiazole, 1,2,3-oxadiazole, 1,2,4-oxadiazole, 1,3,4-oxadiazole, 1,2,3,4-oxatriazole, 1,2,3,5-oxatriazole, 3H-1,2,3-dioxazole, 3H-1,2-oxathiole, 1,3-oxathiole, 4H-1,2-oxazine, 2H-1,3-oxazine, 1,4-oxazine, 1,2,5-oxathiazine, o-isooxazine, phenoxazine, phenothiazine, pyrano[3,4-b]pyrrole, indoxazine, benzoxazole, anthranil, and morpholine.

Preferred $L^2$ and $L^3$ ligands are aromatic nitrogen-containing and oxygen-containing heterocycles, and particularly preferred $L^2$ and $L^3$ ligands are monocyclic N-heteroaryl ligands that are optionally substituted with 1 to 3, preferably 1 or 2, substituents. Specific examples of particularly preferred $L^2$ and $L^3$ ligands are pyridine and substituted pyridines, such as 3-bromopyridine, 4-bromopyridine, 3,5-dibromopyridine, 2,4,6-tribromopyridine, 2,6-dibromopyridine, 3-chloropyridine, 4-chloropyridine, 3,5-dichloropyridine, 2,4,6-trichloropyridine, 2,6-dichloropyridine, 4-iodopyridine, 3,5-diiodopyridine, 3,5-dibromo-4-methylpyridine, 3,5-dichloro-4-methylpyridine, 3,5-dimethyl-4-bromopyridine, 3,5-dimethylpyridine, 4-methylpyridine, 3,5-diisopropylpyridine, 2,4,6-trimethylpyridine, 2,4,6-triisopropylpyridine, 4-(tert-butyl)pyridine, 4-phenylpyridine, 3,5-diphenylpyridine, 3,5-dichloro-4-phenylpyridine, and the like.

In general, any substituents present on either or both of $L^2 L^3$ are selected from halo, $C_1$-$C_{20}$ alkyl, substituted $C_1$-$C_{20}$ alkyl, $C_1$-$C_{20}$ heteroalkyl, substituted $C_1$-$C_{20}$ heteroalkyl, $C_5$-$C_{24}$ aryl, substituted $C_5$-$C_{24}$ aryl, $C_5$-$C_{24}$ heteroaryl, substituted $C_5$-$C_{24}$ heteroaryl, $C_6$-$C_{24}$ alkaryl, substituted $C_6$-$C_{24}$ alkaryl, $C_6$-$C_{24}$ heteroalkaryl, substituted $C_6$-$C_{24}$ heteroalkaryl, $C_6$-$C_{24}$ aralkyl, substituted $C_6$-$C_{24}$ aralkyl, $C_6$-$C_{24}$ heteroaralkyl, substituted $C_6$-$C_{24}$ heteroaralkyl, and functional groups, with suitable functional groups including, without limitation, $C_1$-$C_{20}$ alkoxy, $C_5$-$C_{24}$ aryloxy, $C_2$-$C_{20}$ alkylcarbonyl, $C_6$-$C_{24}$ arylcarbonyl, $C_2$-$C_{20}$ alkylcarbonyloxy, $C_6$-$C_{24}$ arylcarbonyloxy, $C_2$-$C_{20}$ alkoxycarbonyl, $C_6$-$C_{24}$ aryloxycarbonyl, halocarbonyl, $C_2$-$C_{20}$ alkylcarbonato, $C_6$-$C_{24}$ arylcarbonato, carboxy, carboxylato, carbamoyl, mono-($C_1$-$C_{20}$ alkyl)-substituted carbamoyl, di-($C_1$-$C_{20}$ alkyl)-substituted carbamoyl, di-N—($C_1$-$C_{20}$ alkyl), N—($C_5$-$C_{24}$ aryl)-substituted carbamoyl, mono-($C_5$-$C_{24}$ aryl)-substituted carbamoyl, di-($C_6$-$C_{24}$ aryl)-substituted carbamoyl, thiocarbamoyl, mono-($C_1$-$C_{20}$ alkyl)-substituted thiocarbamoyl, di-($C_1$-$C_{20}$ alkyl)-substituted thiocarbamoyl, di-N—($C_1$-$C_{20}$ alkyl)-N—($C_6$-$C_{24}$ aryl)-substituted thiocarbamoyl, mono-($C_6$-$C_{24}$ aryl)-substituted thiocarbamoyl, di-($C_6$-$C_{24}$ aryl)-substituted thiocarbamoyl, carbamido, formyl, thioformyl, amino, mono-($C_1$-$C_{20}$ alkyl)-substituted amino, di-($C_1$-$C_{20}$ alkyl)-substituted amino, mono-($C_5$-$C_{24}$ aryl)-substituted amino, di-($C_5$-$C_{24}$ aryl)-substituted amino, di-N—($C_1$-$C_{20}$ alkyl), N—($C_5$-$C_{24}$ aryl)-substituted amino, $C_2$-$C_{20}$ alkylamido, $C_6$-$C_{24}$ arylamido, imino, $C_1$-$C_{20}$ alkylimino, $C_5$-$C_{24}$ arylimino, nitro, and nitroso. In addition, two adjacent substituents may be taken together to form a ring, generally a five- or six-membered alicyclic or aryl ring, optionally containing 1 to 3 heteroatoms and 1 to 3 substituents as above.

Preferred substituents on $L^2$ and $L^3$ include, without limitation, halo, $C_1$-$C_{12}$ alkyl, substituted $C_1$-$C_{12}$ alkyl, $C_1$-$C_{12}$ heteroalkyl, substituted $C_1$-$C_{12}$ heteroalkyl, $C_5$-$C_{14}$ aryl, substituted $C_5$-$C_{14}$ aryl, $C_5$-$C_{14}$ heteroaryl, substituted $C_5$-$C_{14}$ heteroaryl, $C_6$-$C_{16}$ alkaryl, substituted $C_6$-$C_{16}$ alkaryl, $C_6$-$C_{16}$ heteroalkaryl, substituted $C_6$-$C_{16}$ heteroalkaryl, $C_6$-$C_{16}$ aralkyl, substituted $C_6$-$C_{16}$ aralkyl, $C_6$-$C_{16}$ heteroaralkyl, substituted $C_6$-$C_{16}$ heteroaralkyl, $C_1$-$C_{12}$ alkoxy, $C_5$-$C_{14}$ aryloxy, $C_2$-$C_{12}$ alkylcarbonyl, $C_6$-$C_{14}$ arylcarbonyl, $C_2$-$C_{12}$ alkylcarbonyloxy, $C_6$-$C_{14}$ arylcarbonyloxy, $C_2$-$C_{12}$ alkoxycarbonyl, $C_6$-$C_{14}$ aryloxycarbonyl, halocarbonyl, formyl, amino, mono-($C_1$-$C_{12}$ alkyl)-substituted amino, di-($C_1$-$C_{12}$ alkyl)-substituted amino, mono-($C_5$-$C_{14}$ aryl)-substituted amino, di-($C_5$-$C_{14}$ aryl)-substituted amino, and nitro.

Of the foregoing, the most preferred substituents are halo, $C_1$-$C_6$ alkyl, $C_1$-$C_6$ haloalkyl, $C_1$-$C_6$ alkoxy, phenyl, substituted phenyl, formyl, N,N-di($C_1$-$C_6$ alkyl)amino, nitro, and nitrogen heterocycles as described above (including, for example, pyrrolidine, piperidine, piperazine, pyrazine, pyrimidine, pyridine, pyridazine, etc.).

In certain embodiments, $L^2$ and $L^3$ may also be taken together to form a bidentate or multidentate ligand containing two or more, generally two, coordinating heteroatoms such as N, O, S, or P, with preferred such ligands being diimine ligands of the Brookhart type. One representative bidentate ligand has the structure of formula (VI)

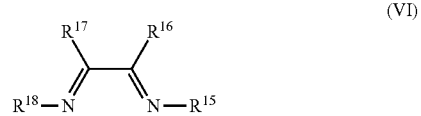

wherein $R^{15}$, $R^{16}$, $R^{17}$, and $R^{18}$ hydrocarbyl (e.g., $C_1$-$C_{20}$ alkyl, $C_2$-$C_{20}$ alkenyl, $C_2$-$C_{20}$ alkynyl, $C_5$-$C_{24}$ aryl, $C_6$-$C_{24}$ alkaryl, or $C_6$-$C_{24}$ aralkyl), substituted hydrocarbyl (e.g., substituted $C_1$-$C_{20}$ alkyl, $C_2$-$C_{20}$ alkenyl, $C_2$-$C_{20}$ alkynyl, $C_5$-$C_{24}$ aryl, $C_6$-$C_{24}$ alkaryl, or $C_6$-$C_{24}$ aralkyl), heteroatom-containing hydrocarbyl (e.g., $C_1$-$C_{20}$ heteroalkyl, $C_5$-$C_{24}$ heteroaryl, heteroatom-containing $C_6$-$C_{24}$ aralkyl, or heteroatom-containing $C_6$-$C_{24}$ alkaryl), or substituted heteroatom-containing hydrocarbyl (e.g., substituted $C_1$-$C_{20}$ heteroalkyl, $C_5$-$C_{24}$ heteroaryl, heteroatom-containing $C_6$-$C_{24}$ aralkyl, or heteroatom-containing $C_6$-$C_{24}$ alkaryl), or (1) $R^{15}$ and $R^{16}$, (2) $R^{17}$ and $R^{18}$, (3) $R^{16}$ and $R^{17}$, or (4) both $R^{15}$ and $R^{16}$, and $R^{17}$ and $R^{18}$, may be taken together to form a ring, i.e., an N-heterocycle. Preferred cyclic groups in such a case are five- and six-membered rings, typically aromatic rings.

In a fourth group of catalysts that have the structure of formula (I), two of the substituents are taken together to form a bidentate ligand or a tridentate ligand. Examples of bidentate ligands include, but are not limited to, bisphosphines, dialkoxides, alkyldiketonates, and aryldiketonates. Specific examples include —P(Ph)$_2$CH$_2$CH$_2$P(Ph)$_2$-, —As(Ph)$_2$CH$_2$CH$_2$As(Ph$_2$)-, —P(Ph)$_2$CH$_2$CH$_2$C(CF$_3$)$_2$O—, binaphtholate dianions, pinacolate dianions, —P(CH$_3$)$_2$(CH$_2$)$_2$P(CH$_3$)$_2$—, and —OC(CH$_3$)$_2$(CH$_3$)$_2$CO—. Preferred bidentate ligands are —P(Ph)$_2$CH$_2$CH$_2$P(Ph)$_2$- and —P(CH$_3$)$_2$(CH$_2$)$_2$P(CH$_3$)$_2$—. Tridentate ligands include, but are not limited to, (CH$_3$)$_2$NCH$_2$CH$_2$P(Ph)CH$_2$CH$_2$N(CH$_3$)$_2$. Other preferred tridentate ligands are those in which any three of $X^1$, $X^2$, $L^1$, $L^2$, $L^3$, $R^1$, and $R^2$ (e.g., $X^1$, $L^1$, and $L^2$) are taken together to be cyclopentadienyl, indenyl, or fluorenyl, each optionally substituted with $C_2$-$C_{20}$ alkenyl, $C_2$-$C_{20}$ alkynyl, $C_1$-$C_{20}$ alkyl, $C_5$-$C_{20}$ aryl, $C_1$-$C_{20}$ alkoxy, $C_2$-$C_{20}$ alkenyloxy, $C_2$-$C_{20}$ alkynyloxy, $C_5$-$C_{20}$ aryloxy, $C_2$-$C_{20}$ alkoxycarbonyl, $C_1$-$C_{20}$ alkylthio, $C_1$-$C_{20}$ alkylsulfonyl, or $C_1$-$C_{20}$ alkylsulfinyl, each of which may be further substituted with $C_1$-$C_6$ alkyl, halide, $C_1$-$C_6$ alkoxy or with a phenyl group optionally substituted with halide, $C_1$-$C_6$ alkyl, or $C_1$-$C_6$ alkoxy. More preferably, in compounds of this type, X, $L^1$, and $L^2$ are taken together to be cyclopentadienyl or indenyl, each optionally substituted with vinyl, $C_1$-$C_{10}$ alkyl, $C_5$-$C_{20}$ aryl, $C_1$-$C_{10}$ carboxylate, $C_2$-$C_{10}$ alkoxycarbonyl, $C_1$-$C_{10}$ alkoxy, or $C_5$-$C_{20}$ aryloxy, each optionally substituted with $C_1$-$C_6$ alkyl, halide, $C_1$-$C_6$ alkoxy or with a phenyl group optionally substituted with halide, $C_1$-$C_6$ alkyl or $C_1$-$C_6$ alkoxy. Most preferably, X, $L^1$ and $L^2$ may be taken together to be cyclopentadienyl, optionally substituted with vinyl, hydrogen, methyl, or phenyl. Tetradentate ligands include, but are not limited to O$_2$C(CH$_2$)$_2$P(Ph)(CH$_2$)$_2$P(Ph)(CH$_2$)$_2$CO$_2$, phthalocyanines, and porphyrins.

Complexes wherein Y is coordinated to the metal are examples of a fifth group of catalysts, and are commonly called "Grubbs-Hoveyda" catalysts. Grubbs-Hoveyda metathesis-active metal carbene complexes may be described by the formula (VII)

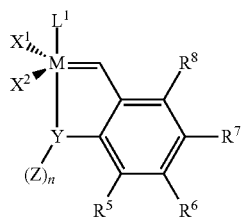
(VII)

wherein,

M is a Group 8 transition metal, particularly Ru or Os, or, more particularly, Ru;

$X^1$, $X^2$, and $L^1$ are as previously defined herein for the first and second groups of catalysts;

Y is a heteroatom selected from N, O, S, and P; preferably Y is O or N;

$R^5$, $R^6$, $R^7$, and $R^8$ are each, independently, selected from the group consisting of hydrogen, halogen, alkyl, alkenyl, alkynyl, aryl, heteroalkyl, heteroatom containing alkenyl, heteroalkenyl, heteroaryl, alkoxy, alkenyloxy, aryloxy, alkoxycarbonyl, carbonyl, alkylamino, alkylthio, aminosulfonyl, monoalkylaminosulfonyl, dialkylaminosulfonyl, alkylsulfonyl, nitrile, nitro, alkylsulfinyl, trihaloalkyl, perfluoroalkyl, carboxylic acid, ketone, aldehyde, nitrate, cyano, isocyanate, hydroxyl, ester, ether, amine, imine, amide, halogen-substituted amide, trifluoroamide, sulfide, disulfide, sulfonate, carbamate, silane, siloxane, phosphine, phosphate, borate, or -A-Fn, wherein "A" and Fn have been defined above; and any combination of Y, Z, $R^5$, $R^6$, $R^7$, and $R^8$ can be linked to form one or more cyclic groups;

n is 0, 1, or 2, such that n is 1 for the divalent heteroatoms O or S, and n is 2 for the trivalent heteroatoms N or P; and Z is a group selected from hydrogen, alkyl, aryl, functionalized alkyl, functionalized aryl where the functional group(s) may independently be one or more or the following: alkoxy, aryloxy, halogen, carboxylic acid, ketone, aldehyde, nitrate, cyano, isocyanate, hydroxyl, ester, ether, amine, imine, amide, trifluoroamide, sulfide, disulfide, carbamate, silane, siloxane, phosphine, phosphate, or borate; methyl, isopropyl, sec-butyl, t-butyl, neopentyl, benzyl, phenyl and trimethylsilyl. Additionally, $R^5$, $R^6$, $R^7$, $R^8$, and Z may independently be thioisocyanate, cyanato, or thiocyanato.

In general, Grubbs-Hoveyda complexes useful in the invention contain a chelating alkylidene moiety of the formula (VIII)

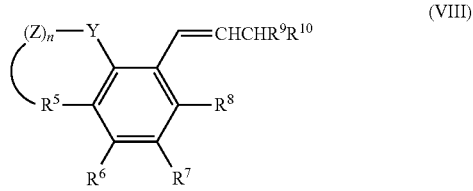
(VIII)

wherein Y, n, Z, $R^5$, $R^6$, $R^7$, and $R^8$ are as previously defined herein;

Y, Z, and $R^5$ can optionally be linked to form a cyclic structure; and $R^9$ and $R^{10}$ are each, independently, selected from hydrogen or a substituent group selected from alkyl, aryl, alkoxy, aryloxy, $C_2$-$C_{20}$ alkoxycarbonyl, or $C_1$-$C_{20}$ trialkylsilyl, wherein each of the substituent groups is substituted or unsubstituted. The chelating alkylidene moiety may be derived from a ligand precursor having the formula:

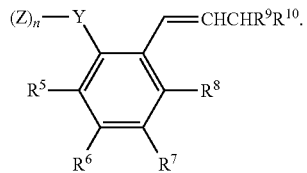

Non-limiting examples of complexes comprising Grubbs-Hoveyda ligands suitable in the invention include:

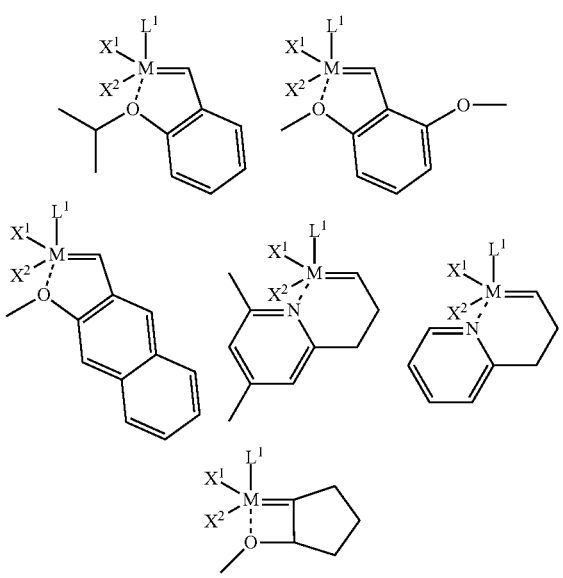

wherein, $L^1$, $X^1$, $X^2$, and M are as described for any of the other groups of catalysts. Suitable chelating carbenes and carbene precursors are further described by Pederson et al. (U.S. Pat. Nos. 7,026,495 and 6,620,955, the disclosures of both of which are incorporated herein by reference) and Hoveyda et al. (U.S. Pat. No. 6,921,735 and WO0214376, the disclosures of both of which are incorporated herein by reference).

Further examples of complexes having linked ligands include those having linkages between a neutral NHC ligand and an anionic ligand, a neutral NHC ligand and an alkylidine ligand, a neutral NHC ligand and an $L^2$ ligand, a neutral NHC ligand and an $L^3$ ligand, an anionic ligand and an alkylidine ligand, and any combination thereof.

In addition to the catalysts that have the structure of formula (I), as described above, other transition metal carbene complexes include, but are not limited to:

neutral ruthenium or osmium metal carbene complexes containing metal centers that are formally in the +2 oxidation state, have an electron count of 16, are penta-coordinated, and are of the general formula (IX);

neutral ruthenium or osmium metal carbene complexes containing metal centers that are formally in the +2 oxidation state, have an electron count of 18, are hexacoordinated, and are of the general formula (X);

cationic ruthenium or osmium metal carbene complexes containing metal centers that are formally in the +2 oxidation state, have an electron count of 14, are tetra-coordinated, and are of the general formula (XI); and cationic ruthenium or osmium metal carbene complexes containing metal centers that are formally in the +2 oxidation state, have an electron count of 14 or 16, are tetra-coordinated or penta-coordinated, respectively, and are of the general formula (XII)

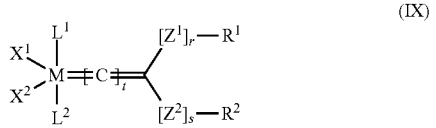 (IX)

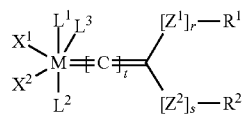 (X)

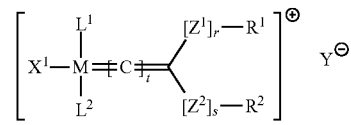 (XI)

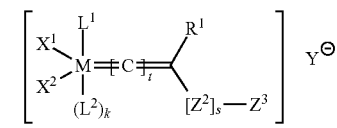 (XII)

wherein:
M, $X^1$, $X^2$, $L^1$, $L^2$, $L^3$, $R^1$, and $R^2$ are as defined for any of the previously defined four groups of catalysts;
r and s are independently zero or 1;
t is an integer in the range of zero to 5;
k is an integer in the range of zero to 1;
Y is any non-coordinating anion (e.g., a halide ion, $BF_4^-$, etc.);
$Z^1$ and $Z^2$ are independently selected from —O—, —S—, —$NR^2$—, —$PR^2$—, —P(=O)$R^2$—, —P($OR^2$)—, —P(=O)($OR^2$)—, —C(=O)—, —C(=O)O—, —OC(=O)—, —OC(=O)O—, —S(=O)—, —S(=O)$_2$—, and an optionally substituted and/or optionally heteroatom-containing $C_1$-$C_{20}$ hydrocarbylene linkage;
$Z^3$ is any cationic moiety such as —P($R^2$)$_3^+$ or —N($R^2$)$_3^+$;
and any two or more of $X^1$, $X^2$, $L^1$, $L^2$, $L^3$, $Z^1$, $Z^2$, $Z^3$, $R^1$, and $R^2$ may be taken together to form a cyclic group, e.g., a multidentate ligand.

Additionally, another group of metal carbene olefin metathesis catalysts that may be used in the invention disclosed herein, is a Group 8 transition metal complex having the structure of formula (XIII):

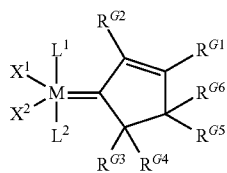 (XIII)

wherein M is a Group 8 transition metal, particularly ruthenium or osmium, or more particularly, ruthenium;
X1, X2, L1 and L2 are as defined for the first and second groups of catalysts defined above; and
RG1, RG2, RG3, RG4, RG5, and RG6 are each independently selected from the group consisting of hydrogen, halogen, alkyl, alkenyl, alkynyl, aryl, heteroalkyl, heteroatom containing alkenyl, heteroalkenyl, heteroaryl, alkoxy, alkenyloxy, aryloxy, alkoxycarbonyl, carbonyl, alkylamino, alkylthio, aminosulfonyl, monoalkylaminosulfonyl, dialkylaminosulfonyl, alkylsulfonyl, nitrile, nitro, alkylsulfinyl, trihaloalkyl, perfluoroalkyl, carboxylic acid, ketone, aldehyde, nitrate, cyano, isocyanate, thioisocyanate, cyanato, thiocyanato, hydroxyl, ester, ether, thioether, amine, alkylamine, imine, amide, halogensubstituted amide, trifluoroamide, sulfide, disulfide, sulfonate, carbamate, silane, siloxane, phosphine, phosphate, borate, or -A-Fn, wherein "A" is a divalent hydrocarbon moiety selected from alkylene and arylalkylene, wherein the alkyl portion of the alkylene and arylalkylene groups can be linear or branched, saturated or unsaturated, cyclic or acyclic, and substituted or unsubstituted, wherein the aryl portion of the arylalkylene can be substituted or unsubstituted, and wherein hetero atoms and/or functional groups may be present in either the aryl or the alkyl portions of the alkylene and arylalkylene groups, and Fn is a functional group, or any one or more of the RG1, RG2, RG3, RG4, RG5, and RG6 may be linked together to form a cyclic group.

Additionally, one preferred embodiment of the Group 8 transition metal complex of formula XIII is a Group 8 transition metal complex of formula (XIV):

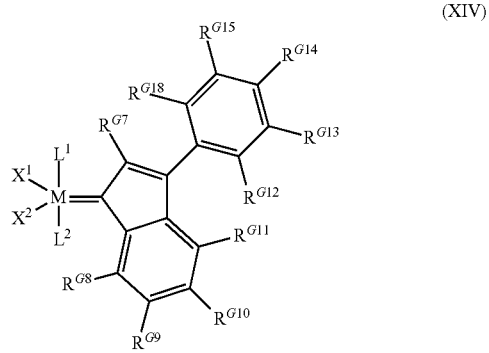

(XIV)

wherein M, X1, X2, L1, L2, are as defined above for Group 8 transition metal complex of formula (XIII); and RG7, RG8, RG9, RG10, RG11, RG12, RG13, RG14, RG15 and RG16 are as defined above for RG1, RG2, RG3, RG4, RG5, and RG6 for Group 8 transition metal complex of formula XIII or any one or more of the RG7, RG8, RG9, RG10, RG11, RG12, RG13, RG14, RG15 and RG16 may be linked together to form a cyclic group.

Additionally, another preferred embodiment of the Group 8 transition metal complex of formula XIII is a Group 8 transition metal complex of formula (XV):

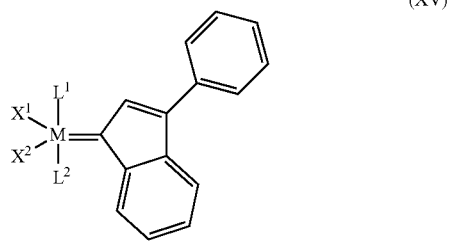

(XV)

wherein M, X1, X2, L1, L2, are as defined above for Group 8 transition metal complex of formula XIII.

Particularly useful catalysts include:

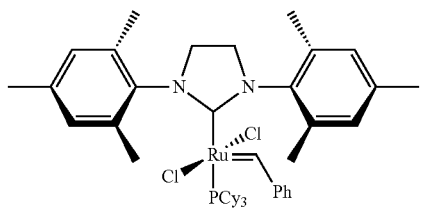

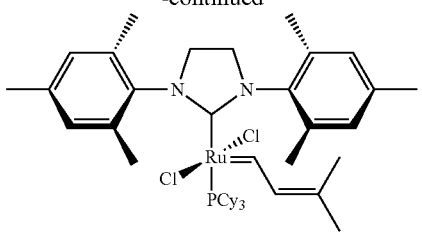

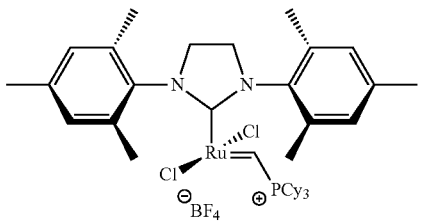

4

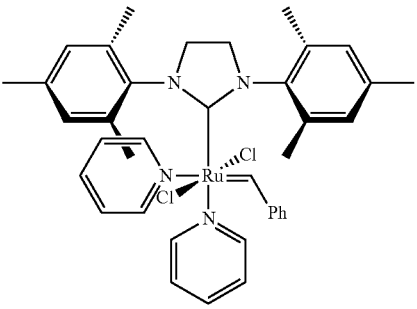

5

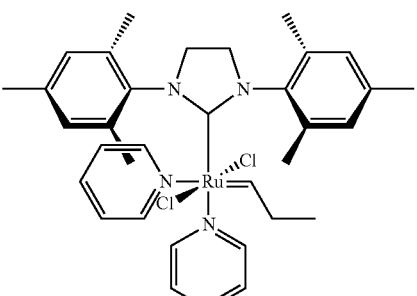

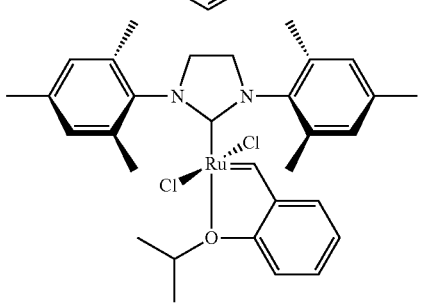

Additional catalyst embodiments are also described in WO 2012/097379 A2, "Z-Selective Olefin Metathesis Catalysts and their Synthetic Procedure," which is incorporated by reference herein in its entirety. This reference describes a series of hindered metathesis catalyst that favor the formation of cis-bonds, and are useful for that purpose in the context of the present invention. These catalysts are described compound having a structure of Formula (XIII),

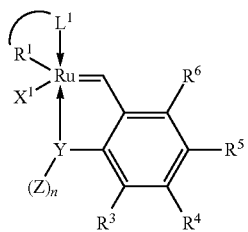

(XIII)

wherein $X^1$ is an anionic ligand;

$L^1$ is a carbene ligand having the structure of Formula (XIV):

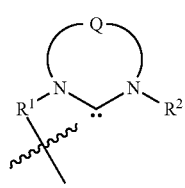

(XIV)

wherein,

Q is selected from hydrocarbylene, substituted hydrocarbylene, heteroatom-containing hydrocarbylene, or substituted heteroatom-containing hydrocarbylene, wherein two or more substituents on adjacent atoms within Q may also be linked to form an additional cyclic structure;

$R^1$ is an optionally substituted hydrocarbylene or an optionally substituted heteroatom-containing hydrocarbylene, where $R^1$ links $L^1$ and M and, together with $L^1$ and M, form one or more cyclic groups, and wherein M, $L^1$ and $R^1$ form an M-$R^1$-$L^1$ chelating ligand ring structure having a ring size of 5, 6, or 7 atoms;

$R^2$ is an optionally substituted hydrocarbyl or an optionally substituted heteroatom-containing hydrocarbyl'

Y is N, O, S, or P (or other two electron donor);

$R^3$, $R^4$, $R^5$, and $R^6$ are each, independently, hydrogen, halogen, alkyl, alkenyl, alkynyl, aryl, heteroalkyl, heteroatom containing alkenyl, heteroalkenyl, heteroaryl, alkoxy, alkenyloxy, aryloxy, alkoxycarbonyl, carbonyl, alkylamino, alkylthio, aminosulfonyl, monoalkylaminosulfonyl, dialkylaminosulfonyl, alkylsulfonyl, nitrile, nitro, alkylsulfinyl, trihaloalkyl, perfluoroalkyl, carboxylic acid, ketone, aldehyde, nitrate, cyano, isocyanate, hydroxyl, ester, ether, amine, imine, amide, halogen-substituted amide, trifluoroamide, sulfide, disulfide, sulfonate, carbamate, silane, siloxane, phosphine, phosphate, or borate, wherein any combination of $R^5$, $R^6$, $R^7$, and $R^8$ can be linked to form one or more cyclic groups;

n is 1 or 2, such that n is 1 for the divalent heteroatoms O or S, and n is 2 for the trivalent heteroatoms N or P; and Z is selected from hydrogen, alkyl, aryl, functionalized alkyl, or functionalized aryl wherein the functional group(s) may independently comprise one or more or the following: alkoxy, aryloxy, halogen, carboxylic acid, ketone, aldehyde, nitrate, cyano, isocyanate, hydroxyl, ester, ether, amine, imine, amide, trifluoroamide, sulfide, disulfide, carbamate, silane, siloxane, phosphine, phosphate, or borate; methyl, isopropyl, sec-butyl, t-butyl, neopentyl, benzyl, phenyl and trimethylsilyl; and wherein any combination or combinations of $X^1$, $R^1$, $R^2$, $L^1$, Y, Z, $R^3$, $R^4$, $R^5$, and $R^6$ are optionally linked to a support.

In other embodiments of Formula XIII, the methods employ hindered ruthenium metathesis catalysts of the structures above, wherein $X^1$ is halide, nitrate, alkyl, aryl, alkoxy, alkylcarboxylate, aryloxy, alkoxycarbonyl, aryloxycarbonyl, arylcarboxylate, acyl, acyloxy, alkylsulfonato, arylsulfonato, alkylsulfanyl, arylsulfanyl, alkylsulfinyl, or arylsulfinyl. In other embodiments, $X^1$ is a carboxylate, nitrate, phenoxide, bromide, chloride, iodide, sulfoxide, or nitrite. Nitrate and pivalate ligands are particularly suitable embodiments for the methods.

In the carbene ligand having the structure of Formula (XIV), Q is a linker, typically a hydrocarbylene linker, including substituted hydrocarbylene, heteroatom-containing hydrocarbylene, and substituted heteroatom-containing hydrocarbylene linkers, wherein two or more substituents on adjacent atoms within Q may also be linked to form an additional cyclic structure, which may be similarly substituted to provide a fused polycyclic structure of two to about five cyclic groups. Q is often, although again not necessarily, a two-atom linkage or a three-atom linkage. In more particular embodiments, Q is a two-atom linkage having the structure —$CR^{11}R^{12}$—, —$CR^{13}R^{14}$— or —$CR^{11}$=$CR^{13}$—, preferably —$CR^{11}R^{12}$—$CR^{13}R^{14}$, wherein $R^{11}$, $R^{12}$, $R^{13}$, and $R^{14}$ are independently hydrogen, hydrocarbyl, substituted hydrocarbyl, heteroatom-containing hydrocarbyl, substituted heteroatom-containing hydrocarbyl, or functional groups. Examples of suitable functional groups include carboxyl, $C_1$-$C_{20}$ alkoxy, $C_5$-$C_{24}$ aryloxy, $C_2$-$C_{20}$ alkoxycarbonyl, $C_5$-$C_{24}$ alkoxycarbonyl, $C_2$-$C_{24}$ acyloxy, $C_1$-$C_{20}$ alkylthio, $C_5$-$C_{24}$ arylthio, $C_1$-$C_{20}$ alkylsulfonyl, and $C_1$-$C_{20}$ alkylsulfinyl, optionally substituted with one or more moieties selected from $C_1$-$C_{12}$ alkyl, $C_1$-$C_{12}$ alkoxy, $C_5$-$C_{14}$ aryl, hydroxyl, sulfhydryl, formyl, and halide. $R^{11}$, $R^{12}$, $R^{13}$, and $R^{14}$ are preferably independently selected from hydrogen, $C_1$-$C_{12}$ alkyl, substituted $C_1$-$C_{12}$ alkyl, $C_1$-$C_{12}$ heteroalkyl, substituted $C_1$-$C_{12}$ heteroalkyl, phenyl, and substituted phenyl. Alternatively, any two of $R^{11}$, $R^{12}$, $R^{13}$, and $R^{14}$ may be linked together to form a substituted or unsubstituted, saturated or unsaturated ring structure, e.g., a $C_4$-$C_{12}$ alicyclic group or a $C_5$ or $C_6$ aryl group, which may itself be substituted, e.g., with linked or fused alicyclic or aromatic groups, or with other substituents. In one further aspect, any one or more of $R^{11}$, $R^{12}$, $R^{13}$, and $R^{14}$ comprises one or more of the linkers.

In certain embodiments, $R^1$ is an optionally substituted alkylene, optionally substituted heteroatom-containing alkylene, optionally substituted cycloalkylene, optionally substituted heteroatom-containing cycloalkylene, optionally substituted aryl, or optionally substituted heteroaryl. In other embodiments, $R^1$ is an optionally substituted cycloalkylene or optionally substituted aryl. $R^1$ may also be an optionally substituted adamantylene group or a substituted $C_3$-$C_{12}$ cycloalkylene group. Adamantylene is a particularly suitable $R^1$ moiety.

In still other embodiments of Formula XIII, $R^1$ is an optionally substituted cycloalkyne, an optionally substituted heteroatom-containing cycloalkylene, an optionally substituted aryl, or an optionally substituted heteroaryl and $R^2$ is an optionally substituted cycloalkyl, an optionally substituted heteroatom-containing cycloalkyl, an optionally substituted aryl, or an optionally substituted heteroaryl. Further embodiments provide that $R^1$ is an optionally substituted cycloalkylene and $R^2$ is a substituted aryl group. When $R^2$ is a substituted aryl group, certain embodiments provide that one or both ortho positions are substituted, preferably by methyl, ethyl, propyl, or isopropyl substitutents. Under these conditions, the other meta or para-positions may also be substituted. Suitable substituent patterns include those where R² is 2,4,6-trimethyl phenyl (mesityl), methylisopropylphenyl (MIPP), or di-isopropylphenyl (DIPP).

In some embodiments of Formula XIII, Q is an optionally substituted ethylene (—CH₂CH₂—), R¹ is an optionally substituted adamantylene, R² is 2,4,6-trimethyl phenyl (mesityl), 2-methyl, 6-isopropylphenyl (MIPP), or 2,6-diisopropylphenyl (DIPP); X¹ is nitrate or pivalate, R³, R⁴, R⁵, and R⁶ are each hydrogen; Y is O; and (Z)$_n$ is isopropyl.

Accordingly, suitable C—H activated olefin metathesis catalyst compound also comprise one or more of the following:

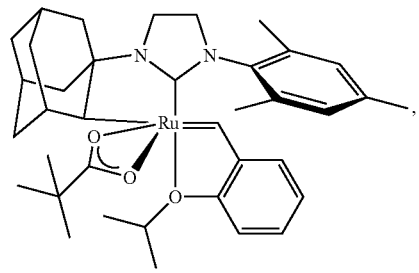

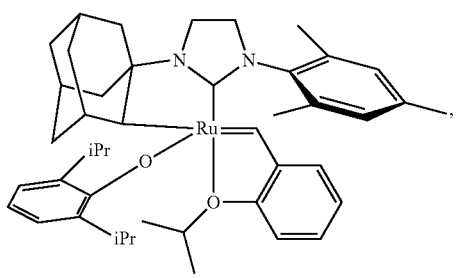

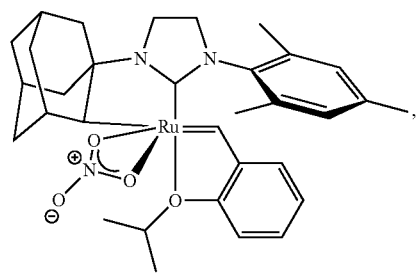

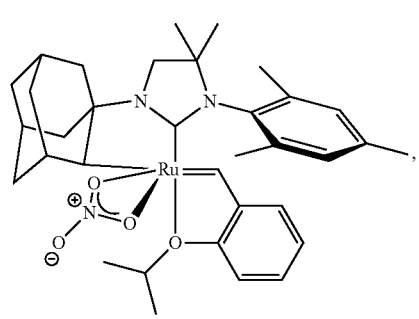

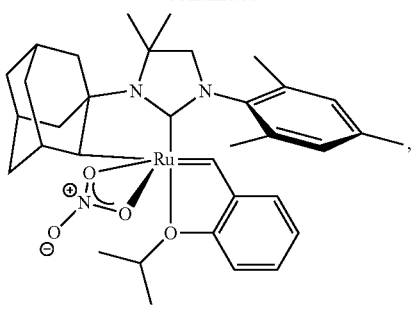

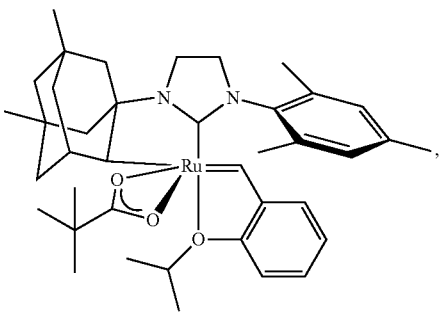

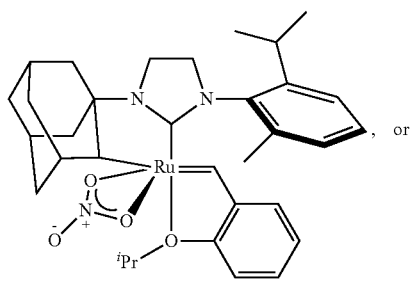

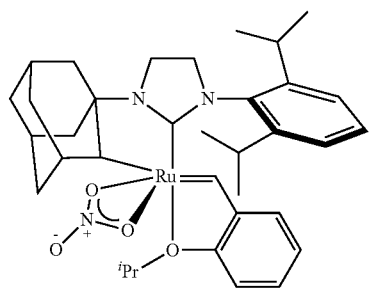

Other suitable catalyst useful in preparing the polymer brushes include Catalyst 1 to Catalyst 8 (see also the Examples):

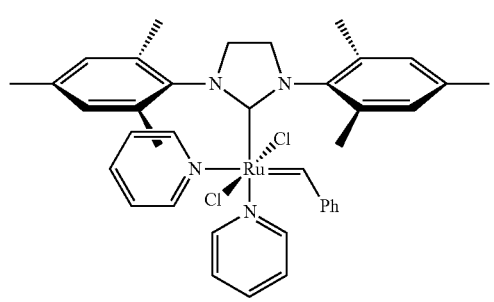

Catalyst 1

Catalyst 2
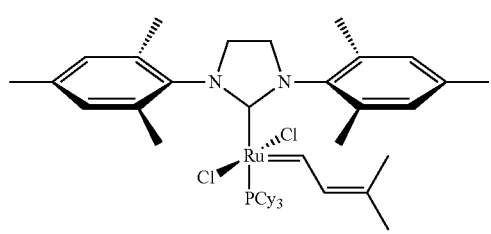

Catalyst 3
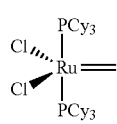

Catalyst 4
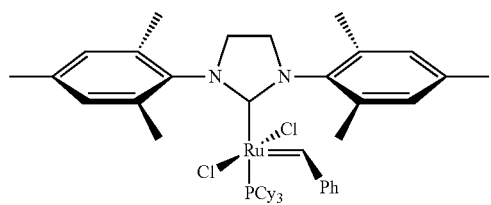

Catalyst 5
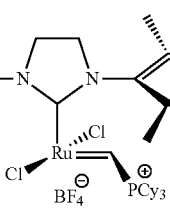

Catalyst 6
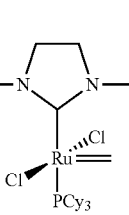

Catalyst 7
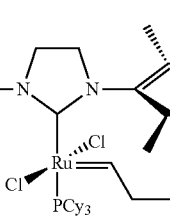

Catalyst 8
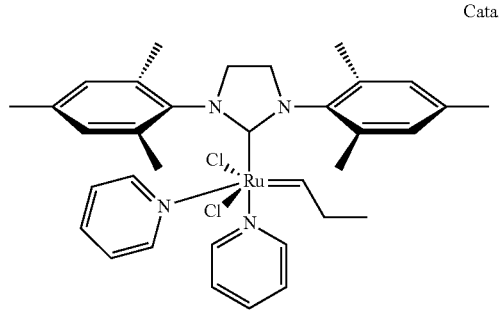

In general, the transition metal complexes used as catalysts herein can be prepared by several different methods, such as those described by Schwab et al. (1996) J. Am. Chem. Soc. 118:100-110, Scholl et al. (1999) Org. Lett. 6:953-956, Sanford et al. (2001) J. Am. Chem. Soc. 123:749-750, U.S. Pat. No. 5,312,940, and U.S. Pat. No. 5,342,909, the disclosures of each of which are incorporated herein by reference. Also see U.S. Pat. Pub. No. 2003/0055262 to Grubbs et al., filed Apr. 16, 2002, for "Group 8 Transition Metal Carbene Complexes as Enantioselective Olefin Metathesis Catalysts," International Patent Publication No. WO 02/079208, and U.S. Pat. No. 6,613,910 to Grubbs et al., filed Apr. 2, 2002, for "One-Pot Synthesis of Group 8 Transition Metal Carbene Complexes Useful as Olefin Metathesis Catalysts," the disclosures of each of which are incorporated herein by reference. Preferred synthetic methods are described in International Patent Publication No. WO 03/11455A1 to Grubbs et al. for "Hexacoordinated Ruthenium or Osmium Metal Carbene Metathesis Catalysts," published Feb. 13, 2003, the disclosure of which is incorporated herein by reference. The metathesis catalysts that are described infra may be utilized in olefin metathesis reactions according to techniques known in the art.

In some embodiments, the catalyst may be added to the resin composition as a solid, a solution, or as a suspension. When the catalyst is added to the resin composition as a suspension, the catalyst is suspended in a dispersing carrier such as mineral oil, paraffin oil, soybean oil, tri-isopropylbenzene, or any hydrophobic liquid which has a sufficiently high viscosity so as to permit effective dispersion of the catalyst, and which is sufficiently inert and which has a sufficiently high boiling point so that is does not act as a low-boiling impurity in the olefin metathesis reaction. It will be appreciated that the amount of catalyst that is used (i.e., the "catalyst loading") in the reaction is dependent upon a variety of factors such as the identity of the reactants and the reaction conditions that are employed. It is therefore understood that catalyst loading may be optimally and independently chosen for each reaction.

Polymer Compositions

To this point, the invention has largely been described in terms of methods of making polymer compositions, though some aspects of the resulting polymer compositions have been described. For the sake of clarity, however, the invention contemplates and certain embodiments include those compositions that comprise at least one polymer prepared in whole or in part by any one of the inventive methods described herein. These include, without limitation, those compositions comprising only a single polymer, or a plurality of individual polymer strands, whether free-standing or tethered to a substrate surface. These embodiments also include homopolymers and random or block co-polymers that may or may not be capable of conducting electrons, or behaving as semiconductors, or both.

Devices

The present disclosure also contemplates those devices and portions thereof which take advantage of the teachings presented here. That is, certain embodiments include those devices comprising a polymer brush structure as described herein or prepared in whole or in part by any of the methods described herein. These include, as non-limiting examples, polymer electronic devices (e.g. diodes, capacitors, chemical sensors, light emitting diodes (LEDs), photodetectors, photovoltaic cells, thermoelectric detectors, or transistors), medical implants, composite materials, antireflection coatings, antifouling coatings, microfluidics, and reactor modifications for chemical syntheses, especially, but not limited to, those which benefit from the described advantages of the polymer compositions which result from the methods. Such polymer brush structures may also be incorporated in an optical polarizer, and such a polarizer is within the scope of the present invention.

The following listing of embodiments in intended to complement, rather than displace or supersede, the previous descriptions.

Embodiment 1

A polymer brush structure exhibiting birefringence, said polymer brush structure comprising a plurality of substantially parallel oriented polymers and characterized by a longitudinal z-direction having a first refractive index, $n_z$, and a lateral x,y-direction having a second refractive index, $n_{x,y}$, wherein the difference, $\Delta n$, between the first refractive index and the second refractive index is in a range of about 0.1 to about 0.6, as measured by ellipsometry and fit to a Cauchy analytical model.

Embodiment 2

The polymer brush structure of Embodiment 1 comprising a plurality of polymers having alkylene, alkenylene, or both alkylene and alkenylene linkages.

Embodiment 3

The polymer brush structure of Embodiment 1 or 2, wherein the polymer brush structure is formed by a process comprising an enyne, a diyne, or ring-opening metathesis polymerization (ROMP) reaction.

Embodiment 4

The polymer brush structure of any one of Embodiments 1 to 3, wherein the oriented polymers comprise polyacetylene, polynorbornene, or a combination thereof.

Embodiment 5

The polymer brush structure of any one of Embodiments 1 to 4, wherein a plurality of the polymers contains an electron donor substituent.

Embodiment 6

The polymer brush structure of any one of Embodiments 1 to 5, wherein a plurality of the polymers contains an electron acceptor substituent.

Embodiment 7

The polymer brush structure of any one of Embodiments 1 to 6, wherein a plurality of the polymers comprise random or block copolymers.

Embodiment 8

The polymer brush structure of any one of Embodiments 1 to 7, wherein a plurality of the polymers comprises homopolymers.

Embodiment 9

The polymer brush structure of any one of Embodiments 1 to 8 having a thickness in the longitudinal z-direction in a range of from about 20 nm to about 50 microns, preferably in a range of from about 100 nm to about 5 microns.

Embodiment 10

The polymer brush structure of any one of Embodiments 1 to 9, said polymers having a density in the x-y direction in a range of from about 0.001 nanomole/$cm^2$ to about 1.5 nanomole/$cm^2$, preferably in a range of from about 0.01 nanomole/$cm^2$ to about 1 nanomole/$cm^2$ or from about 0.1 or about 0.5 nanomole/$cm^2$ to about 1 nanomole/$cm^2$, preferably as measured by Quartz Crystal Micrography, QCM, if tethered to a quartz substrate.

Embodiment 11

The polymer brush structure of any one of Embodiments 1 to 10 tethered to a surface by a monolayer arrangement of covalent, hydrogen bonding, ionic, physisorption, pi-pi interaction, or Van der Waals linkages, or a combination thereof.

Embodiment 12

The polymer brush structure of any one of Embodiments 1 to 11, wherein the polymer brush structure is tethered to a surface by a monolayer arrangement of covalent linkages.

Embodiment 13

The polymer brush structure of any one of Embodiments 1 to 12, wherein the polymer brush structure is tethered to a surface by a monolayer arrangement of phosphonate linkages.

Embodiment 14

The polymer brush structure of any one of Embodiments 1 to 13, wherein the polymer brush structure is tethered to a surface comprising a metal, metalloid, or an inorganic or metallic oxide, or combination thereof.

Embodiment 15

The polymer brush structure of any one of Embodiments 1 to 14, formed by a metathesis reaction in a process comprising contacting a feedstock vapor or gas comprising an olefinic or acetylenic precursor with a solid transition metal-based metathesis catalyst, said catalyst tethered to a surface by a linking moiety.

Embodiment 16

The polymer brush structure of Embodiment 15, wherein the contacting is done in the absence of a liquid.

Embodiment 17

The polymer brush structure of Embodiment 15 or 16, wherein the olefinic or acetylenic precursor is presented to the transition metal-based metathesis catalyst as a gas.

Embodiment 18

The polymer brush structure of any one of Embodiments 15 to 17, comprising a plurality of polymers, wherein one end of each of the polymers is tethered to a surface, and the polymers are oriented to extend from the surface, the end of each of the polymer tethered to the surface being the proximal end and the other end of each polymer being the distal end, the transition metal-based metathesis catalyst being bonded to the distal end of the polymer.

Embodiment 19

The polymer brush structure of any one of Embodiments 15 to 18, wherein the transition metal-based metathesis catalyst is a Grubbs-type ruthenium catalyst.

Embodiment 20

The polymer brush structure of any one of Embodiments 15 to 19, wherein the transition metal-based metathesis catalyst is a Second Generation Grubbs-type ruthenium catalyst.

Embodiment 21

The polymer brush structure of any one of Embodiments 15 to 20, wherein the transition metal-based metathesis catalyst comprises at least one of Catalyst 1 to Catalyst 8:

Catalyst 1

Catalyst 2

Catalyst 3

Catalyst 4

Catalyst 5
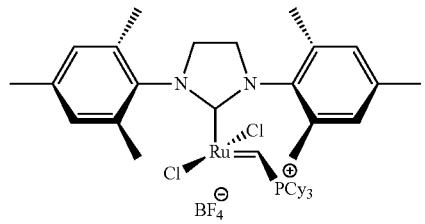

Catalyst 6
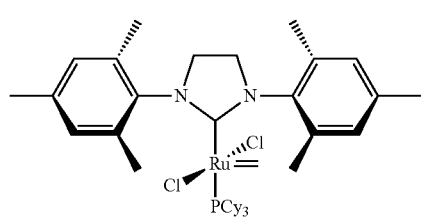

Catalyst 7
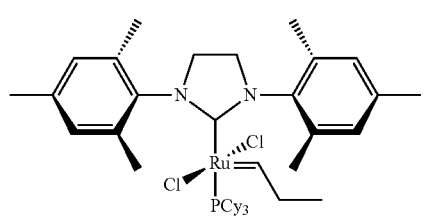

Catalyst 8

Embodiment 22

The polymer brush structure of any one of Embodiments 15 to 21, wherein the polymer brush structure is subsequently removed from the surface.

Embodiment 23

The polymer brush structure of any one of Embodiments 15 to 22, wherein the polymer brush structure is electrochemically removed from the surface.

Embodiment 24

The polymer brush structure of any one of Embodiments 1 to 23, wherein the material properties, including the chemical and optical properties, can be modified by an external stimulus, including the thermal and electromagnetic environment of the structure.

Embodiment 25

A device comprising a polymer brush structure of any one of Embodiments 1 to 24.

Embodiment 26

The device of Embodiment 25, wherein the device is a diode, capacitor, chemical sensor, light emitting diode (LED), microfluidic device, photo detector, photovoltaic cell, thermoelectric detector, transistor, medical implant, or comprises an anti-reflection coatings or antifouling coating.

Embodiment 27

An optical polarizer comprising a polymer brush structure of any one of Embodiments 1 to 23.

EXAMPLES

The following Examples are provided to illustrate some of the concepts described within this disclosure. While each Example is considered to provide specific individual embodiments of composition, methods of preparation and use, none of the Examples should be considered to limit the more general embodiments described herein.

In the following examples, efforts have been made to ensure accuracy with respect to numbers used (e.g. amounts, temperature, etc.) but some experimental error and deviation should be accounted for. Unless indicated otherwise, temperature is in degrees C., pressure is at or near atmospheric.

Example 1

Materials and Methods

All glassware was oven dried and reactions were performed under nitrogen atmosphere unless otherwise noted. All solvents and reagents were purchased from commercial suppliers and used as received unless otherwise noted.

In the following examples, Catalyst 1 and Catalyst 2 refer to:

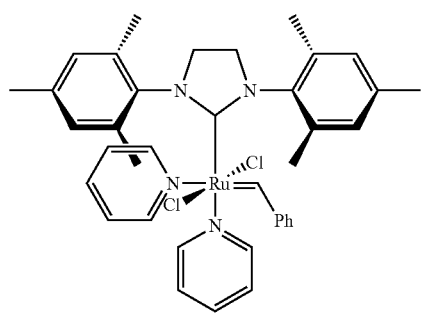

Catalyst 1

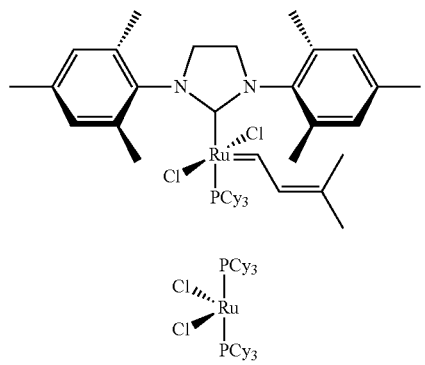

Catalyst 2

Catalyst 3

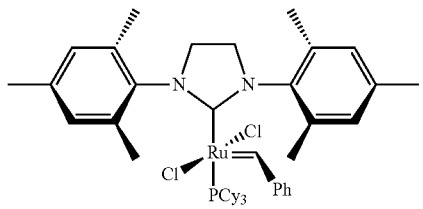

Catalyst 4

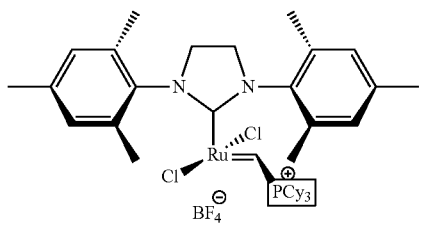

Catalyst 5

Ellipsometry was performed on a Sentech SE-850. Modeling and fitting was performed with the Sentech SpectraRay software package.

Example 2

Preparation of Physisorbed Films of Polyacetylene

Using a pipette, 0.5 ml of a solution of 14 mg of Catalyst 1 in 1 mL toluene was transferred onto a glass slide. The flat-bottomed Schlenk flask containing the sample was evacuated slowly to 120 millitorr, and backfilled with 5 psia of acetylene gas. The sample was allowed to react at ambient room temperature for 15 hours, after which it was quenched and rinsed with ethyl vinyl ether. Color changed from green to yellow to red to black as the polyacetylene chain length increased over several hours. The matte black polyacetylene films produced were verified by surface Fourier transform infrared spectroscopy.

In a second experiment, a 1.0 mg/mL solution of Catalyst 1 in acetone was deposited onto a silicon coupon, wetting the entire surface, all within a "Fischer-Porter" glass pressure vessel. The acetone was slowly removed by evacuating the vessel at 2.0 torr. A light green film was deposited on the surface. The chamber was further evacuated to 100 millitorr, then backfilled with 5 psia acetylene gas. The reaction was stopped at 26 hours by evacuating the chamber. A black layer of polyacetylene was present on the silicon surface. The sample was cleaved under argon for scanning electron microscopy analysis. The images show measured thicknesses of the polyacetylene film of approximately 700-1500 nm.

Example 3

Preparation of Covalently Tethered Polyacetylene Brush Structures

Silicon coupons (2 cm×2 cm) were cleaned with piranha solution (70:30 $H_2SO_4$:$H_2O_2$) for one hour, rinsed with DI water, methanol and acetone, and dried under argon. A monolayer of pent-5-enyl phosphonic acid was prepared by the method described in Hanson, et al., *Journal of the American Chemical Society* 2003, 125, 16074-16080 from a solution in THF (structure of tethered complex illustrated in FIG. 1). In a nitrogen-filled glove box, the functionalized coupon was placed into a solution of 25 mg of Catalyst 2 in 2 mL of toluene, which was held under static vacuum for 10 minutes.

Figure 2:
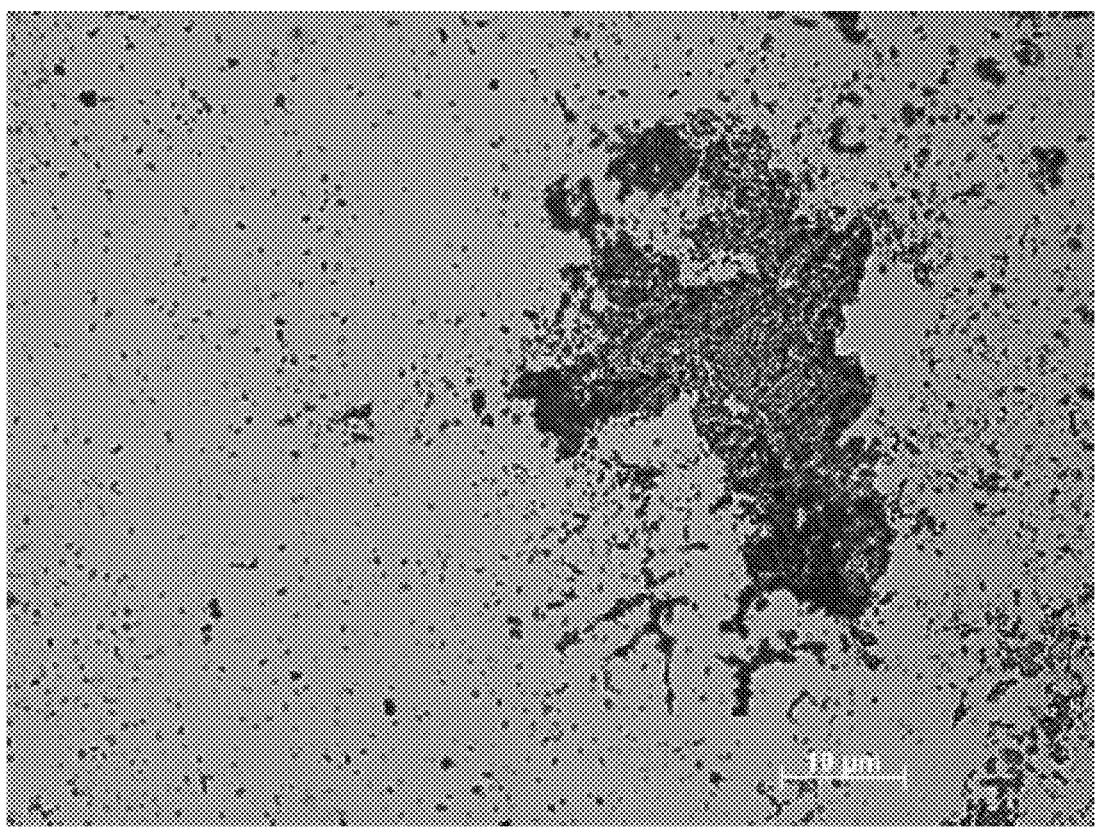
FIG. 2 shows a micrograph of a sample prepared as described in Example 3.

The coupon was removed and submerged into fresh toluene, rinsed with ~10 mL of toluene, and allowed to dry. The coupon was placed in a flat-bottomed Schlenk flask, which was evacuated to 150 millitorr and backfilled with 5 psia acetylene gas and held at ambient room temperature for 16 hours. Dark black crystallites were observed by optical microscopy (FIG. 2). These crystallites were contacted with a metal probe tip to provide an example of a complete device, where the silicon substrate served as one electrode, and the probe tip as the other.

Example 4

Demonstration of a Polyacetylene Schottky Diode

Inside of a "Fischer-Porter" glass pressure vessel, a 1.0 mg/mL solution of Catalyst 1 in acetone was deposited onto an aluminum-coated silicon coupon, wetting the entire surface. The acetone was slowly removed by evacuating the vessel at 2.0 torr. A light green film was deposited on the surface. The chamber was further evacuated to 400 millitorr, then backfilled with 5 psia acetylene gas. The reaction was allowed to proceed at ambient room temperature and was stopped at 13 hours by evacuating the chamber. The sample was annealed at 175° C. at 200 millitorr for 5 minutes, to isomerize any cis-polyacetylene to trans-polyacetylene.

Figure 3A:
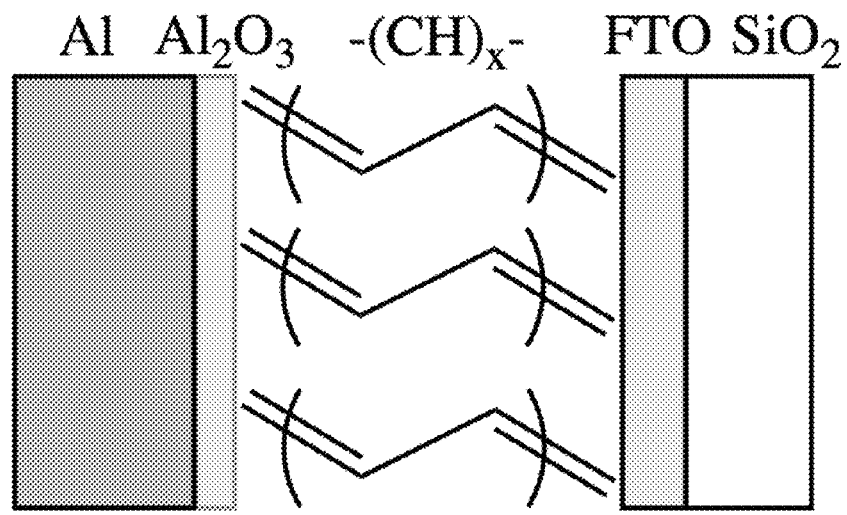
FIG. 3A provides an illustration of the structure of the device prepared in Example 4.
Figure 3B:
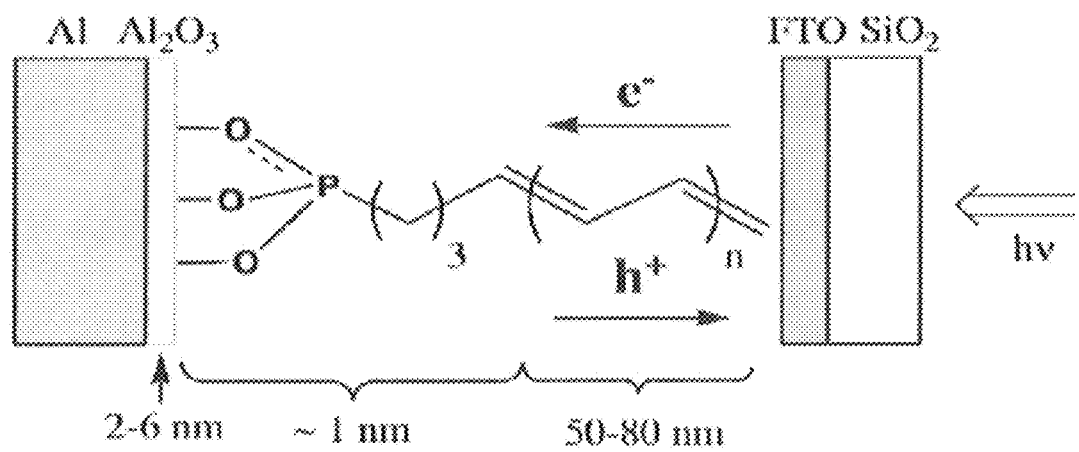
FIG. 3B provides an illustration of another structure available by methods of the present invention.
Figure 3C:
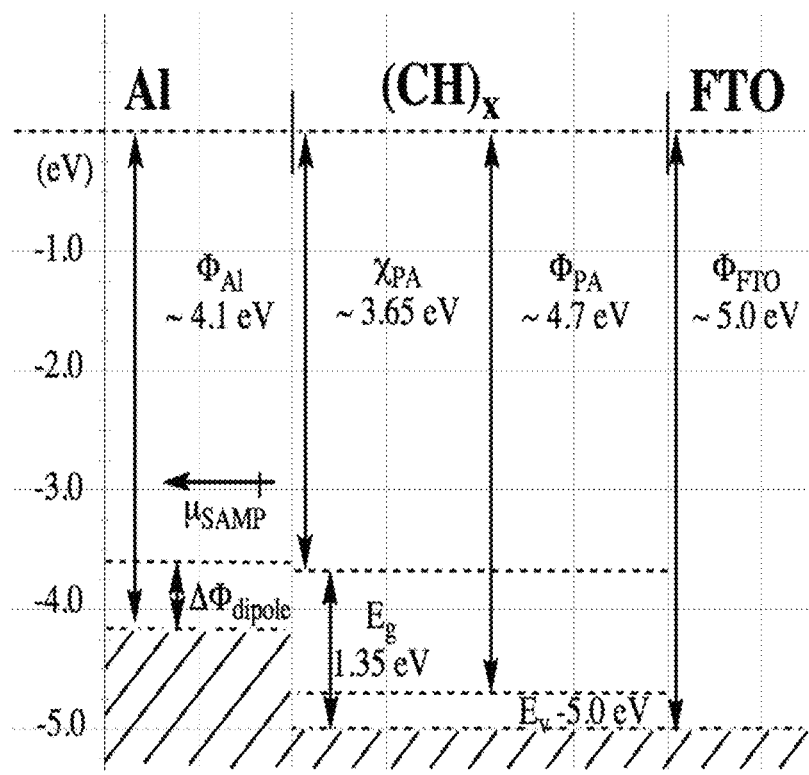
FIG. 3C illustrates the energy levels before equilibration (not in contact) of the three constituent materials of Example 4. The proposed effect of the dipole of a Self-Assembled Monolayer of Phosphonate (SAMP) is shown. This is designed to lower the work function of the Al electrode to above the electron affinity of polyacetylene, to access inversion.
Figure 3D:
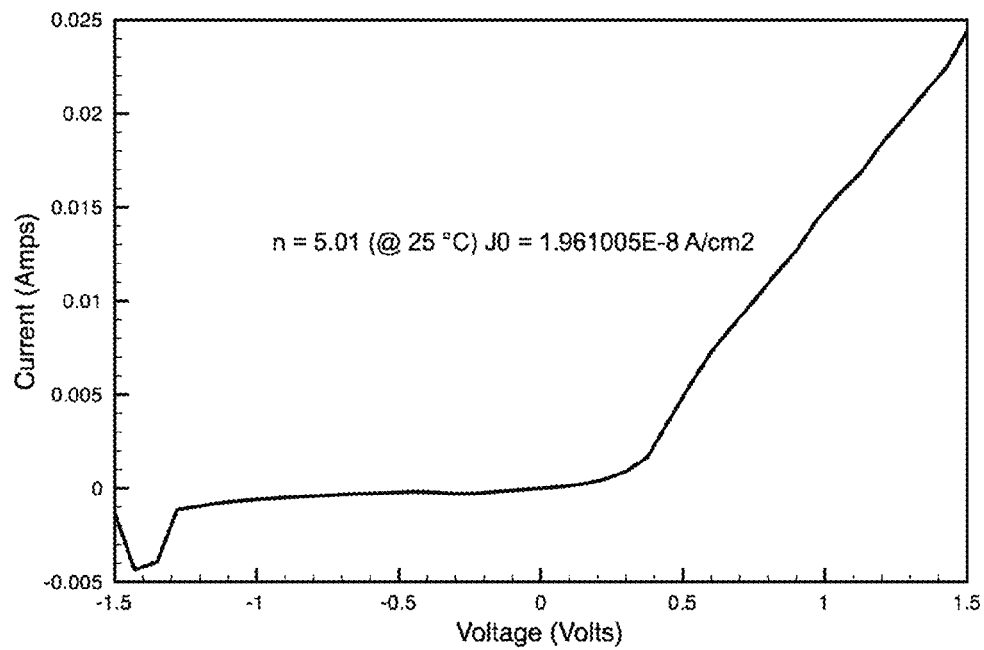
FIG. 3D shows the relationship between current and applied voltage for the device prepared in Example 4.

A fluorine-doped tin oxide electrode (TEC 15 grade, on glass, from Sigma Aldrich) was cleaned in boiling acetone. Under a blanket of argon, this electrode was used to make a pressure contact to the polyacetylene on Al by holding the two sides together with binder clips. See FIG. 3A for an illustration of the prepared structure Afterwards, the device was kept and characterized inside a custom-made Schlenk vessel with tungsten rods beaded through the glass, for use as electrodes. The connections between each electrode and the tungsten rods, as well as the connections between the tungsten rods and the source meter unit were made using standard wires with alligator-clips. The device was characterized using a Keithley source meter unit and custom software, while sealed at 200 millitorr. The current-voltage measurement is presented in FIG. 3C. The data can be extrapolated to fit a non-ideal diode equation with a dark current $J_0 = 1.96 \times 10^{-8}$ A/cm$^2$ and a diode ideality factor n=5.01. The data showed clear evidence of rectification. See FIGS. 3B and 3C.

Example 5

Phosphonate Tethered Brushes

Phosphonate tethered polymer brushes prepared by SI-ROMP can be cleaved electrochemically. Through the combination of gel permeation chromatography (GPC) and quartz crystal microgravimetry (QCM), it is possible to calculate polymer growth metrics. QCM measurements yield the total mass of the polymer grafted to the electrode surface. The mass of the SAMP initiator, grafted chains and remaining surface after cleavage provide the initiator density and cleavage yield. The mass of the polymer after extraction from the electrolyte provides the extraction yield. Light scattering measurements on the GPC provide the average molecular weight and polydispersity index of the cleaved polymer brushes. $^1$H and $^{31}$P nuclear magnetic resonance (NMR) spectra can be analyzed and compared to analogous samples prepared directly as homogeneous samples. Particularly, the $^{31}$P chemical shift may be used to determine the state of the phosphonate after electrochemical cleavage.

Self-assembled monolayer molecules having a terminal phosphonic acid group and either a terminal olefin group or a terminal cyclic olefin group were synthesized as described in the following Examples 5.1 to 5.3.

Example 5.1

Preparation of Diethyl Allylphosphonic Acid, Compound 1

Allyl bromide was treated with triethylphosphite in the absence of solvent using microwave conditions at 150° C. to give diethyl allylphosphonate. Diethyl allylphosphonate was combined with bromotrimethyl silane and subsequently quenched with methanol to afford diethyl allylphosphonic acid according to Scheme 7.

SCHEME 7

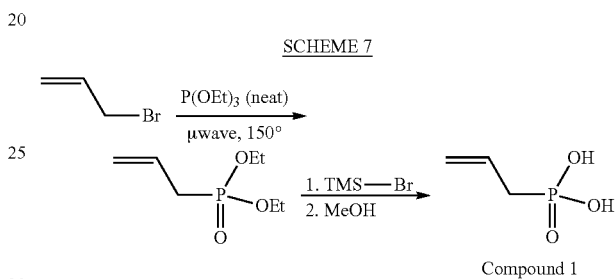

Example 5.2

Preparation of Diethyl 4-Pentenylphosphonic Acid, Compound 2

5-bromo-1-pentene was combined with triethylphosphite in the absence of solvent using microwave conditions at 150° C. to give diethyl 4-pentenylphosphonate. Diethyl 4-pentenylphosphonate was combined with bromotrimethyl silane and subsequently quenched with methanol to afford diethyl 4-pentenylphosphonic acid according to Scheme 8.

SCHEME 8

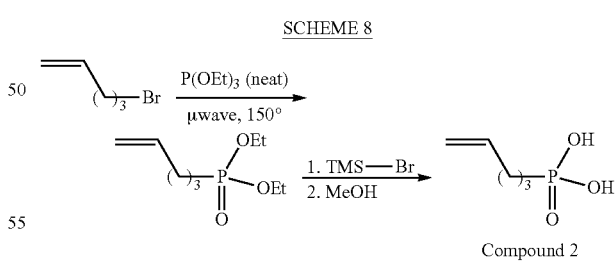

Example 5.3

Preparation of Compound (3)

Exo-norbornene anhydride and aminoethyl phosphonic acid were refluxed in acetic acid for 10 hours to afford Compound 3 according to Scheme 9.

SCHEME 9

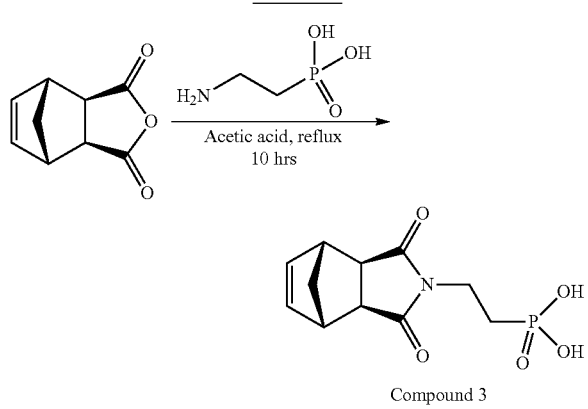

Compound 3

Example 5.4

Phosphonate self-assembled monolayers were prepared using a modified T-BAG method as described in *J. Am. Chem. Soc.* 2003, 1225, 16074-16080, by contacting the natice oxide surface of a silicon wafer with approximately $2 \times 10^{-5}$ M solutions olefin terminated phosphonic acids (e.g. Compounds 1-3), in either tetrahydrofuran or methanol, followed by slow evaporation of the solvent. The silicon wafer substrates were baked at 120-140° C. for 48 hours to give silicon wafers having the attached self-assembled monolayer molecules (e.g. olefinic SAMPs) as shown in Scheme 10. For some examples, the silicon wafer was first coated in aluminum using e-beam evaporation or dc sputtering to afford a flat aluminum surface.

SCHEME 10

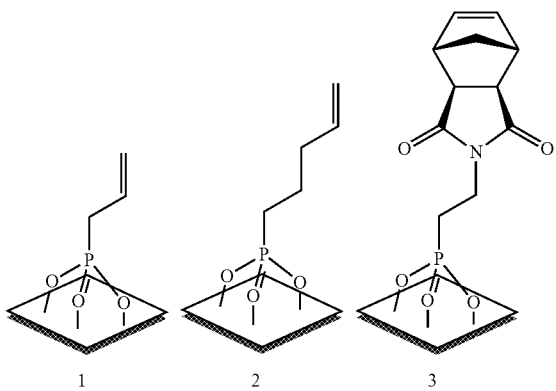

In one set of experiments, the surface densities of the coated monolayers prepared as above were measured by Quartz Crystal Microgravimetry (QCM). These experiments employed a quartz crystal with titanium electrodes commercially available from International Crystal Manufacturing. The frequency of the device was monitored using a Hewlett Packard 53181A Frequency Counter. The mass of the monolayer was calculated from the Sauerbrey equation, which relates the change in frequency of the quartz oscillator with the added mass. The density was then calculated using the molecular weight og the phosphonate and the active surface area of the device. The results are shown in Table 1.

TABLE 1

Surface density of various phosphonates on silicon wafers

| Phosphonate | Surface Density, nanomole/cm$^2$ |
| --- | --- |
| Compound 1 | ca. 1 |
| Compound 2 | 0.665 |
| Compound 3 | 0.755 |

The silicon wafers having the attached self-assembled monolayer molecules (Scheme 10) were placed into a nitrogen glove-box and submerged in solutions of the Grubbs second generation catalyst, as indicated below, in either toluene or dichloromethane, for 20 minutes to form a covalently tethered catalyst complex. The silicon wafers were washed with solvent and allowed to dry before being placed on a wire mesh holder inside a 100 mL glass jar containing approximately 300 mg-500 mg of solid norbornene. The silicon wafers were suspended above the solid norbornene. The silicon wafers were removed after 10 to 180 minutes. The resulting polynorbornene films were between 100 nanometers and 2 microns thick, as characterized by ellipsometry.

Results obtained from SI-ROMP of norbornene from a pentenylphosphate self-assembled monolayer (Compound 2) further comprising a covalently tethered Group 8 olefin metathesis catalyst are described in Table 2.

TABLE 2

| Polymerization Time, min | Ellipsometric Thickness, nm |
| --- | --- |
| 10 | 121 |
| 20 | 950 |
| 30 | 1020 |

Example 5

Figure 4:
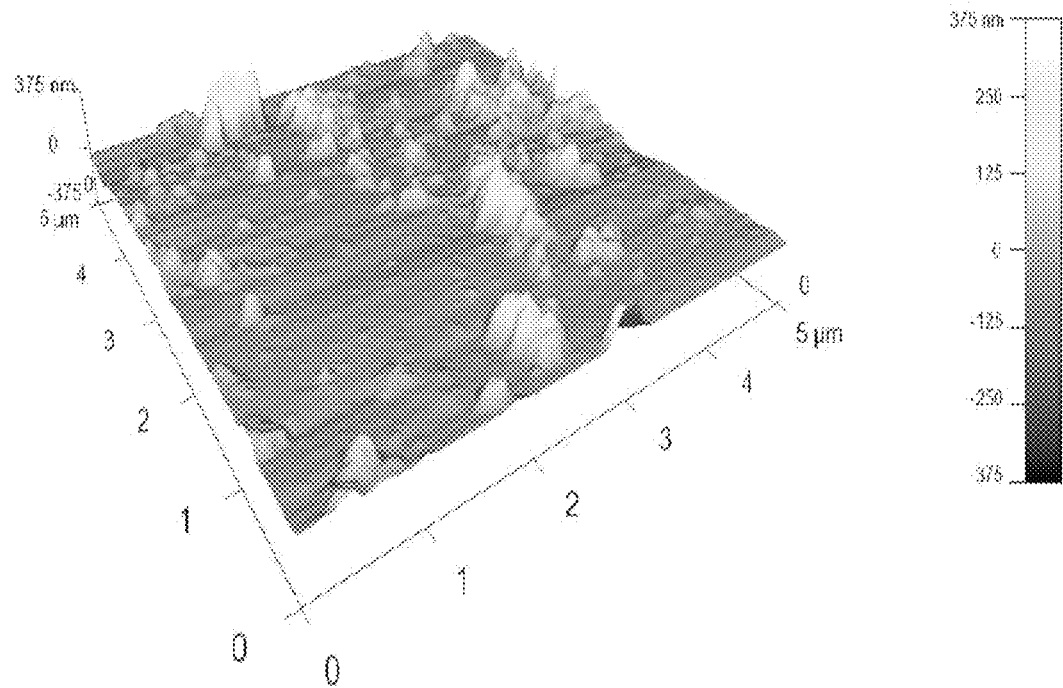
FIG. 4 is an Atomic Force Microscopy micrograph of the surface described in Example 5.

Silicon coupons having a pentenylphosphate self-assembled monolayer (Compound 2) further comprising a covalently tethered Catalyst 4 was placed in a wire mesh, inside a 100 mL glass jar containing 5 mL cyclooctatetraene (COT) at 85° C. for several hours. The Atomic Force Microscopy (AFM) micrograph in FIG. 4 shows isolated crystallites of polyacetylene on the surface of the silicon coupon obtained by SI-ROMP of COT using a pentenylphosphate self-assembled monolayer (Compound 2) comprising a covalently tethered Group 8 olefin metathesis catalyst.

Example 6

A solution of the ruthenium methylidene Catalyst 3 (shown below) was prepared by dissolving 6.0 mg of the catalyst in 1.0 dry toluene in a nitrogen-filled glovebox. A silicon coupon (~1×1 cm) functionalized with the norbornene monolayer 3 was submerged in the catalyst solution and heated to 40° C. for 45 minutes. The coupon was removed, submerged in toluene, rinsed with ca. 20 mL of toluene, and allowed to dry in the nitrogen atmosphere. The dry coupon was placed on a wire mesh in a 100 mL jar containing 0.8 g norbornene. The norbornene was not in physical contact with the sample. After 3 hours, the film was rinsed with 5 mL toluene to remove any sublimated monomer or unbound polymer, and dried. The sample was analyzed by ellipsometry and fit to a Cauchy model, and found to have a film thickness of 30 nm.

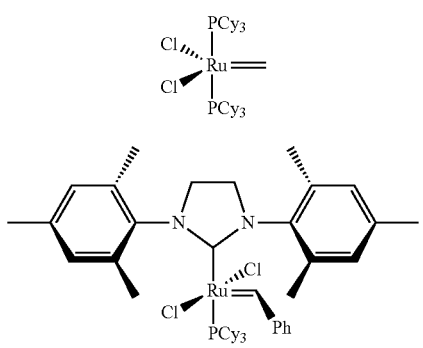

Catalyst 3

Catalyst 4

Example 7

A solution of the ruthenium benzylidene Catalyst 4 (shown above) was prepared by dissolving 10.0 mg of the catalyst in 1.0 dry toluene in a nitrogen-filled glovebox. An aluminum surface (ca. 250 nm) was prepared by e-beam evaporation onto Si <100>. A coupon of this aluminum coated Si (~1×1 cm) functionalized with the pentenyl monolayer of Compound 2 was submerged in the catalyst solution for 20 minutes. The coupon was removed, submerged in toluene, rinsed with ~20 mL of toluene, and allowed to dry in the nitrogen atmosphere. The dry coupon was submerged in 1.0 grams of dicylcopentadiene resin (Materia 1260B). After 90 minutes, the film was rinsed with 5 mL toluene to remove any unreacted monomer or unbound polymer, and dried. The sample was analyzed by ellipsometry and fit to a Cauchy model, and found to have a film thickness of 39 nm.

Example 8

Thicker polymer films were prepared using procedures analogous to those described in Examples 6 and 7, using Catalysts 4 and 5.

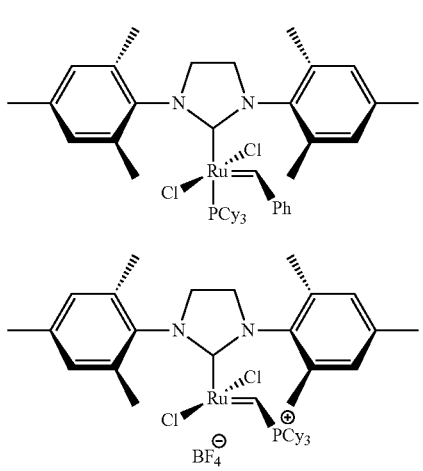

Catalyst 4

Catalyst 5

In one experiment, in a nitrogen filled glovebox, 2.4 mg of Catalyst 5 (Piers II) was dissolved in tetrahydrofuran (THF, 1 mL). A silicon coupon having a pentenylphosphate self-assembled monolayer (Compound 2) was submerged in the catalyst solution for 10 minutes. The coupon was removed, submerged in THF and subsequently rinsed with 15 mL of THF to remove any physisorbed catalyst. After allowing the sample to dry, the sample was placed into a 100 mL jar on top of a wire mesh, suspended above ~700 mg of solid norbornene. The vial was sealed and the vapor-phase polymerization was allowed to proceed for 3 hours. A green hue, due to thin-film interference, was observed on the sample. The sample was rinsed with ethyl vinyl ether (EVE) to quench the ruthenium catalyst, submerged in a 10% solution of EVE in toluene, and rinsed with 10 mL of toluene to remove any unreacted monomer or untethered polymer. The air-dried film appeared very similar to the unrinsed film, indicating the polynorbornene was chemically tethered. Spectroscopic ellipsometry was performed at 50°, 60° and 70° incident angles, as well as a variety of azimuthal angles (0°, 30°, 60° and 90°). The sample was annealed at 135° C. for 30 minutes, above the glass transition temperature of the polymer, and ellipsometry was performed again. The ellipsometric data was fit to a uniaxially birefringent Cauchy model, and the results are plotted in FIGS. 5A-B, and presented in Tables 3 and 4 below. The data were consistent with the thinking that the annealing drastically reduced the birefringence of the sample, suggesting that the aligned polymer chains reorganized when heated above their glass transition temperature. Note the relationship between Δn and thickness in Table 4.

TABLE 3

Figure 5A:
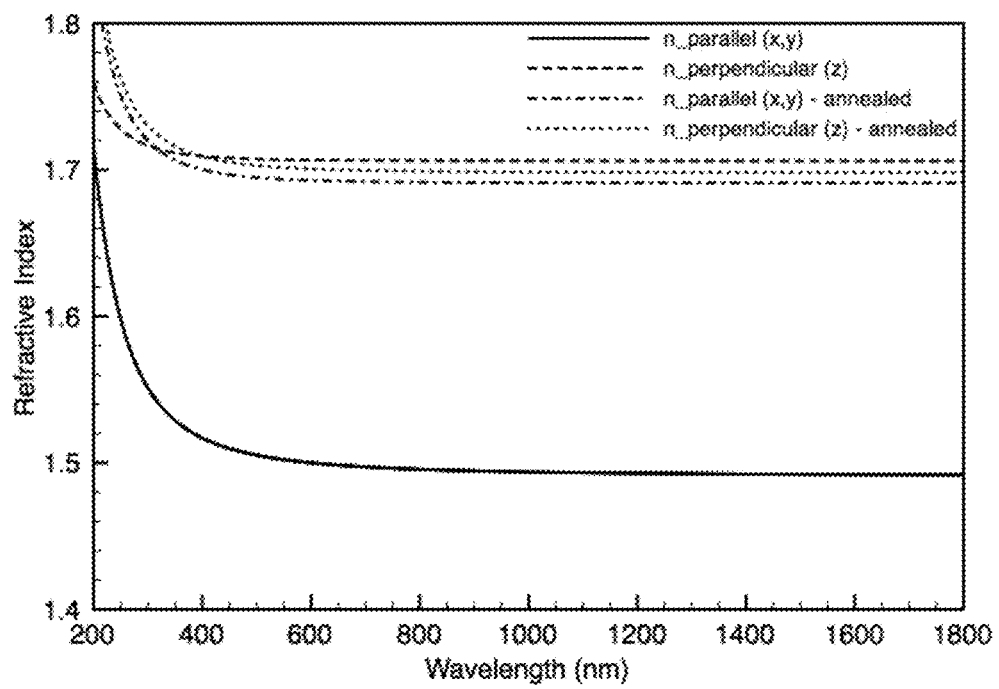
FIGS. 5A and 5B are the curves derived from the experiments described in Example 8, derived from the ring-opening metathesis polymerization of norbornene onto a pentenylphosphate using Catalyst 5 (Piers II).
Figure 5B:
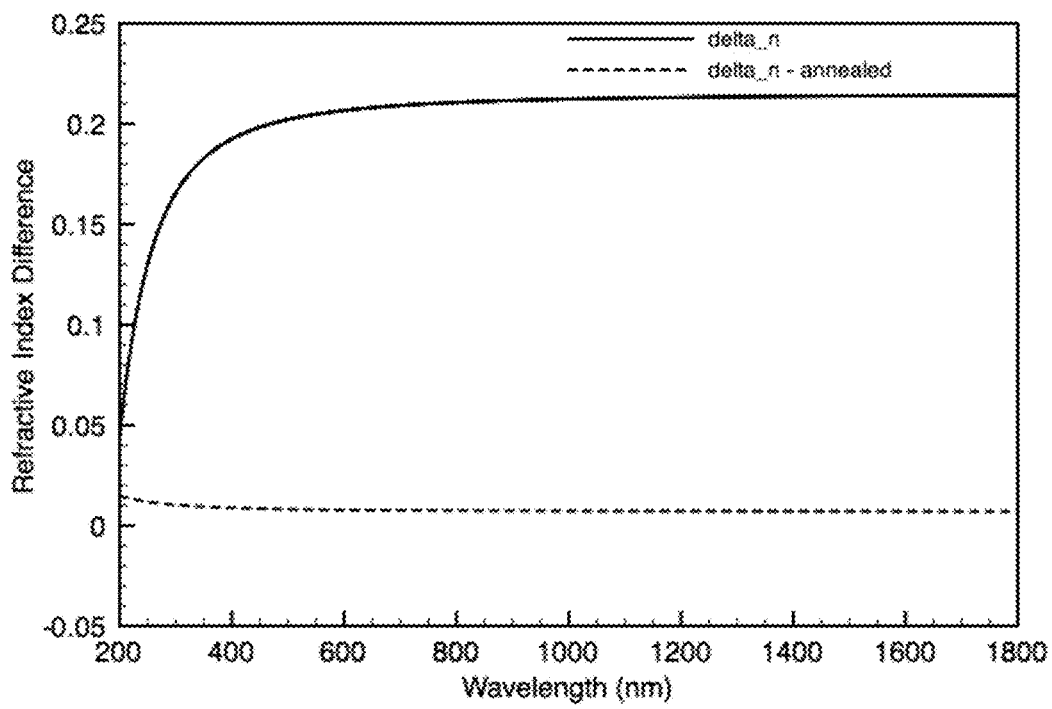

Cauchy parameters for the birefringence as a function of wavelength (see FIG. 5A and FIG. 5B). The designation n' refers to the parameters associated with the annealed polymer brush

| Cauchy Parameters | $n_{para}$ | $n_{perp}$ | $n_{para}'$ | $n_{perp}'$ |
|---|---|---|---|---|
| $n_0$ | 1.491 | 1.706 | 1.691 | 1.698 |
| $n_1$ | 25.2 | 0 | 0 | 2.9 |
| $n_2$ | 25.9 | 8.5 | 23.3 | 23.4 |

$$n = n_0 + \frac{n_1 \times 10^2}{\lambda^2} + \frac{n_2 \times 10^7}{\lambda^4}$$

200 nm < λ < 1800 nm

TABLE 4

Ellipsometry data for highly anisotropic poly(norbornene) brushes

| (Catalyst used to generate brush) | $n_{0z}$ | $n_{0x,y}$ | Δn | thickness |
|---|---|---|---|---|
| Catalyst 4, as polymerized | 2.08 | 1.57 | 0.51 | ca. 100 nm |
| Catalyst 4, as polymerized | 1.86 | 1.53 | 0.33 | ca. 215 nm |
| Catalyst 5, as polymerized | 1.71 | 1.49 | 0.22 | ca. 1 micron |
| Catalyst 5, annealed 30 min at 135° C. | 1.70 | 1.69 | 0.01 | ca. 1 micron |

As those skilled in the art will appreciate, numerous modifications and variations of the present invention are possible in light of these teachings, and all such are contemplated hereby. For example, in addition to the embodiments described herein, the present invention contemplates and claims those inventions resulting from the combination of features of the invention cited herein and those of the cited prior art references which complement the features of the present invention. Similarly, it will be appreciated that any described material, feature, or article may be used in combination with any other material, feature, or article, and such combinations are considered within the scope of this invention.

The disclosures of each patent, patent application, and publication cited or described in this document are hereby incorporated herein by reference, each in its entirety, for all purposes.

What is claimed:

1. A polymer brush structure exhibiting birefringence, said polymer brush structure comprising a plurality of substantially parallel oriented polymers and characterized by a longitudinal z-direction, parallel to the direction of the substantially oriented polymers and having a first refractive index, $n_z$, and a lateral x,y-direction, perpendicular to the direction of the substantially oriented polymers and having a second refractive index, $n_{x,y}$, the difference, $\Delta n$, between the first refractive index and the second refractive index is in a range of about 0.1 to about 0.6, as measured by ellipsometry and fit to a Cauchy analytical model, said plurality of polymers having alkylene, alkenylene, or both alkylene and alkenylene linkages.

2. The polymer brush structure of claim 1 comprising a plurality of polymers having alkenylene, or both alkylene and alkenylene linkages.

3. The polymer brush structure of claim 1, wherein the polymer brush structure is formed by a process comprising an enyne, a diyne, or ring-opening metathesis polymerization (ROMP) reaction.

4. The polymer brush structure of claim 1, wherein the oriented polymers comprise polyacetylene, polynorbornene, or a combination thereof.

5. The polymer brush structure of claim 1, wherein a plurality of the polymers contains an electron donor substituent.

6. The polymer brush structure of claim 1, wherein a plurality of the polymers contains an electron acceptor substituent.

7. The polymer brush structure of claim 1, wherein a plurality of the polymers comprises random or block copolymers.

8. The polymer brush structure of claim 1, wherein a plurality of the polymers comprises homopolymers.

9. The polymer brush structure of claim 1, having a thickness in the longitudinal z-direction in a range of from about 20 nm to about 50 microns.

10. The polymer brush structure of claim 1, said polymers having a density in the x-y direction in a range of from about 0.001 nanomole/cm² to about 1.5 nanomole/cm².

11. The polymer brush structure of claim 1, tethered to a surface by a monolayer arrangement of covalent, hydrogen bonding, ionic, physisorption, pi-pi interaction, or Van der Waals linkages, or a combination thereof.

12. The polymer brush structure of claim 1, wherein the polymer brush structure is tethered to a surface by a monolayer arrangement of covalent linkages.

13. The polymer brush structure of claim 1, wherein the polymer brush structure is tethered to a surface by a monolayer arrangement of phosphonate linkages.

14. The polymer brush structure of claim 1, wherein the polymer brush structure is tethered to a surface comprising a metal, metalloid, or an inorganic or metallic oxide, or combination thereof.

15. The polymer brush structure of claim 1, formed by a metathesis reaction in a process comprising contacting a feedstock vapor or gas comprising an olefinic or acetylenic precursor with a solid transition metal-based metathesis catalyst, said catalyst tethered to a surface by a linking moiety.

16. The polymer brush structure of claim 15, wherein the contacting is done in the absence of a liquid.

17. The polymer brush structure of claim 15, wherein the olefinic or acetylenic precursor is presented to the transition metal-based metathesis catalyst as a gas.

18. The polymer brush structure of claim 15, comprising a plurality of polymers, wherein one end of each of the polymers is tethered to a surface, and the polymers are oriented to extend from the surface, the end of each of the polymer tethered to the surface being the proximal end and the other end of each polymer being the distal end, the transition metal-based metathesis catalyst being bonded to the distal end of the polymer.

19. The polymer brush structure of claim 15, wherein the transition metal-based metathesis catalyst is a Grubbs-type ruthenium catalyst.

20. The polymer brush structure of claim 15, wherein the transition metal-based metathesis catalyst is a Second Generation Grubbs-type ruthenium catalyst.

21. The polymer brush structure of claim 15, wherein the transition metal-based metathesis catalyst comprises at least one of Catalyst 1 to Catalyst 8:

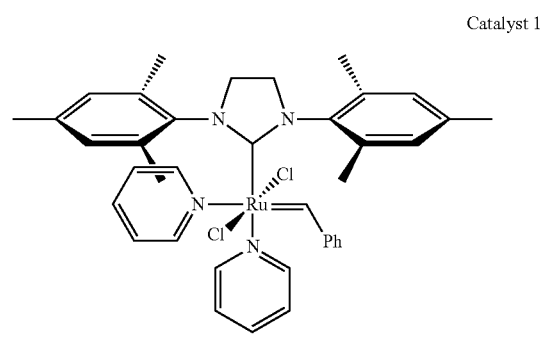

Catalyst 1

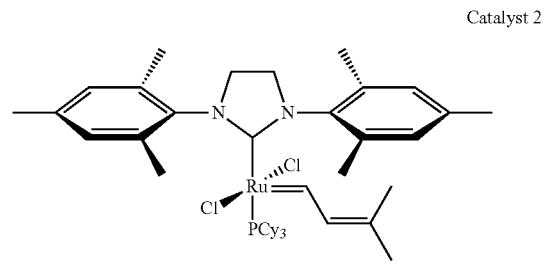

Catalyst 2

Catalyst 3

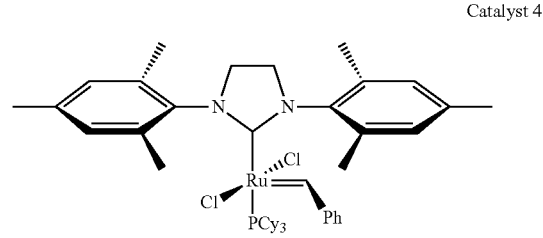

Catalyst 4

-continued

Catalyst 5

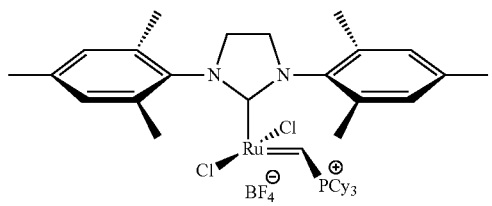

Catalyst 6

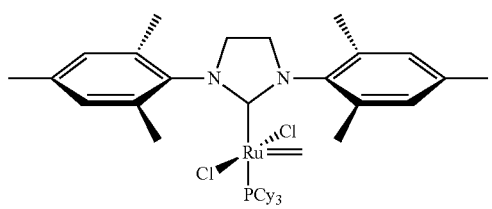

Catalyst 7

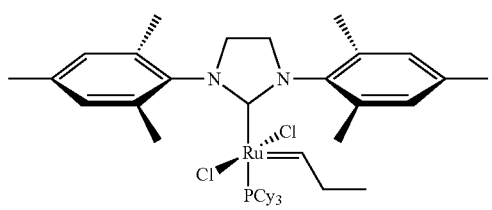

-continued

Catalyst 8

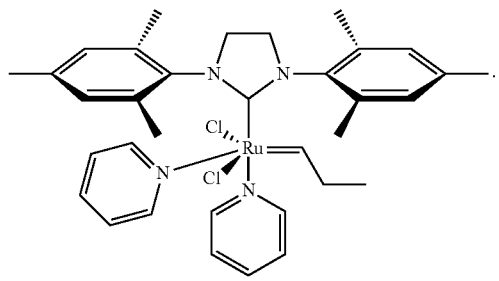

22. The polymer brush structure of claim 15, wherein the polymer brush structure is subsequently removed from the surface.

23. The polymer brush structure of claim 15, wherein the polymer brush structure is electrochemically removed from the surface.

24. The polymer brush structure of claim 1, wherein the material properties, including the chemical and optical properties, can be modified by an external stimulus, including the thermal and electromagnetic environment of the structure.

25. A device comprising a polymer brush structure of claim 1.

26. The device of claim 25, wherein the device is a diode, capacitor, chemical sensor, light emitting diode (LED), microfluidic device, photodetector, photovoltaic cell, thermoelectric detector, transistor, medical implant, or comprises an anti-reflection coatings or antifouling coating.

27. An optical polarizer comprising a polymer brush structure of claim 15.

* * * * *